(12) United States Patent
Hatakeyama et al.

(10) Patent No.: US 7,759,047 B2
(45) Date of Patent: *Jul. 20, 2010

(54) RESIST PROTECTIVE FILM COMPOSITION AND PATTERNING PROCESS

(75) Inventors: Jun Hatakeyama, Niigata (JP); Yuji Harada, Niigata (JP); Takeru Watanabe, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/798,471

(22) Filed: May 14, 2007

(65) Prior Publication Data

US 2007/0275326 A1 Nov. 29, 2007

(30) Foreign Application Priority Data

May 26, 2006 (JP) .............................. 2006-147432

(51) Int. Cl.
- G03F 7/00 (2006.01)
- G03F 7/004 (2006.01)
- C08F 14/18 (2006.01)
- C08F 20/00 (2006.01)

(52) U.S. Cl. ................. 430/273.1; 430/270.1; 430/322; 526/242; 526/245; 526/307.6

(58) Field of Classification Search .............. 430/270.1, 430/271.1, 273.1; 526/245, 242, 307.6
See application file for complete search history.

(56) References Cited

U.S. PATENT DOCUMENTS

| | | | | |
|---|---|---|---|---|
| 5,824,452 | A * | 10/1998 | Nozaki et al. | 430/313 |
| 6,309,789 | B1 * | 10/2001 | Takano et al. | 430/270.1 |
| 7,135,595 | B2 * | 11/2006 | Allen et al. | 560/220 |
| 2003/0031953 | A1 * | 2/2003 | Hatakeyama et al. | 430/270.1 |
| 2004/0236046 | A1 * | 11/2004 | Miyazawa et al. | 526/245 |
| 2005/0250898 | A1 * | 11/2005 | Maeda et al. | 524/544 |
| 2006/0029884 | A1 * | 2/2006 | Hatakeyama et al. | 430/270.1 |
| 2006/0194143 | A1 * | 8/2006 | Sumida et al. | 430/270.1 |
| 2007/0003867 | A1 * | 1/2007 | Hatakeyama et al. | 430/270.1 |
| 2007/0026341 | A1 * | 2/2007 | Hatakeyama et al. | 430/270.1 |
| 2007/0122741 | A1 * | 5/2007 | Hatakeyama et al. | 430/270.1 |
| 2007/0178407 | A1 * | 8/2007 | Hatakeyama et al. | 430/270.1 |
| 2008/0085466 | A1 * | 4/2008 | Harada et al. | 430/270.1 |

FOREIGN PATENT DOCUMENTS

| | | |
|---|---|---|
| JP | A 60-38821 | 2/1985 |
| JP | A 62-62520 | 3/1987 |
| JP | A 62-62521 | 3/1987 |
| JP | A 5-74700 | 3/1993 |
| JP | A 6-273926 | 9/1994 |
| JP | A 7-181685 | 7/1995 |
| JP | A 9-246173 | 9/1997 |
| JP | A 11-84639 | 3/1999 |
| JP | A 2001-194776 | 7/2001 |
| JP | A 2002-226470 | 8/2002 |
| JP | A 2007-108451 | 4/2007 |

OTHER PUBLICATIONS

Fedynyshin, Theodore H., "Advances In Resist Technology and Processing XIX," Proceedings of SPIE, vol. 4690, pp. iii and xxix-xlii, Mar. 4-6, 2002.
Owa, Soichi et al., "Immersion Lithography: Its Potential Performance And Issues," Optical Microlithography XVI, Proceedings Of SPIE, vol. 5040, pp. 724-733, 2003.
Hirayama, Taku, "Resist and Cover Material Investigating For Immersion Lithography," 2$^{nd}$ Immersion Workshop, Jul. 11, 2003.
Allen, Robert D. et al., "Design of Protective Topcoats For Immersion Lithography," Journal of Photopolymer Science and Technology, vol. 18, No. 5, pp. 615-619, 2005.

* cited by examiner

Primary Examiner—Cynthia H Kelly
Assistant Examiner—Anca Eoff
(74) Attorney, Agent, or Firm—Oliff & Berridge, PLC

(57) ABSTRACT

There is disclosed a resist protective film composition for forming a protective film on a photoresist film, comprising: at least
 a polymer including a repeating unit having one or more groups selected from a carboxyl group and α-trifluoromethyl alcohol groups; and
 an amine compound. There can be provided a resist protective film composition that makes it possible to provide more certainly rectangular and excellent patterns when a protective film is formed on a photoresist film.

15 Claims, No Drawings

RESIST PROTECTIVE FILM COMPOSITION AND PATTERNING PROCESS

BACKGROUND OF THE INVENTION

1. Field of the Invention

The present invention relates to a resist protective film composition for forming a protective film on a photoresist film for the purpose of protecting the photoresist film in photolithography for micropatterning processes in manufacturing processes of semiconductor devices and so on, for example, in the liquid immersion photolithography in which ArF excimer laser having a wavelength of 193 nm is used as a light source and liquid such as water is inserted in a gap between a projection lens. and a substrate; and to a patterning process using the resist protective film composition.

2. Description of the Related Art

There has been a demand to achieve a finer pattern rule along with a tendency in which integration and speed of LSIs have become higher in recent years. And in the optical exposure, which is used as a general technique at present, resolution has almost reached its inherent limit derived from a wavelength of a light source.

The optical exposure has been widely used so far using g line (436 nm) or i line (365 nm) of a mercury-vapor lamp as a light source when a resist pattern is formed. Then it has been recognized that a method of using an exposure light with a shorter wavelength is effective as a means for achieving a further finer pattern. For this reason, KrF excimer laser with a shorter wavelength of 248 nm has been used as an exposure light source instead of i line (365 nm) for mass-production process of a 64 M bit (a processing dimension of 0.25 μm or less) DRAM (dynamic random access memory) and beyond.

However, in order to manufacture DRAM with an integration of 256M, 1 G or more which requires a still finer processing techniques (a processing dimension of 0.2 μm or less), it is recognized that a light source with far shorter wavelength is needed. Therefore, the photolithography using ArF excimer laser (193 nm) has been earnestly examined since about 10 years ago.

At first, it was planned to apply ArF lithography to fabrication of 180 nm node devices and beyond. However, application of KrF excimer lithography has been extended up to mass-production of 130 nm node devices, and ArF lithography is applied on a full-scale basis to fabrication of 90 nm node devices and beyond. Furthermore, fabrication of 65 nm node devices has been examined with combination of ArF lithography and a lens having an enhanced NA of 0.9.

As for fabrication of the next 45 nm node devices, shorter exposure wavelength has been achieved, and $F_2$ lithography at a wavelength of 157 nm was suggested to be a possible choice. However, it was suggested to postpone introduction of $F_2$ lithography and early introduction of ArF liquid immersion lithography due to various problems such as increase in cost by using large amounts of expensive $CaF_2$ single crystals for a projection lens; necessary change of optical system associated with introduction of a hard pellicle because a soft pellicle has extremely low durability; and decrease of etching resistance of a resist (See Proc. SPIE Vol. 4690 xxix).

In the ArF liquid immersion lithography, it has been suggested to fill a gap between a projection lens and a substrate with water. Water has an index of refraction of 1.44 with 193 nm light, and a pattern can be formed even with using a lens having an NA of 1.0 or more. In theory, NA can be increased up to 1.44. Resolution is enhanced by increment of NA. It is shown that combination of a lens having an NA of 1.2 or more and ultra resolution techniques can realize fabrication of 45 nm node devices (See Proc. SPIE Vol. 5040 p 724).

As for the ArF liquid immersion lithography, various problems were pointed out due to the presence of water on a photoresist film. That is, the problems include pattern deformation due to leaching of generated acid and an amine compound added to the resist film as a quencher to water; pattern collapse due to water swelling of a photoresist film; and the like. Then it has been suggested that a protective film is placed between the resist film and water (See 2nd Immersion Work Shop, Jul. 11, 2003, Resist and Cover Material Investigation for Immersion Lithography).

The protective film that is formed on a photoresist film has been investigated as an antireflection film. For example, Japanese Unexamined Patent Application Publication No. 62-62520, No. 62-62521, and No. 60-38821 disclose the ARCOR (antireflective coating on resist) method. The ARCOR method is a method including a step of forming a transparent antireflective coating on a resist film and removing the antireflective coating after exposure. The ARCOR method is such a convenient method and provides fine, highly accurate pattern having high positioning accuracy. Use of perfluoro alkyl compounds having a low refractive index such as perfluoro alkyl polyethers or perfluoro alkyl amines for forming an antireflective coating reduces remarkably reflection at the resist/antireflective coating interface, thereby enhancing dimensional accuracy. As examples of fluorinated compositions, other than the compositions mentioned above, there has been suggested amorphous polymers such as perfluoro (2,2-dimethyl-1,3-dioxol)-tetrafluoroethylene copolymer, cyclized polymers of perfluoro (allyl vinyl ether) or perfluoro butenyl vinyl ether, and the like, which is disclosed in Japanese Unexamined Patent Application Publication No. 05-74700.

However, the perfluoro alkyl compounds have a low compatibility with organic compounds, and thus flons and the like are used as a diluent for controlling applied film thickness. And it is a known fact that use of flons is now perceived as a problem in view of environmental protection. Furthermore, the compound has a problem in forming a uniform film, and the compound is not suitable for antireflective coatings. In addition, the antireflective coating has to be stripped with flons prior to developing of a photoresist film. Therefore, there are many practical detriments of involving additional installation of system for stripping the antireflective coating to conventional equipment, mounting costs of flon solvents, and the like.

When the antireflective coating is stripped without any additional installation to conventional equipment, most desirable is to strip the antireflective coating with a developing unit. Solutions that are used in a developing unit for photoresist films are aqueous alkaline solutions used as developers and pure water used as a rinsing solution. And thus, a desirable antireflective coating composition can be stripped with the aqueous alkaline solutions or pure water. Therefore, there have been proposed many water-soluble antireflective coating compositions and patterning processes using the compositions (For example, see Japanese Unexamined Patent Application Publication No. 06-273926 and Japanese Patent Publication No. 2803549).

However, water-soluble protective films cannot be used for liquid immersion lithography because such films dissolve in water during exposure. On the other hand, water-insoluble fluorinated polymers has problems of requiring a special flon stripping agent and a stripping cup intended only for flon solvents. Then there has been demanded a water-insoluble resist protective film that can be stripped easily.

There has been proposed a top coat based on hexafluoro alcohol pendant methacrylate that is soluble in a developer (For example, see J. Photopolymer Sci. and Technol. Vol. 18 No. 5 p. 615 (2005). The top coat has a high Tg of 150 degrees C., a high alkali solubility, and is suitably used with photoresist films.

By the way, in the above cases, there can occur problems depending on the types of photoresist films that when a protective film is formed on a photoresist film, film loss occurs in the surface portions of developed photoresist film and the photoresist film has a rounded top shape. In this case, rectangular and excellent resist patterns cannot be obtained. Therefore, there has been demanded a resist protective film composition that more certainly provides rectangular and excellent patterns.

SUMMARY OF THE INVENTION

The present invention has been accomplished to solve the above-mentioned problems, and an object of the present invention is to provide a resist protective film composition that makes it possible to provide more certainly rectangular and excellent resist patterns when a protective film is formed on a photoresist film; and a patterning process using such a composition.

In order to achieve the above object, the present invention provides a resist protective film composition for forming a protective film on a photoresist film, comprising: at least a polymer including a repeating unit having one or more groups selected from a carboxyl group and α-trifluoromethyl alcohol groups; and an amine compound.

In the resist protective film composition according to the present invention, the amine compound is preferably one or more compounds selected from tertiary amine compounds and sulfonamides.

In this case, the one or more compounds selected from tertiary amine compounds and sulfonamides are preferably one or more compounds selected from compounds represented by the following general formula (1-1) and compounds represented by the following general formula (1-2),

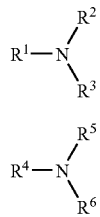

wherein $R^1$, $R^2$ and $R^3$ independently represent a linear, branched or cyclic alkyl group having 1-30 carbon atoms; either $R^1$ and $R^2$, $R^1$ and $R^3$, or $R^2$ and $R^3$ may be linked to form a ring; $R^1$, $R^2$ and $R^3$ may contain any one or more of an ester, an ether group, and an amino group; hydrogen atoms of the alkyl group may be totally or partially substituted with a fluorine atom;

$R^4$, $R^5$ and $R^6$ independently represent any one of a hydrogen atom, a linear, branched or cyclic alkyl group having 1-30 carbon atoms, and —$SO_2R^7$; either $R^4$ and $R^5$, $R^4$ and $R^6$, or $R^5$ and $R^6$ may be linked to form a ring; at least one of $R^4$, $R^5$ and $R^6$ is —$SO_2R^7$; and $R^7$ represents a linear, branched or cyclic alkyl group having 1-10 carbon atoms, and hydrogen atoms of the alkyl group may be totally or partially substituted with a fluorine atom.

Or, the one or more compounds selected from tertiary amine compounds are preferably represented by the following general formula (2),

wherein n1 is 1, 2, or 3;

$X^{10}$ may be the same or different, and $X^{10}$ is represented by any one of the following general formulae $(X^{10})$–1 to $(X^{10})$–3;

$Y^{10}$ may be the same or different; $Y^{10}$ represents a linear, branched or cyclic alkyl group having 1-30 carbon atoms; and $Y^{10}$ may be linked to each other to form a ring, and the ring may contain —O—;

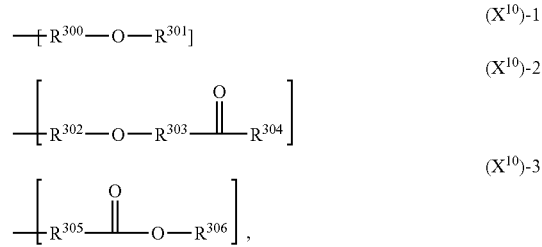

wherein $R^{300}$, $R^{302}$ and $R^{305}$ independently represent a linear or branched alkylene group having 1-4 carbon atoms which may contain —O—;

$R^{301}$ and $R^{304}$ independently represent a linear, branched or cyclic alkyl group having 1-30 carbon atoms, which may contain a hydroxy group or an ester group, and hydrogen atoms of the alkyl group may be totally or partially substituted with a fluorine atom;

$R^{303}$ represents a single bond or a linear or branched alkylene group having 1-4 carbon atoms; and $R^{306}$ represents a linear, branched or cyclic alkyl group having 1-30 carbon atoms, and hydrogen atoms of the alkyl group may be totally or partially substituted with a fluorine atom.

As mentioned above, when a protective film is formed on a photoresist film, depending on the types of the photoresist films, there are problems that film loss occurs in the surface portions of the developed photoresist film and the photoresist film on which a resist pattern is formed has a rounded top shape. The cause of the problems is considered that amine compounds added to the photoresist film migrates to the overlying protective film. Against the problems, the resist protective film composition according to the present invention comprises a polymer including a repeating unit having one or more groups selected from a carboxyl group and α-trifluoromethyl alcohol groups; and also an amine compound. Therefore, forming a protective film on a photoresist film with the composition makes it possible to effectively prevent the amine compound from migrating from the photoresist film. For example, it becomes possible to more certainly prevent film loss in the surface portions of developed photoresist film. Consequently, rectangular and excellent resist patterns can be obtained more certainly.

Furthermore, in the resist protective film composition according to the present invention, the repeating unit having an α-trifluoromethyl alcohol group in the polymer is preferably represented by the following general formula (3),

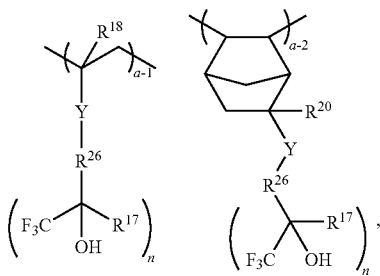
(3)

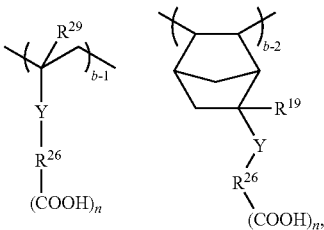
(5)

wherein $R^{18}$ and $R^{20}$ independently represent any one of a hydrogen atom, a fluorine atom, a methyl group, and a trifluoromethyl group;

Y independently represents any one of a single bond, —O—, —C(=O)—O—, —C(=O)—O—$R^{28}$—C(=O)—O—, —C(=O)—O—$R^{28}$—O—, and —C(=O)—O—$R^{28}$—O—C(=O)—;

$R^{28}$ represents a linear, branched or cyclic alkylene group having 1-10 carbon atoms, and hydrogen atoms of the alkylene group may be totally or partially substituted with a fluorine atom;

$R^{26}$ independently represents a single bond, a linear, branched or cyclic alkylene group or alkanetriyl group having 1-25 carbon atoms, and hydrogen atoms of the alkylene group and alkanetriyl group may be totally or partially substituted with a fluorine atom;

$R^{17}$ independently represents any one of a hydrogen atom, a fluorine atom, a methyl group, a trifluoromethyl group, and a difluoromethyl group;

$R^{26}$ and $R^{17}$ may be linked to form a ring, and the ring may contain one or more groups selected from an ether group, alkylene groups whose hydrogen atoms are totally or partially substituted with a fluorine atom, and a trifluoromethyl group;

n is independently 1 or 2; and (a-1) and (a-2) satisfy $0 \leq (a\text{-}1) \leq 0.9$, $0 \leq (a\text{-}2) \leq 0.9$, and $0 \leq (a\text{-}1)+(a\text{-}2) \leq 0.9$.

In addition, it is more preferable that the repeating unit having an α-trifluoromethyl alcohol group in the polymer is represented by the following general formula (4),

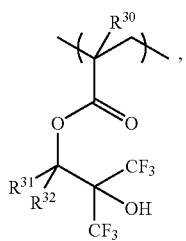
(4)

wherein $R^{30}$ represents a hydrogen atom or a methyl group; and $R^{31}$ and $R^{32}$ may be the same or different and represent a hydrogen atom or a linear, branched or cyclic alkyl group having 1-12 carbon atoms; and $R^{31}$ and $R^{32}$ may be linked to form a ring with the carbon atom to which $R^{31}$ and $R^{32}$ are linked.

Moreover, in the resist protective film composition according to the present invention, it is preferable that the repeating unit having a carboxyl group in the polymer is represented by the following general formula (5), wherein $R^{29}$ represents any one of a hydrogen atom, a fluorine atom, a methyl group, a trifluoromethyl group, —COOH, and —CH$_2$—COOH;

$R^{19}$ represents any one of a hydrogen atom, a fluorine atom, a methyl group, a trifluoromethyl group, —COOH, and —CH$_2$—COOH;

Y independently represents any one of a single bond, —O—, —C(=O)—O—, —C(=O)—O—$R^{28}$—C(=O)—O—, —C(=O)—O—$R^{28}$—O—, and —C(=O)—O—$R^{28}$—O—C(=O)—;

$R^{28}$ represents a linear, branched or cyclic alkylene group having 1-10 carbon atoms, and hydrogen atoms of the alkylene group may be totally or partially substituted with a fluorine atom;

$R^{26}$ independently represents any one of a single bond, a linear, branched or cyclic alkylene group or alkanetriyl group having 1-25 carbon atoms, and hydrogen atoms of the alkylene group and alkanetriyl group may be totally or partially substituted with a fluorine atom;

n is independently 1 or 2; and (b-1) and (b-2) satisfy $0 \leq (b\text{-}1) \leq 0.9$, $0 \leq (b\text{-}2) \leq 0.9$, and $0 \leq (b\text{-}1)+(b\text{-}2) \leq 0.9$.

As mentioned above, when a resist protective film composition comprises a polymer including a repeating unit having one or more groups selected from a carboxyl group and α-trifluoromethyl alcohol groups, a protective film formed with the composition has a high alkali solubility and thus can be stripped with an alkaline developer more easily at the time of development. In addition, such a protective film is suitably used with photoresist films.

Furthermore, it is preferable that the resist protective film composition according to the present invention comprises a polymer including a repeating unit having one or more groups selected from alkyl groups and fluoroalkyl groups.

And in this case, the repeating unit having one or more groups selected from alkyl groups and fluoroalkyl groups in the polymer is preferably represented by the following general formula (6),

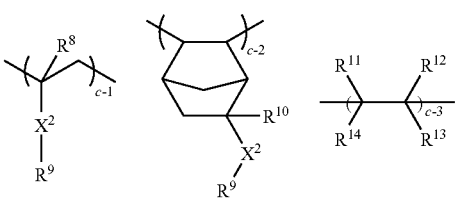
(6)

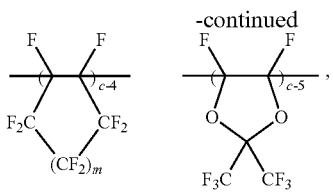

wherein $R^8$ and $R^{10}$ independently represent any one of a hydrogen atom, a fluorine atom, a methyl group, and a trifluoromethyl group;

$X^2$ independently represents any one of a single bond, —O—, —C(=O)—O—, and —C(=O)—O—$R^{16}$—C(=O)—O—;

$R^{16}$ represents a linear, branched or cyclic alkylene group having 1-10 carbon atoms, and hydrogen atoms of the alkylene group may be totally or partially substituted with a fluorine atom;

$R^9$ independently represents a linear, branched or cyclic alkyl group having 1-20 carbon atoms; and hydrogen atoms of the alkyl group may be totally or partially substituted with a fluorine atom; and the alkyl group may contain an ether group or an ester group;

$R^{11}$ to $R^{14}$ independently represent any one of a hydrogen atom, a fluorine atom, a methyl group, and a trifluoromethyl group; and at least any one of $R^{11}$ to $R^{14}$ contain one or more fluorine atoms;

m is 1 or 2; and (c-1), (c-2), (c-3), (c-4) and (c-5) satisfy $0 \leq (c-1) \leq 0.9$, $0 \leq (c-2) \leq 0.9$, $0 \leq (c-3) \leq 0.9$, $0 \leq (c-4) \leq 0.9$, $0 \leq (c-5) \leq 0.9$, and $0 \leq (c-1)+(c-2)+(c-3)+(c-4)+(c-5) \leq 0.9$.

As mentioned above, when the resist protective film composition comprises a polymer including a repeating unit having one or more groups selected from alkyl groups and fluoroalkyl groups, forming a protective film with the composition enhances water repellency of the protective film and effectively prevents the protective film from mixing with a photoresist film.

In addition, it is preferable that the resist protective film composition according to the present invention further comprises a solvent.

As mentioned above, the resist protective film composition further comprising a solvent has an even better property of forming the protective film.

Furthermore, the present invention provides a patterning process comprising: at least, a step of forming a photoresist film on a substrate; a step of forming a resist protective film on the photoresist film by using the resist protective film composition according to the present invention; a step of exposing the substrate; and a step of developing the substrate with a developer.

In this patterning process, it is natural that other various processes, such as an etching process, a resist removing process or a cleaning process may be conducted.

In addition, in the patterning process according to the present invention, the step of exposing the substrate is preferably conducted by liquid immersion lithography in which a gap between a projection lens and the substrate is filled with liquid.

In this way, conducting the step of exposing the substrate by liquid immersion lithography makes it possible to form a finer resist pattern on the photoresist film.

In addition, in the patterning process according to the present invention, the step of exposing the substrate may be conducted by using a light source having an exposure wavelength in the range of 180 to 250 nm; and using water as the liquid with which the gap between a projection lens and the substrate is filled.

In this way, an example of the liquid used in the liquid immersion lithography is water. And water is inserted in the gap between a projection lens and a substrate, and exposure is conducted by using a light source having an exposure wavelength in the range of 180 to 250 nm, whereby a still finer resist pattern can be formed.

Furthermore, in the patterning process according to the present invention, the step of developing the substrate is preferably conducted by developing the substrate with an alkaline developer to form a resist pattern on the photoresist film and simultaneously to strip the resist protective film on the photoresist film.

In this way, conducting the step of developing the substrate by developing the substrate with an alkaline developer to form a resist pattern on the photoresist film and simultaneously to strip the resist protective film on the photoresist film makes it possible to strip the resist protective film more easily without additional installation of system for stripping the resist protective film to conventional equipment.

As described above, the resist protective film composition according to the present invention comprises a polymer including a repeating unit having one or more groups selected from a carboxyl group and α-trifluoromethyl alcohol groups; and also an amine compound. Therefore, forming a protective film on a photoresist film with the composition makes it possible to effectively prevent the amine compound from migrating from the photoresist film. For example, it becomes possible to more certainly prevent film loss in the surface portions of the developed photoresist film. Consequently, rectangular and excellent resist patterns can be obtained more certainly.

DESCRIPTION OF THE INVENTION AND A PREFERRED EMBODIMENT

A more thorough disclosure of the present invention is presented in the detailed description which follows.

When a developer-soluble protective film is formed on a positive photoresist film, there occur problems such that film loss occurs in the surface portions of the developed photoresist film and the photoresist film on which a resist pattern is formed has a rounded top shape; and the sidelobe margin of a hole pattern decreases. The cause of the problems is considered that amine compounds added to the photoresist film migrates to the overlying protective film. The amine compounds are added to the photoresist film as quenchers for controlling acid diffusion, enhancing contrast, and controlling sensitivity. And for example, when hexafluoro alcohol groups exist in the protective film, hexafluoro alcohol groups generally have a high affinity for amine compounds, and thus amine compounds added to the photoresist film tend to migrate to the protective film. As a result, it is considered that the concentration of the amine compounds that prevent acid diffusion decreases at the surface of the photoresist film, that is, around the protective film/photoresist film interface, the photoresist film portion dissolves, and thus film loss occurs in the surface portions of the developed photoresist film.

In order to address the problems, it is contemplated to employ a method of preventing the migration of amine compounds in the photoresist film by decreasing the acidity of alkali soluble groups such as a carboxyl group or hexafluoro alcohol groups. In this case, however, there occurs a drawback that the alkali dissolution rate of the protective film extremely decreases.

Then the present inventors have further investigated and have found that addition of an amine compound to the protective film in advance prevents migration of amine compounds from the photoresist film to the protective film. Thus, they have accomplished the present invention.

That is, the present invention provides a resist protective film composition for forming a protective film on a photoresist film, comprising: at least a polymer including a repeating unit having one or more groups selected from a carboxyl group and α-trifluoromethyl alcohol groups; and an amine compound.

As mentioned above, the resist protective film composition according to the present invention comprises a polymer including a repeating unit having one or more groups selected from a carboxyl group and α-trifluoromethyl alcohol groups; and also an amine compound. Therefore, forming a protective film on a photoresist film with the composition makes it possible to effectively prevent an amine compound from migrating from the photoresist film. For example, it becomes possible to more certainly prevent film loss in the surface portions of the developed photoresist film. Consequently, rectangular and excellent resist patterns can be obtained more certainly.

And in the resist protective film composition according to the present invention, the amine compound is preferably one or more compounds selected from tertiary amine compounds and sulfonamides.

The amine compound to be added to the resist protective film composition is required to hardly absorb the ArF light, have a boiling point of 200 degrees C. or higher under normal pressure for the purpose of preventing evaporation of the amine compound during prebaking, be less prone to leach in water, have basicity, and the like.

In view of making the amine compound hardly absorb the ArF light (wavelength: 193 nm), preferred amine compound is not an aromatic compound, and does not have an unsaturated bond or a carboxylic acid amide group. In view of making the amine compound water-insoluble, preferred amine compound does not have a hydroxy group or a glyme chain, is not a primary amine, a secondary amine, a quaternary ammonium salt, or the like. In particular, tertiary alkyl amines are preferably used. Furthermore, a tertiary amine compound having a fluoroalkyl group is more preferable, and such an amine compound hardly leach in water.

Examples of the one or more compounds selected from tertiary amine compounds and sulfonamides are one or more compounds selected from compounds represented by the following general formula (1-1) and compounds represented by the following general formula (1-2),

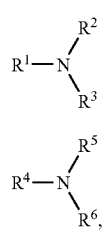

(1-1)

(1-2)

wherein $R^1$, $R^2$ and $R^3$ independently represent a linear, branched or cyclic alkyl group having 1-30 carbon atoms; either $R^1$ and $R^2$, $R^1$ and $R^3$, or $R^2$ and $R^3$ may be linked to form a ring; $R^1$, $R^2$ and $R^3$ may contain any one or more of an ester, an ether group, and an amino group; hydrogen atoms of the alkyl group may be totally or partially substituted with a fluorine atom;

$R^4$, $R^5$ and $R^6$ independently represent any one of a hydrogen atom, a linear, branched or cyclic alkyl group having 1-30 carbon atoms, and —$SO_2R^7$; either $R^4$ and $R^5$, $R^4$ and $R^6$, or $R^5$ and $R^6$ may be linked to form a ring; at least one of $R^4$, $R^5$ and $R^6$ is —$SO_2R^7$; and $R^7$ represents a linear, branched or cyclic alkyl group having 1-10 carbon atoms, and hydrogen atoms of the alkyl group may be totally or partially substituted with a fluorine atom.

Examples of the amine compound represented by the general formula. (1-1) may include: trimethylamine, triethylamine, tri-n-propylamine, triisopropyl amine, tri-n-butyl amine, triisobutyl amine, tri-sec-butyl amine, tripentyl amine, tricyclopentyl amine, trihexyl amine, tricyclohexyl amine, triheptyl amine, trioctyl amine, trinonyl amine, tridecyl amine, tridodecyl amine, tricetyl amine, N,N-dimethyl cyclohexylamine, N,N-diethyl cyclohexylamine, N,N-dibutyl cyclohexylamine, N,N,N',N'-tetra methyl methylene diamine, N,N,N',N'-tetramethyl ethylenediamine, N,N,N',N'-tetramethyl tetraethylene pentamine, dimethylethylamine, methylethylpropylamine, and the like.

The resist protective film composition according to the present invention indispensably includes an amine compound. The amount of the amine compound to be added to a protective film composition for liquid immersion lithography is preferably 5 parts by mass or less, more preferably 2 parts by mass or less, and still more preferably 1 part by mass or less to 100 parts by mass of a base polymer for a protective film for liquid immersion lithography. The less the amount of the amine compound to be added is, the less water repellency of the protective film deteriorates.

In addition, in order to reduce the deterioration of water repellency due to addition of the amine compound, and prevent the amine itself from leaching in water, preferably added is an amine compound having a long chain alkyl group having 4 or more carbon atoms.

Addition of a small amount of an amine compound having an ester group and/or an ether group represented by the following general formula (2) provides more rectangular pattern. Such amine compounds have an excellent property of trapping acids and have been developed as a quencher in which addition of the amine compounds to a resist enhances contrast and provides a rectangular pattern. The amine compounds represented by the following general formula (2) also exhibit great effects of effectively reducing film loss of a resist pattern when the amine compounds are added to a resist protective film composition. Such amine compounds and synthesis methods thereof are disclosed in Japanese Publication of Unexamined Application No. 11-84639, No. 2001-194776, and No. 2002-226470.

$$N(X^{10})_{n1}(Y^{10})_{3-n1}, \qquad (2)$$

wherein n1 is 1, 2, or 3;

$X^{10}$ may be the same or different, and $X^{10}$ is represented by any one of the following general formulae $(X^{10})$–1 to $(X^{10})$–3;

$Y^{10}$ may be the same or different; $Y^{10}$ represents a linear, branched or cyclic alkyl group having 1-30 carbon atoms; and $Y^{10}$ may be linked to each other to form a ring, and the ring may contain —O—;

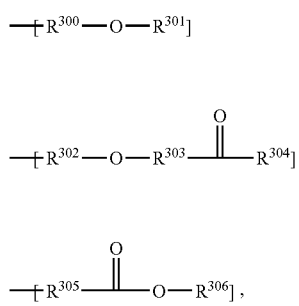

wherein $R^{300}$, $R^{302}$ and $R^{305}$ independently represent a linear or branched alkylene group having 1-4 carbon atoms which may contain —O—;

$R^{301}$ and $R^{304}$ independently represent a linear, branched or cyclic alkyl group having 1-30 carbon atoms, which may contain a hydroxy group or an ester group, and hydrogen atoms of the alkyl group may be totally or partially substituted with a fluorine atom;

$R^{303}$ represents a single bond or a linear or branched alkylene group having 1-4 carbon atoms; and $R^{306}$ represents a linear, branched or cyclic alkyl group having 1-30 carbon atoms, and hydrogen atoms of the alkyl group may be totally or partially substituted with a fluorine atom.

Examples of the compounds represented by the general formula (2) are shown below.

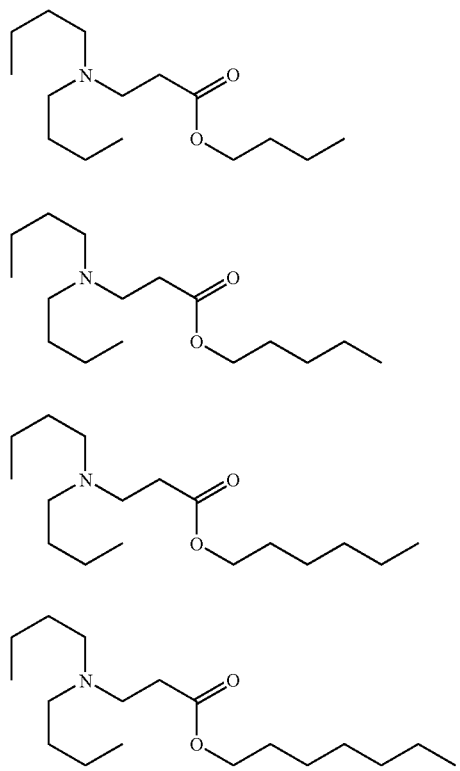

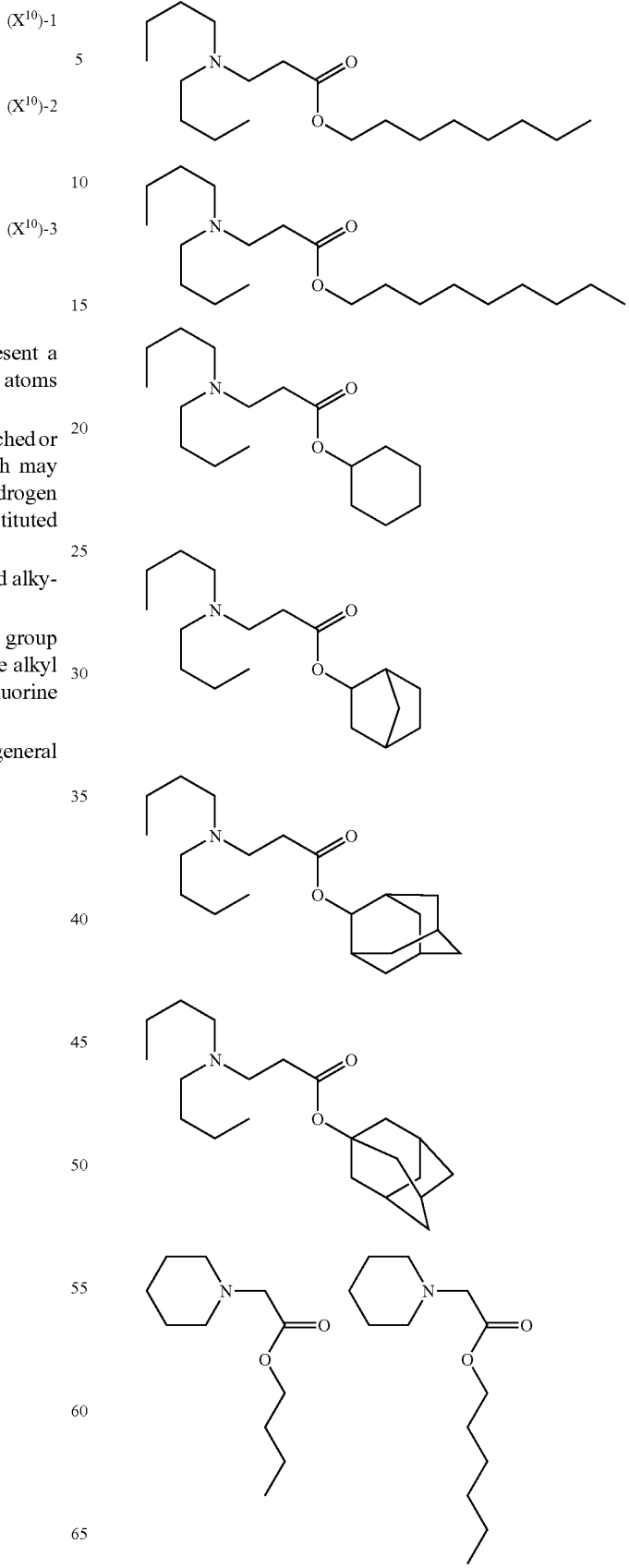

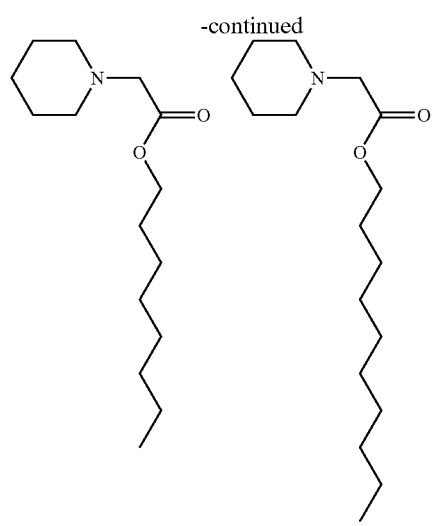
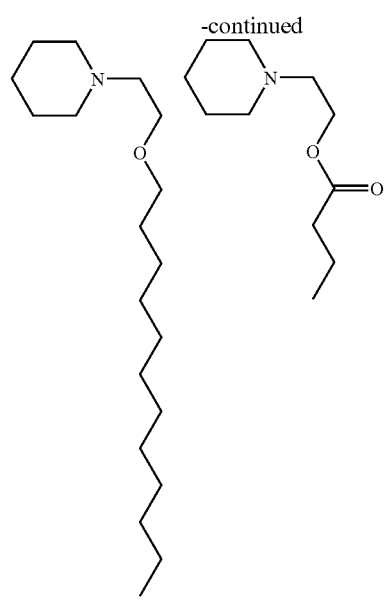
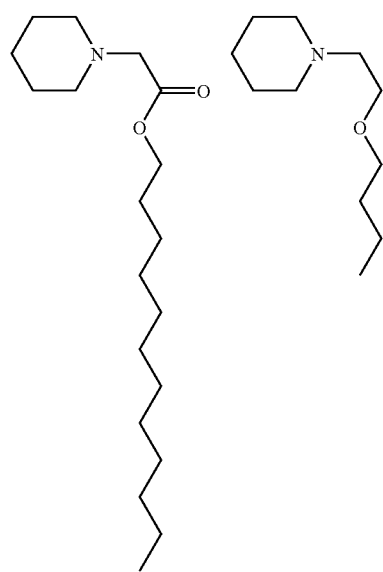
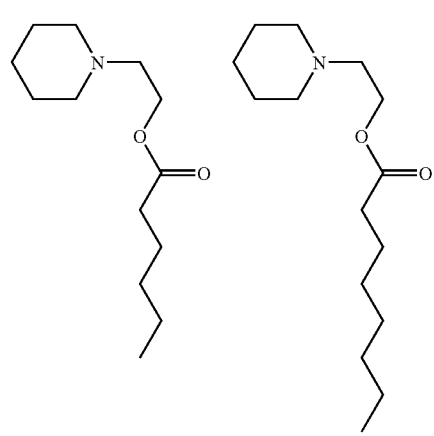
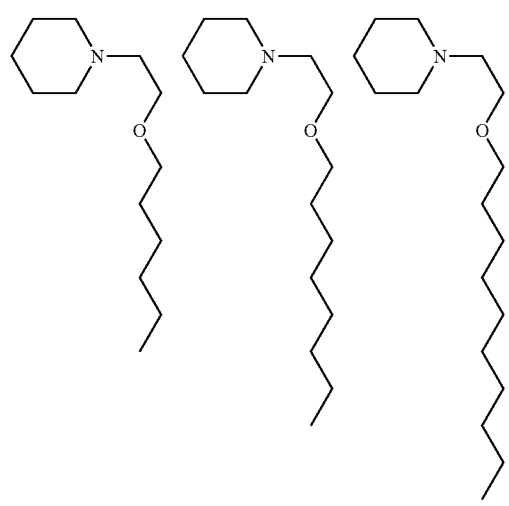
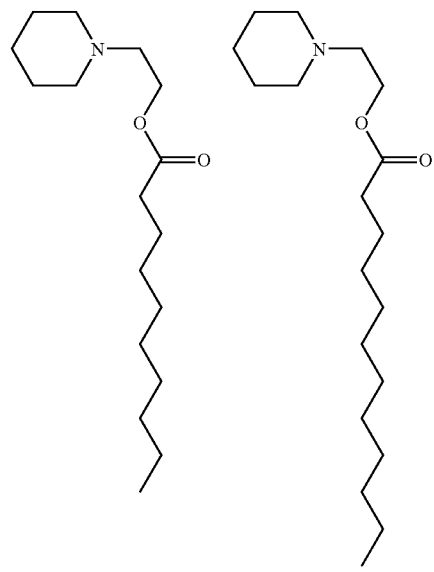

-continued
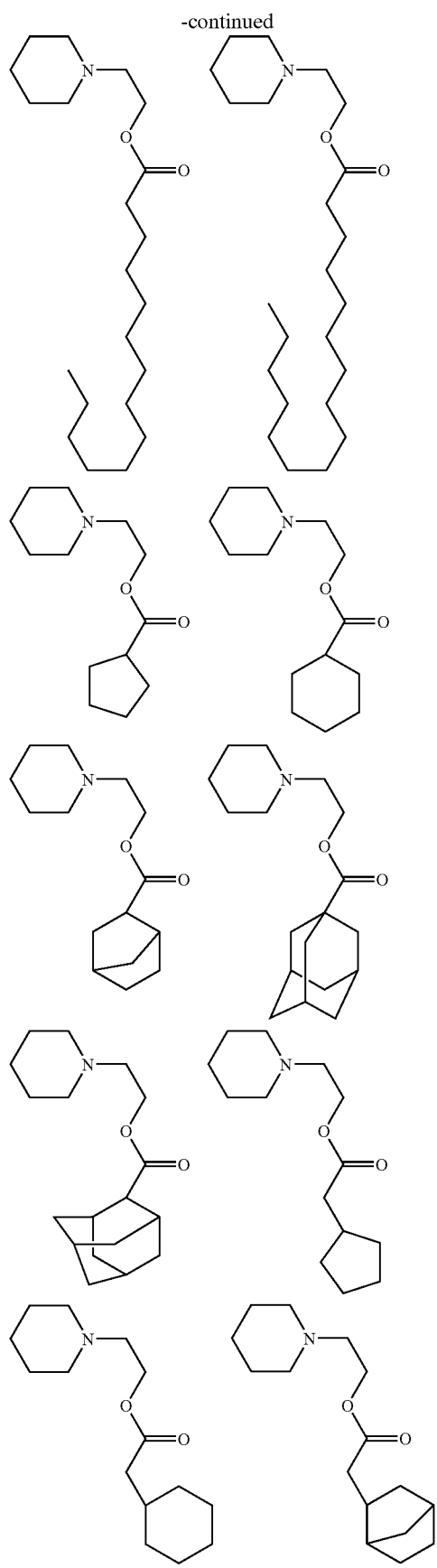
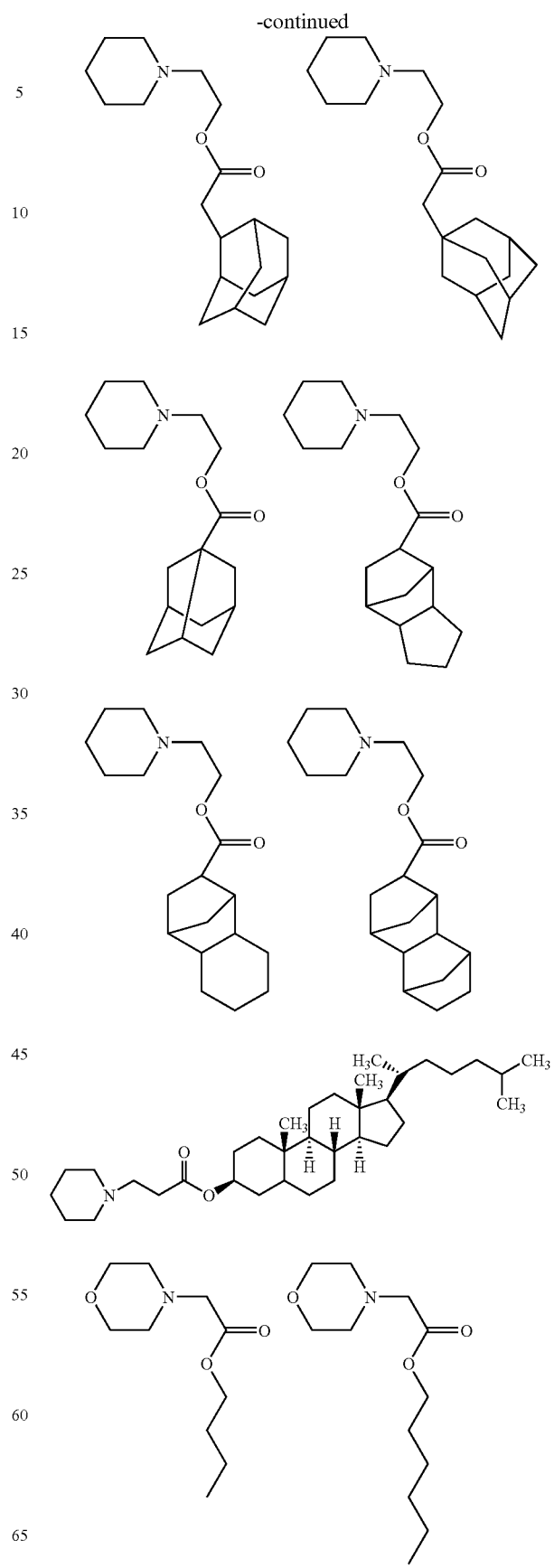

-continued
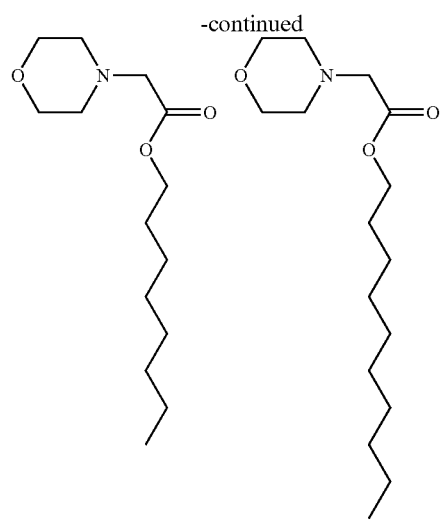
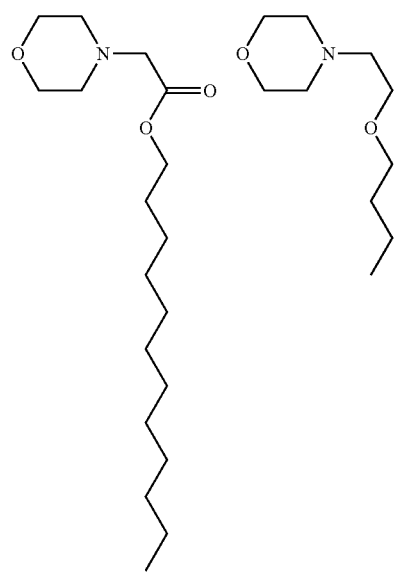
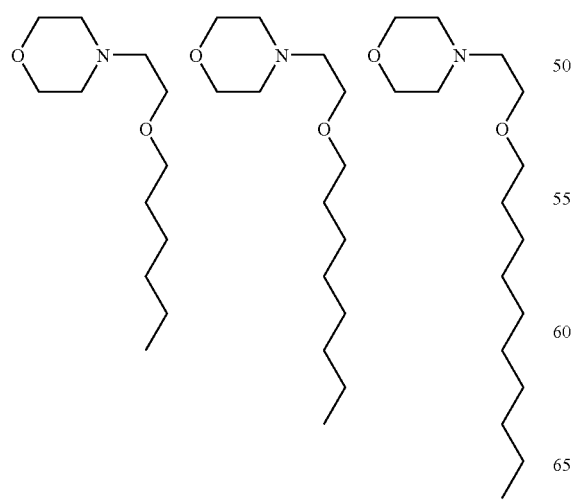
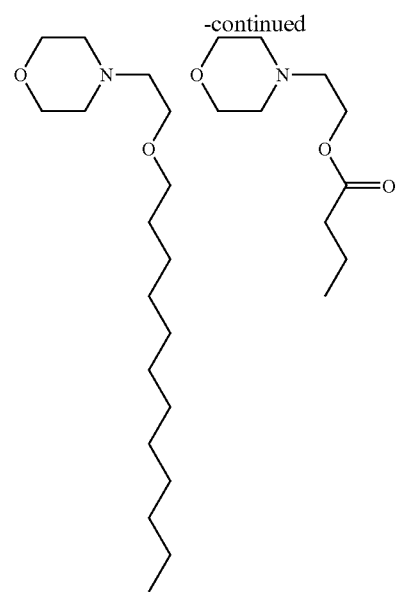
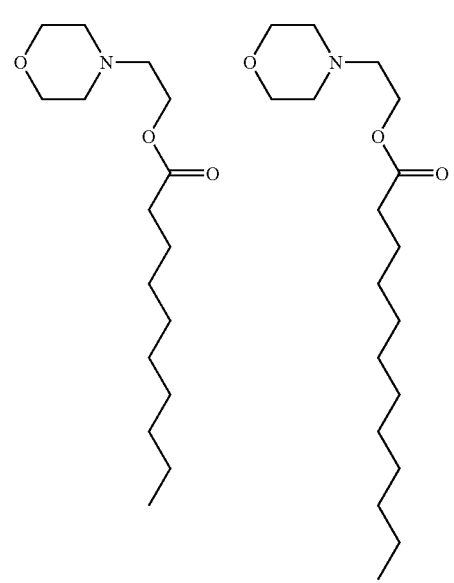

-continued
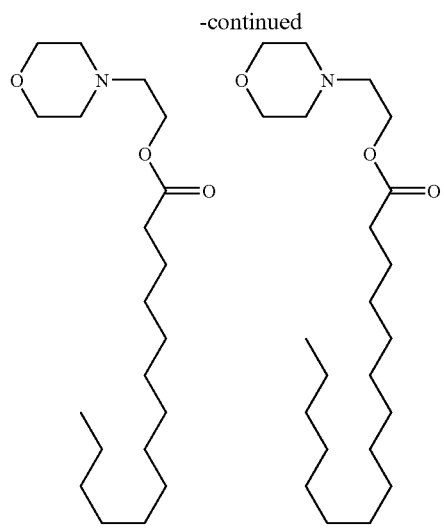
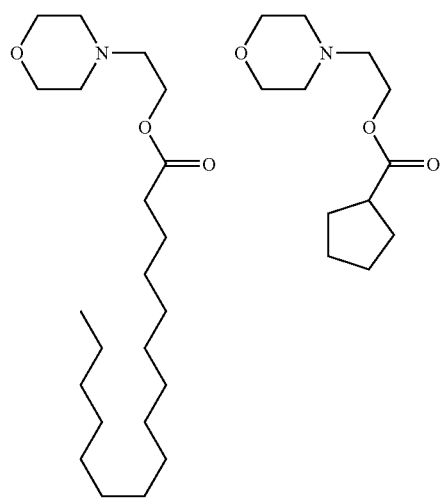
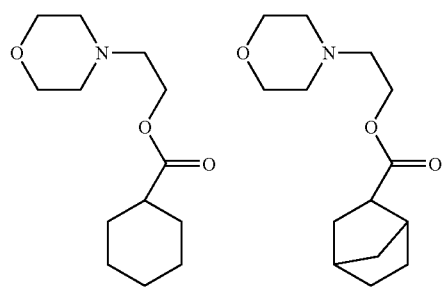
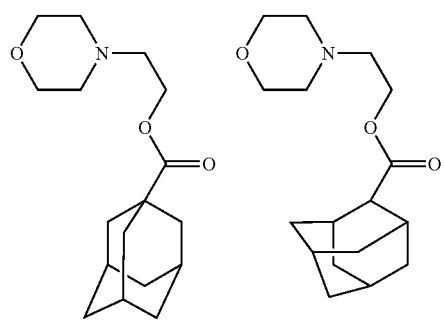
-continued
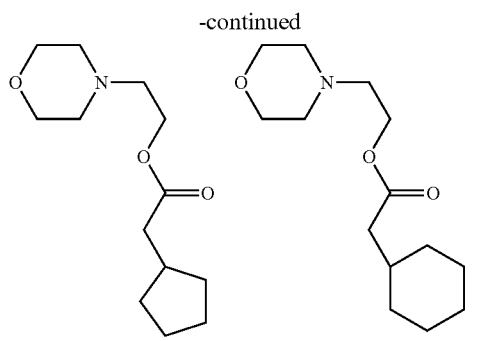
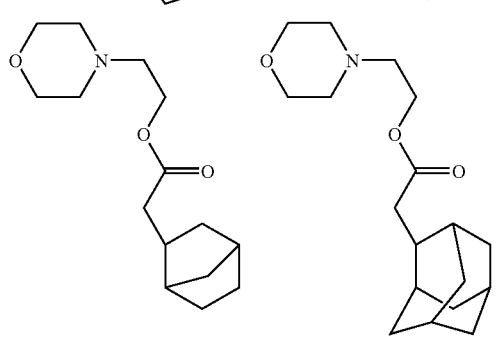
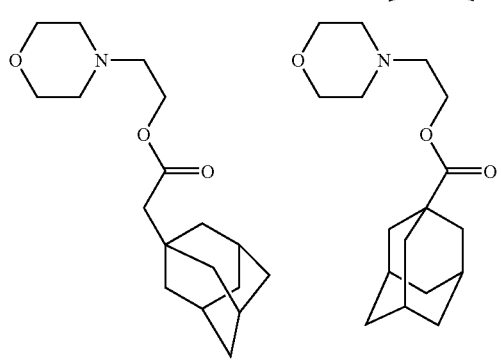
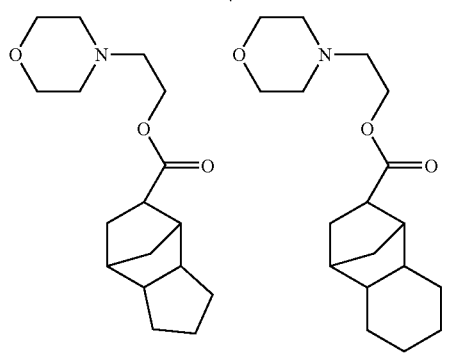

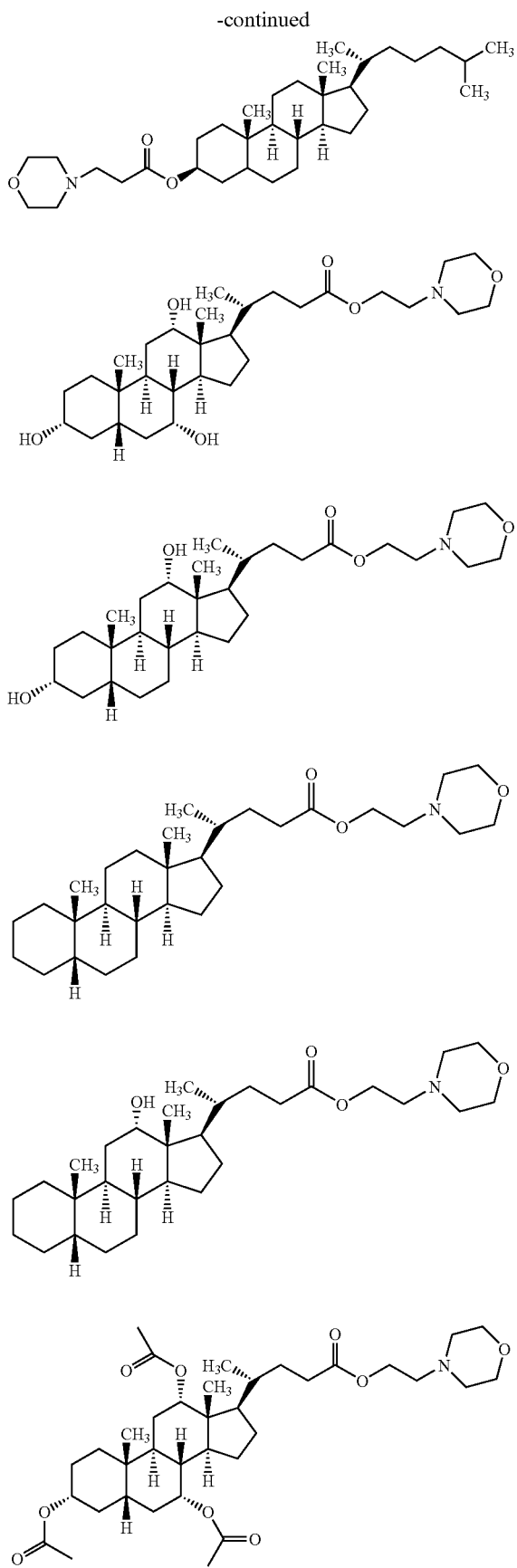
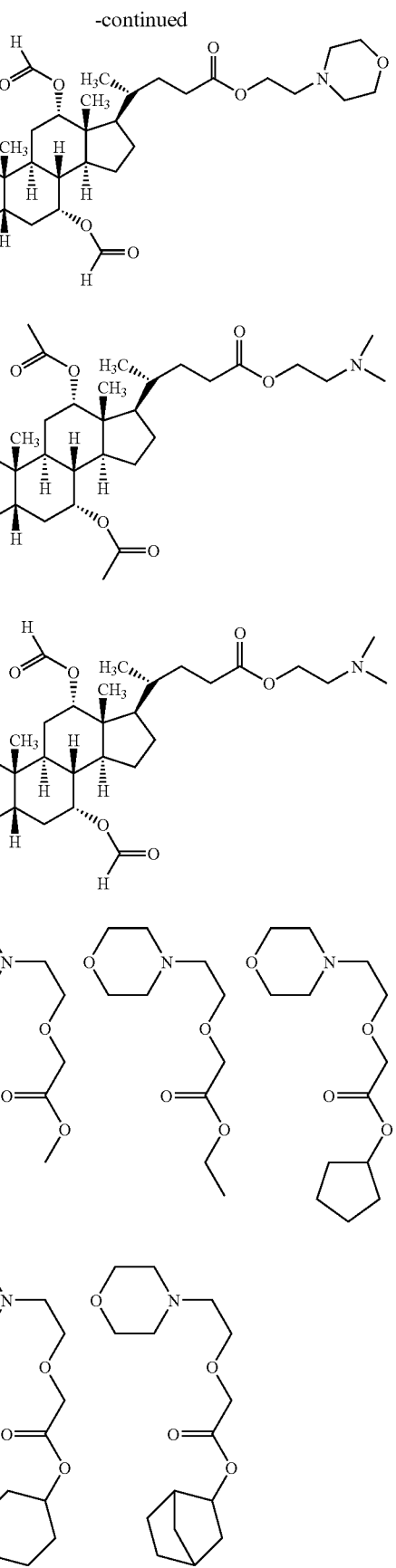

-continued
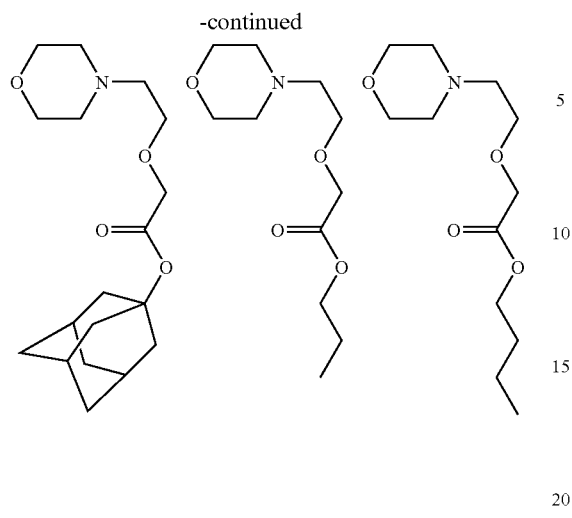
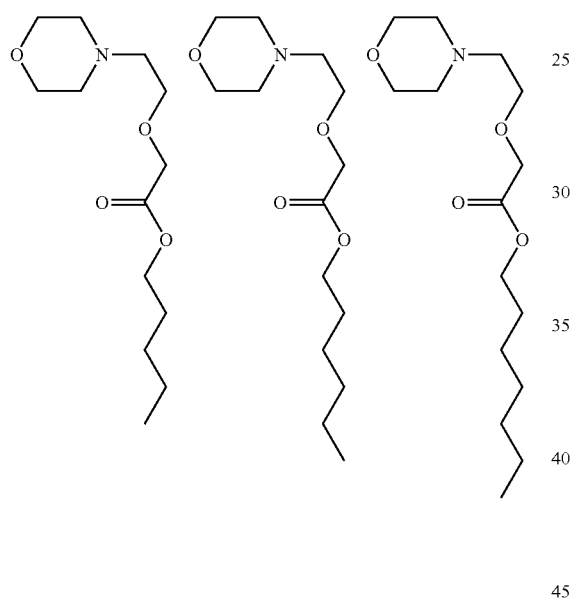
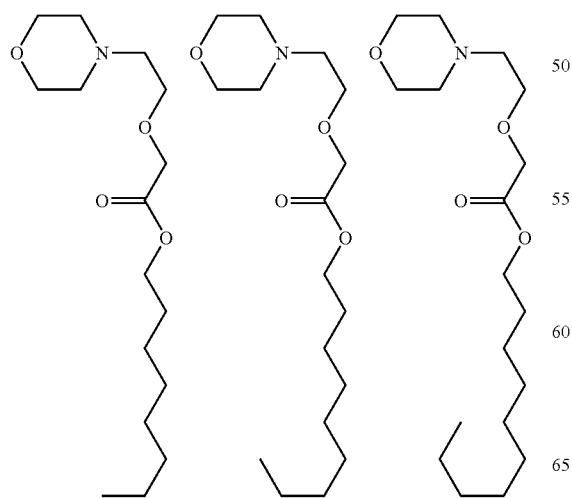
-continued
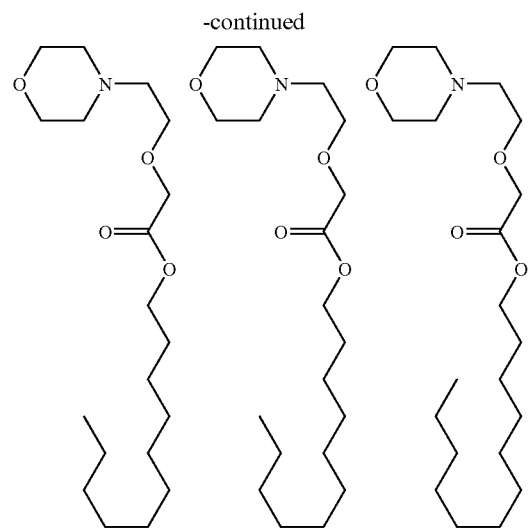
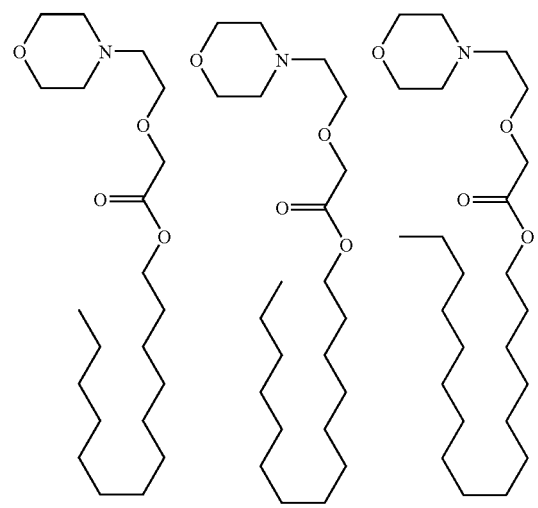
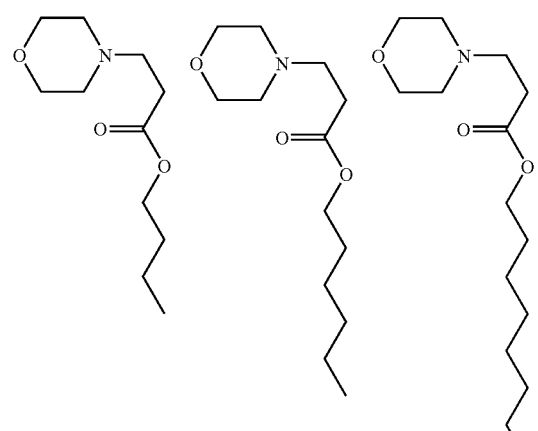

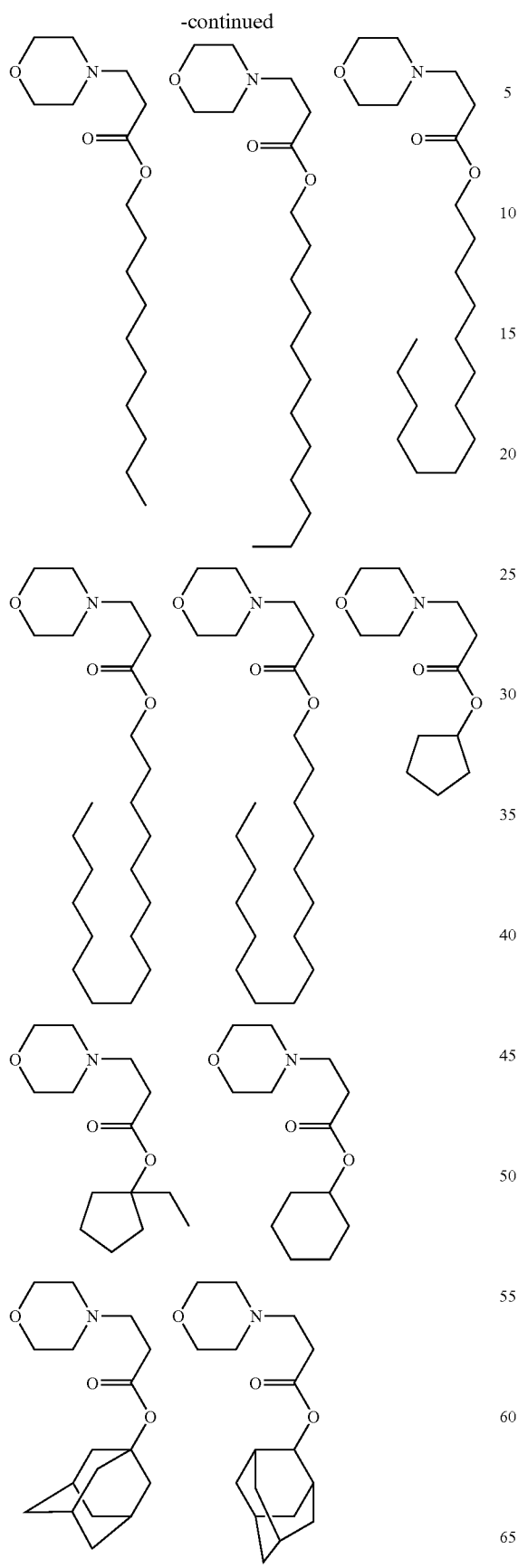
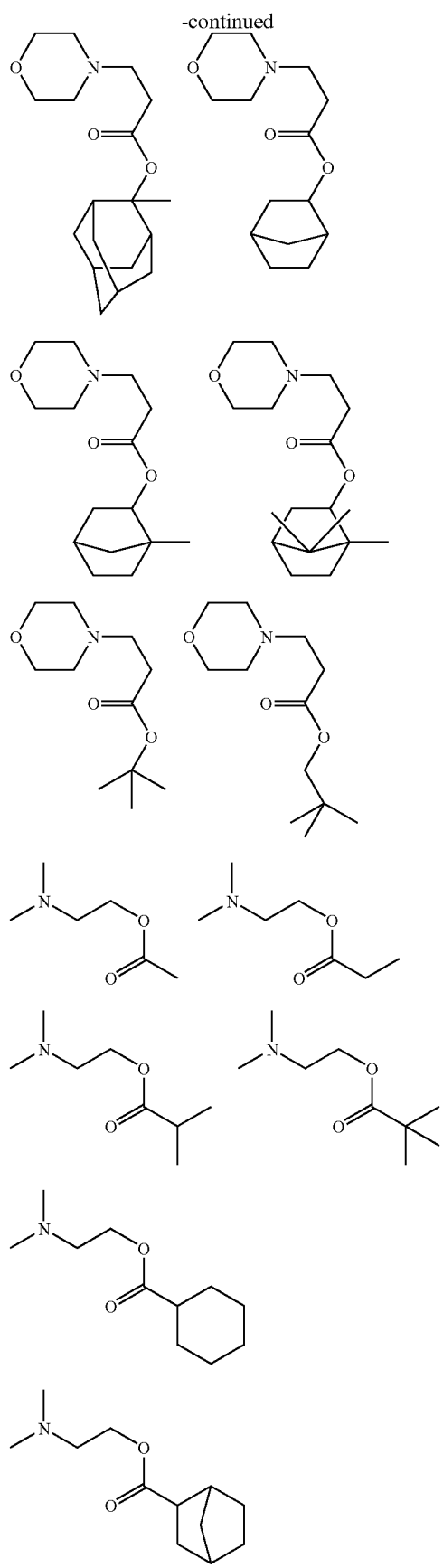

-continued
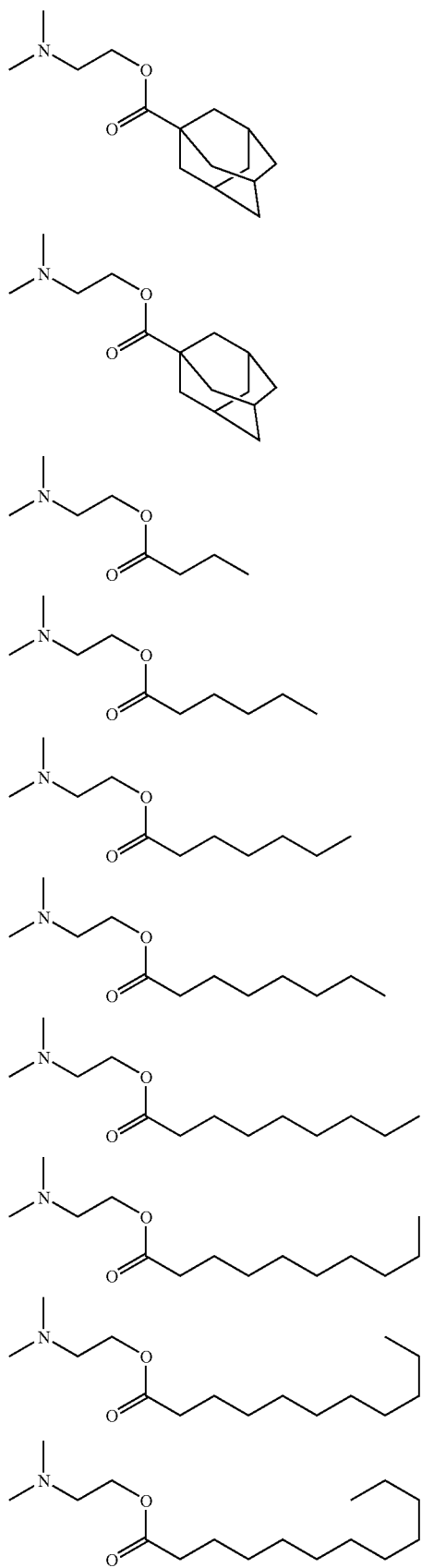
-continued
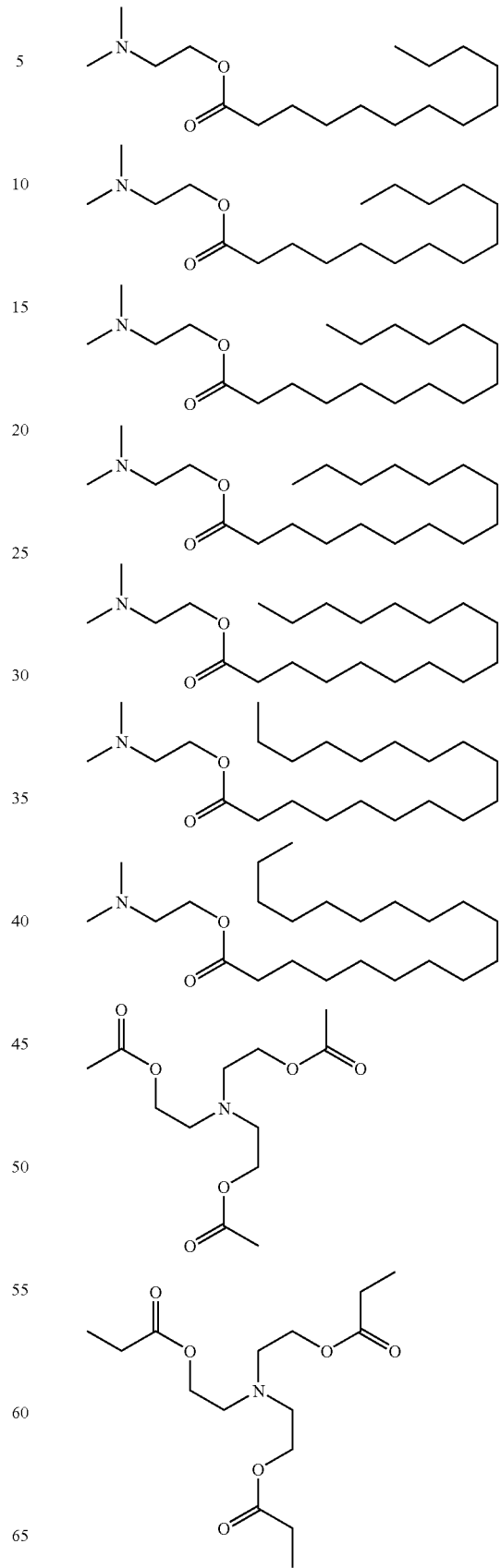

-continued
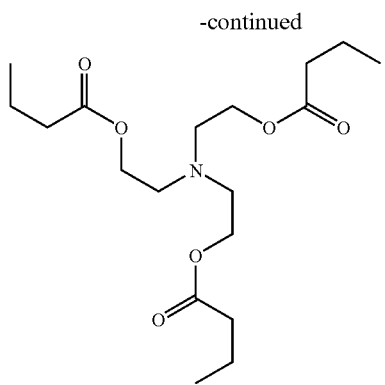
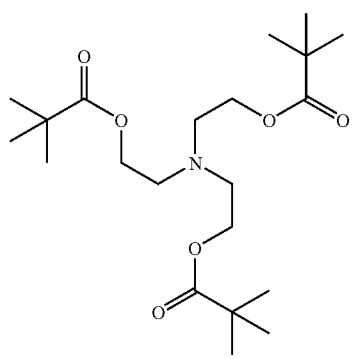
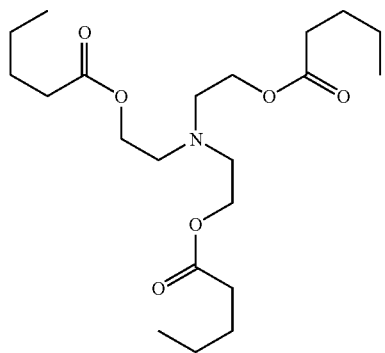
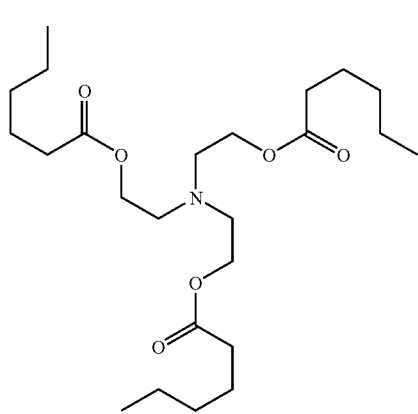
-continued
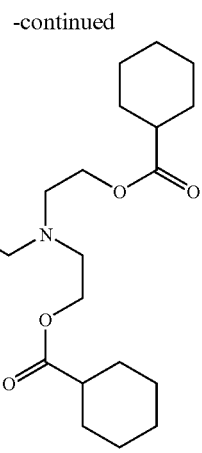
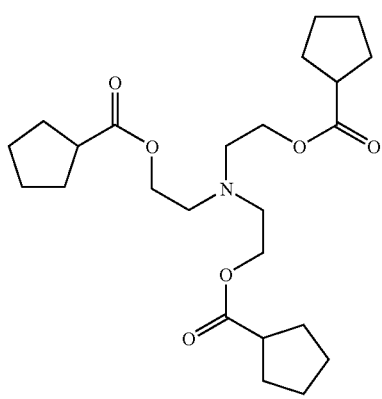
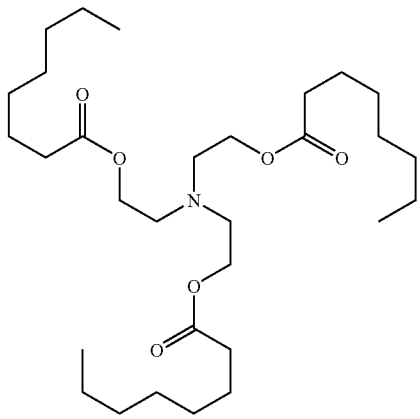
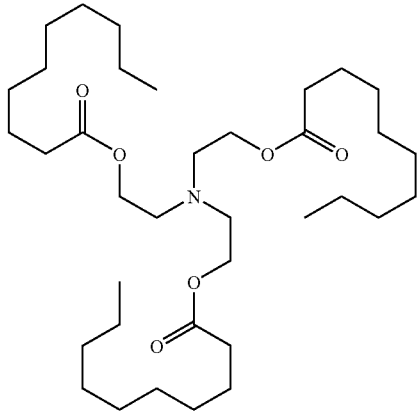

-continued
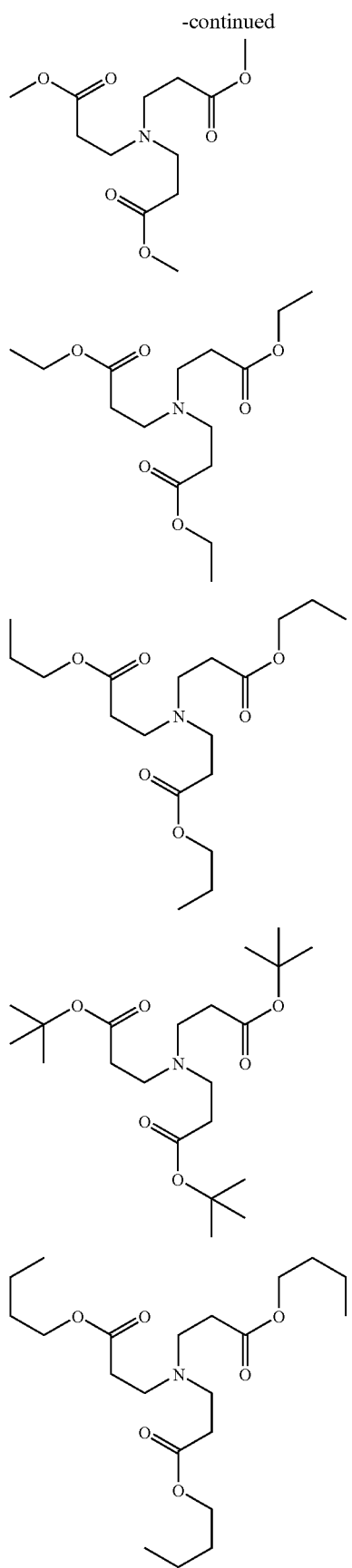
-continued
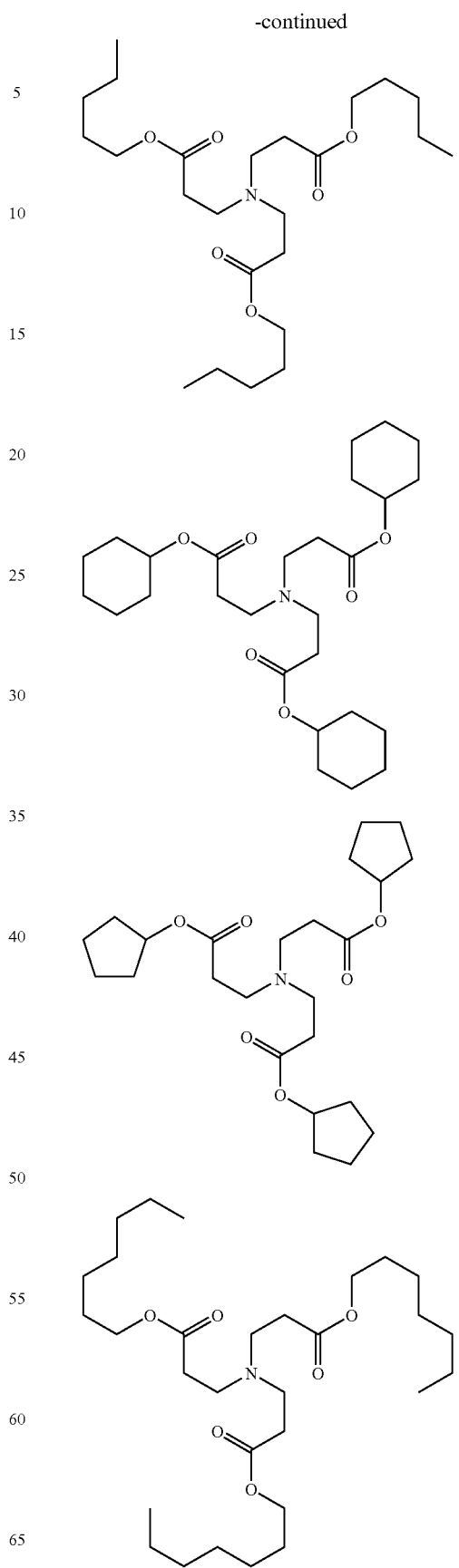

-continued
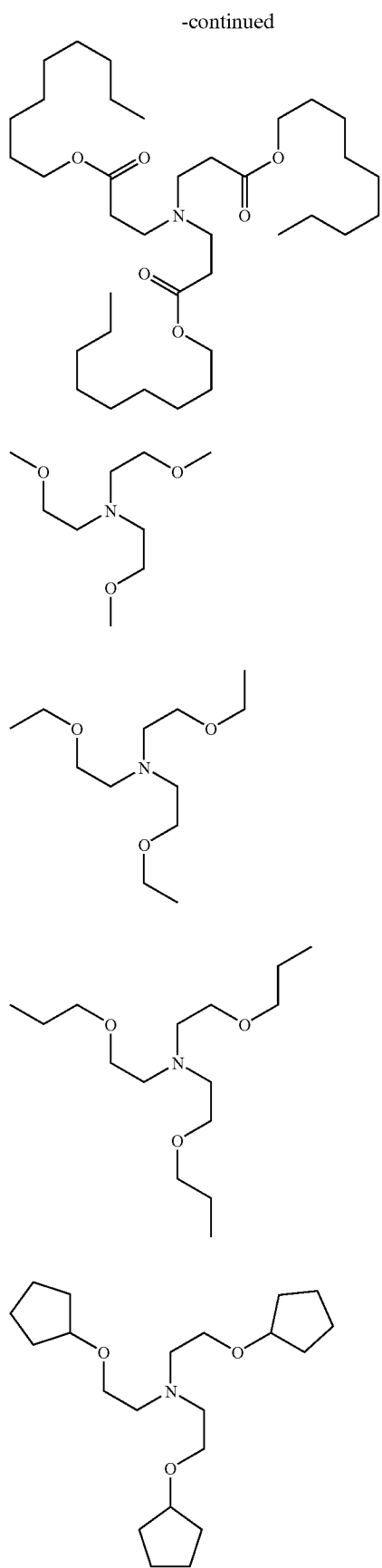
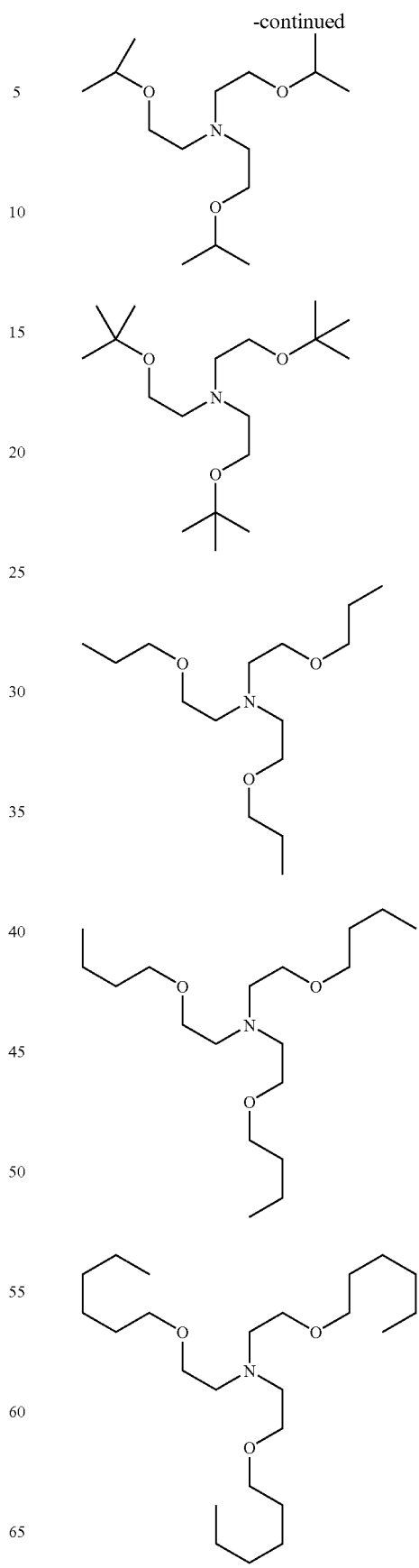

-continued
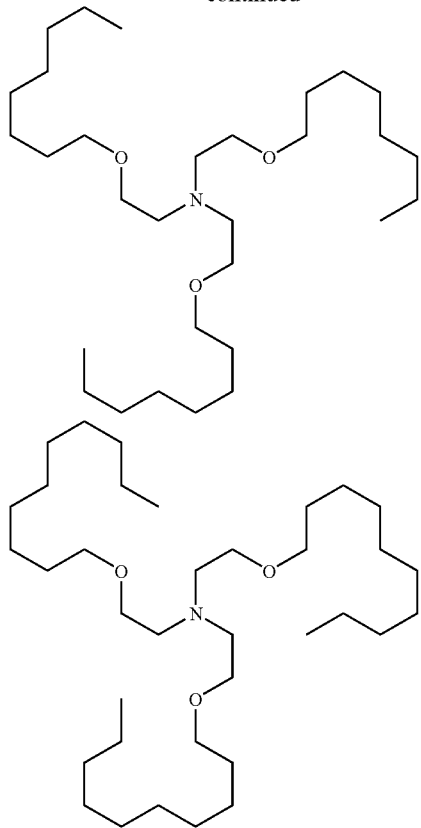
As for methods for synthesizing the above amine compounds, methods described in the Patent Publications may be used.
Furthermore, examples of amine compounds having fluoroalkyl groups are shown below.
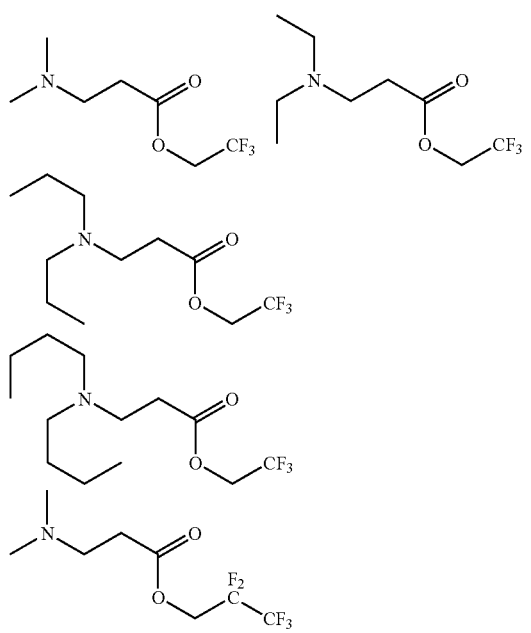
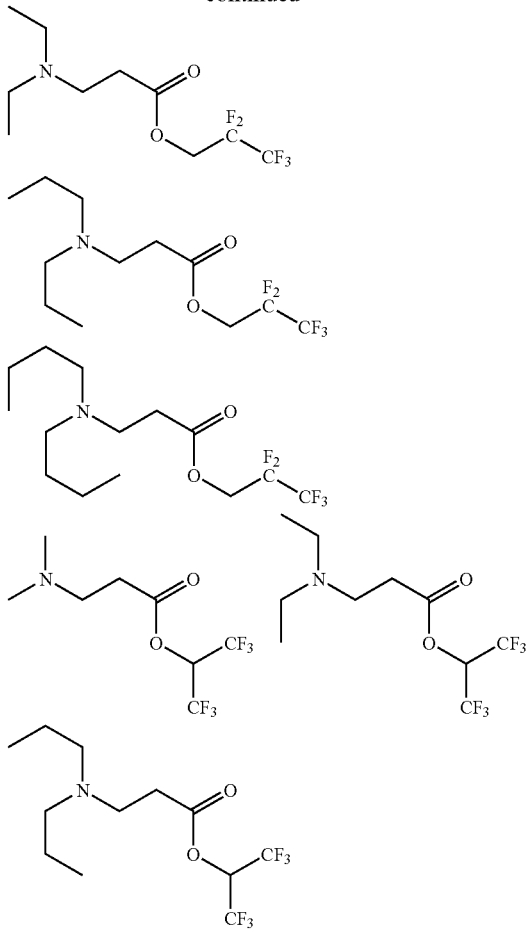
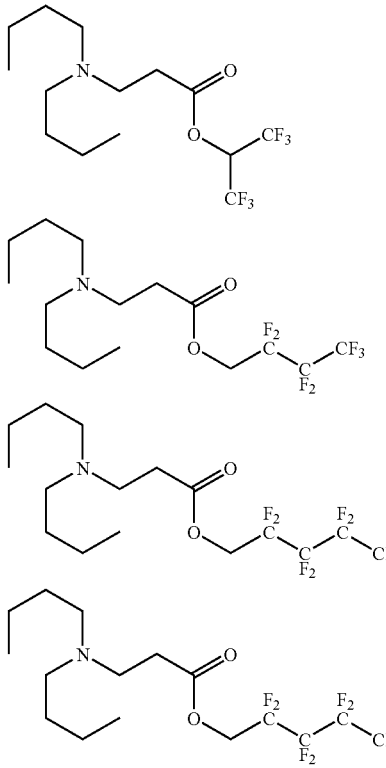

-continued
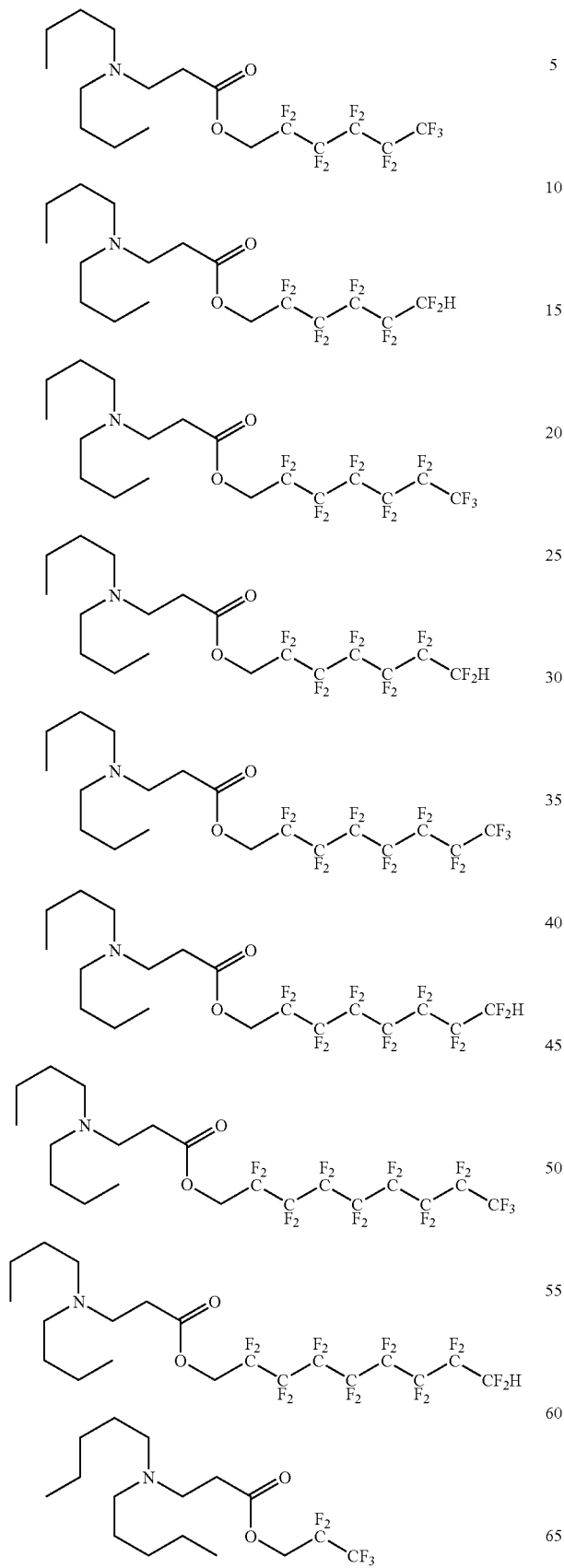
-continued
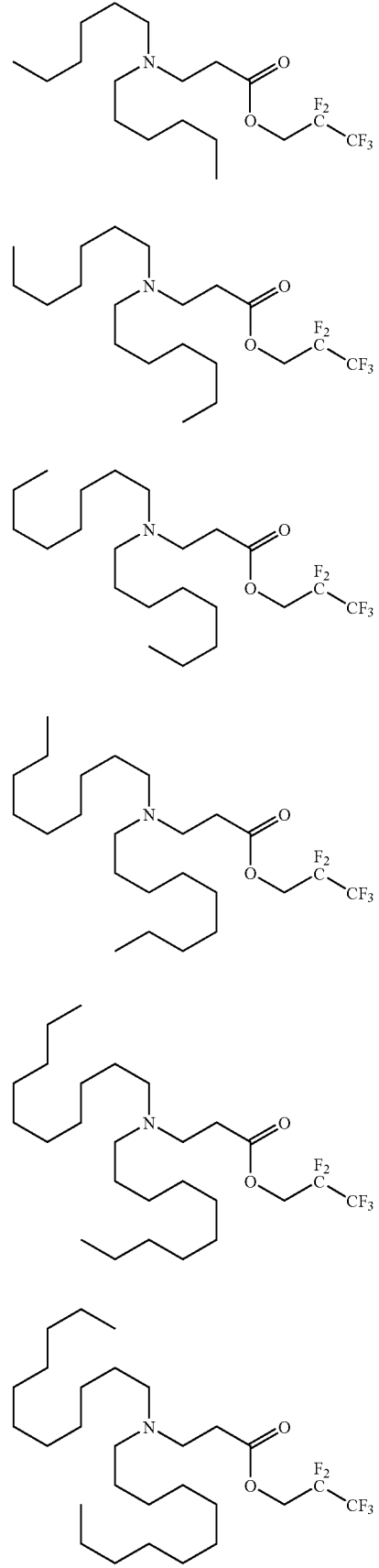

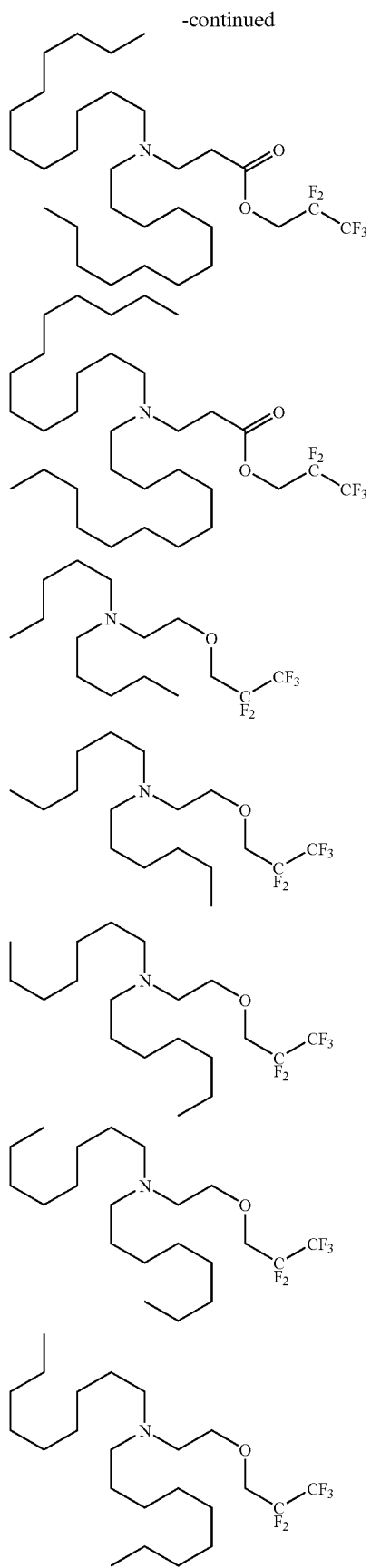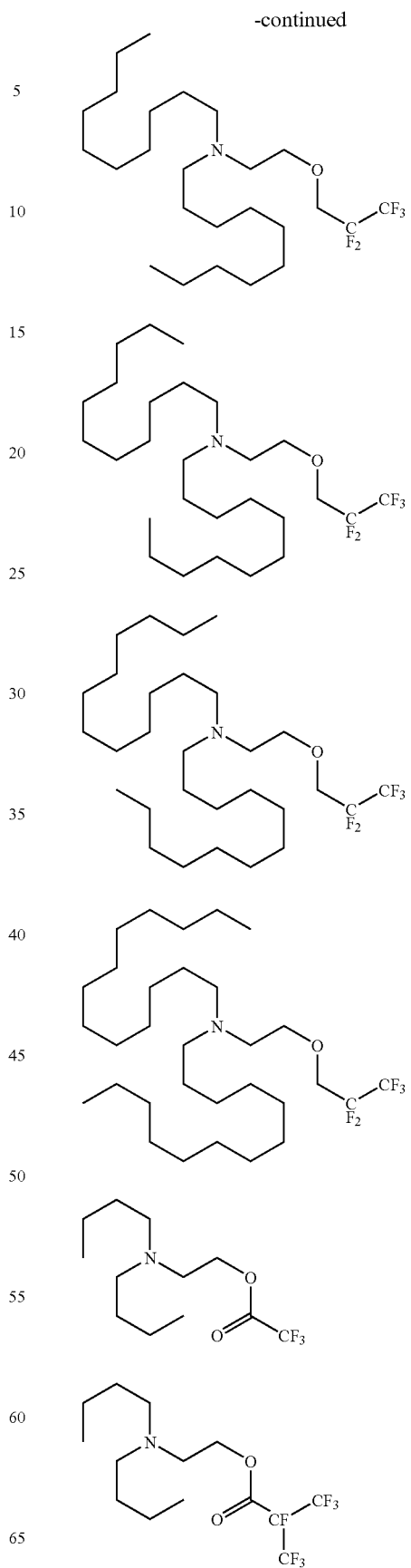

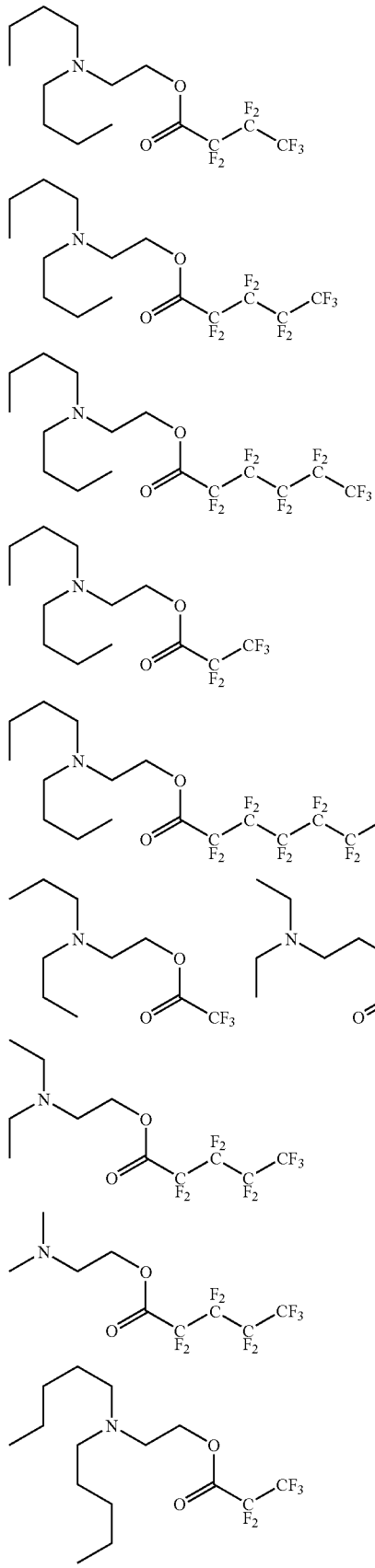
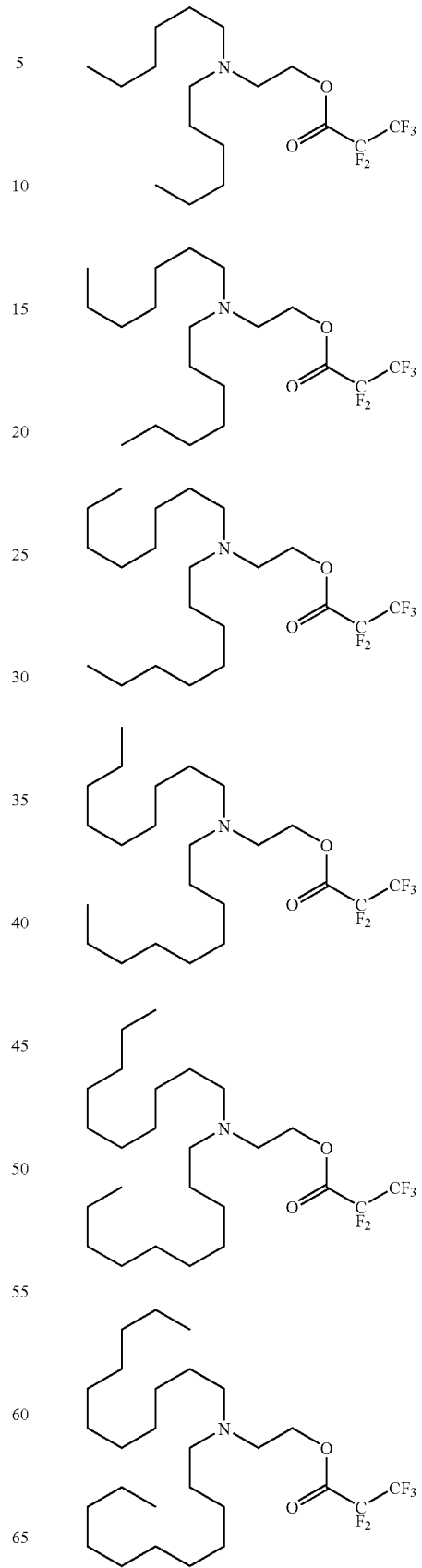

-continued
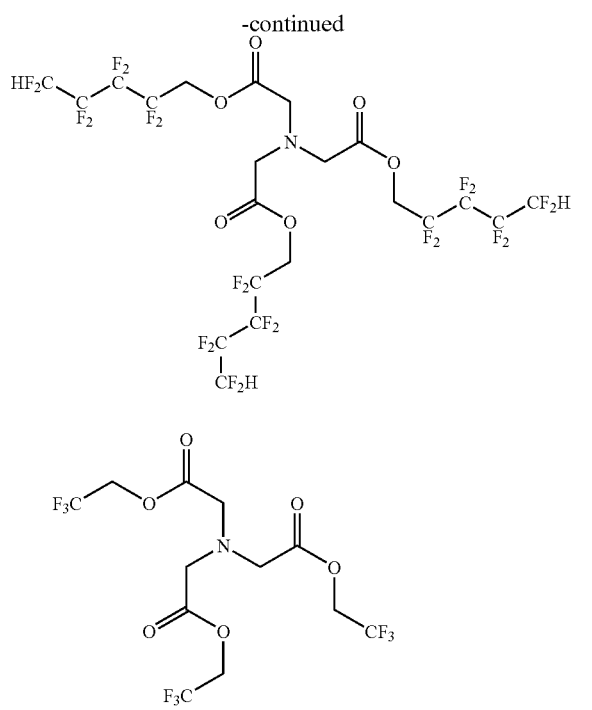
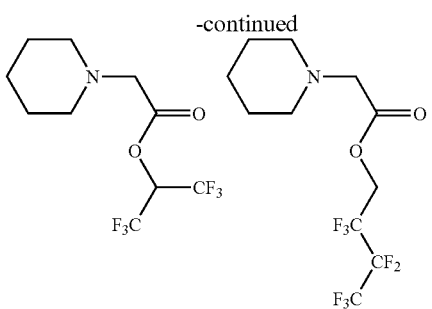
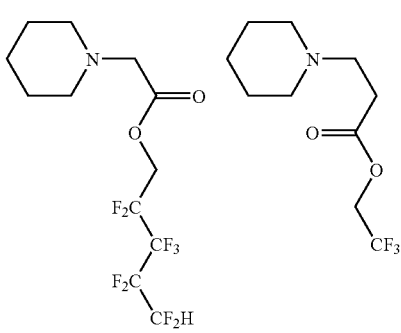
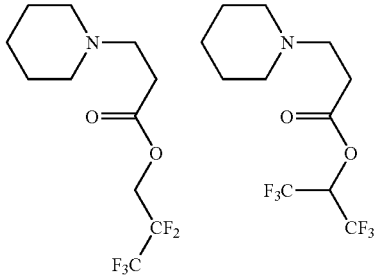
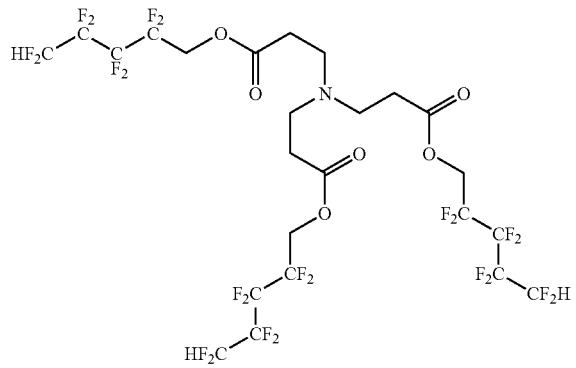
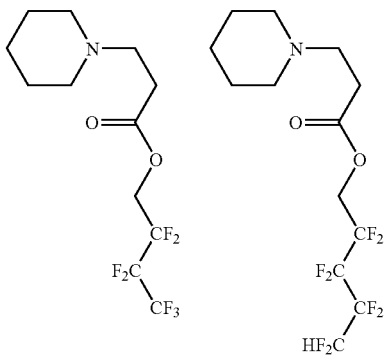
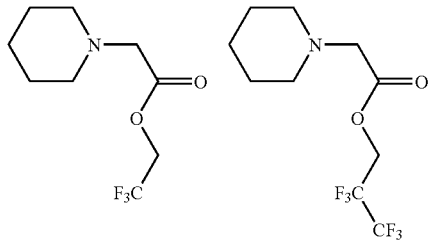
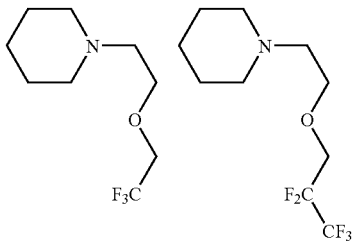

-continued
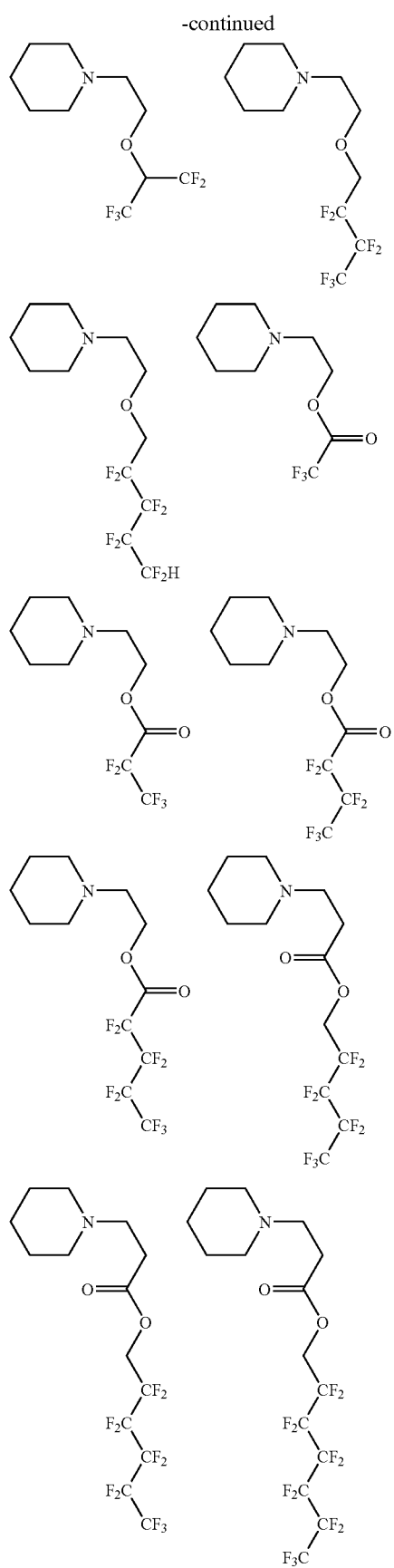
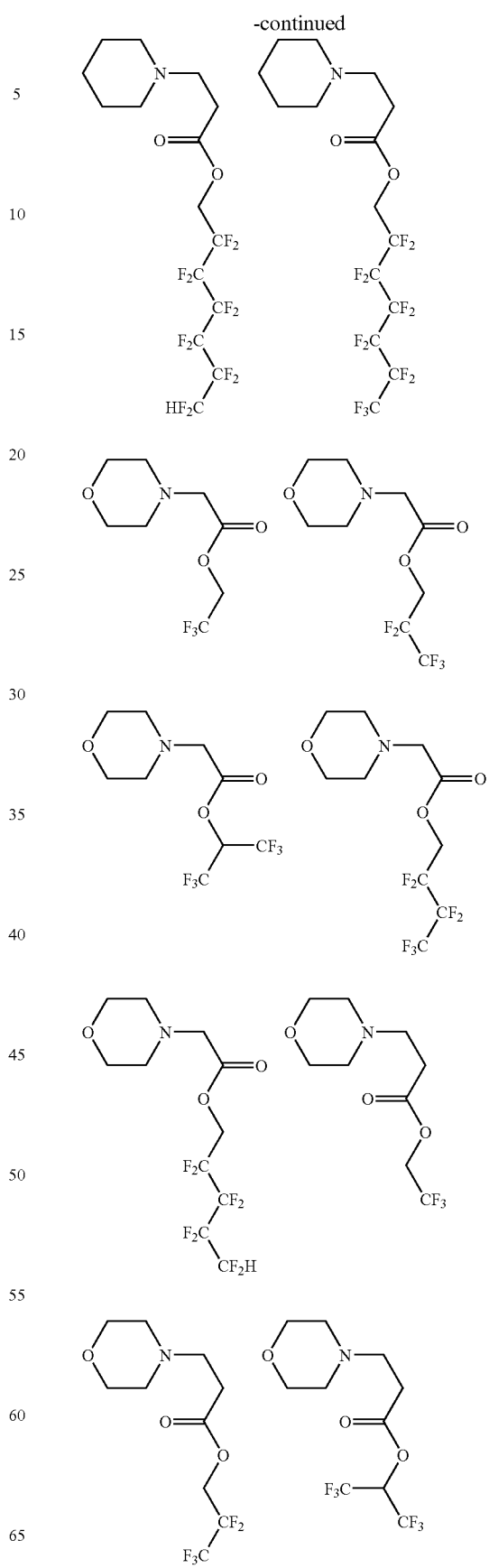

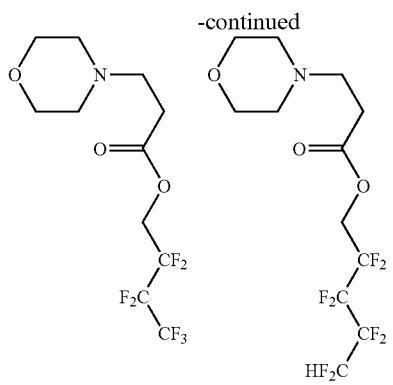
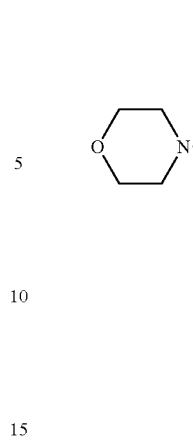
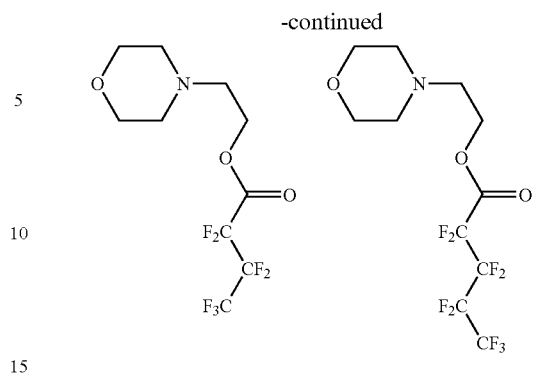
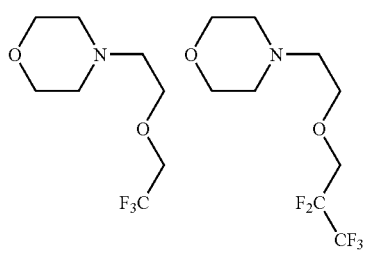
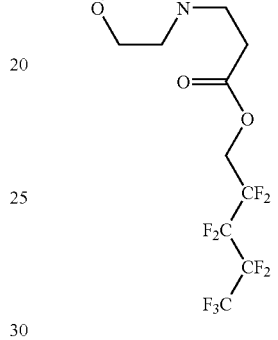
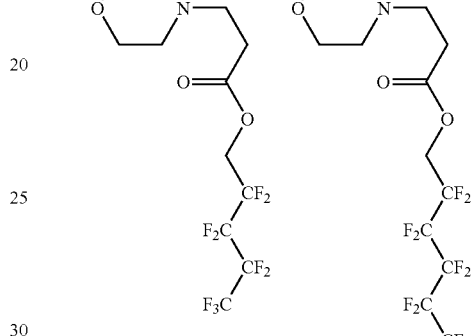
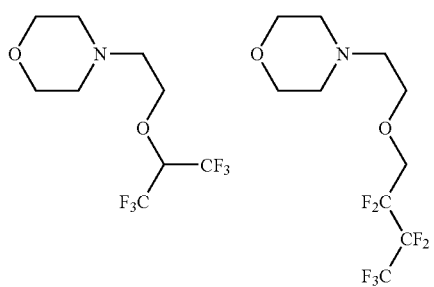
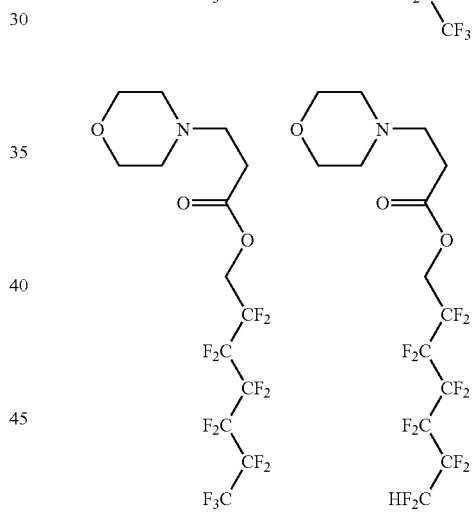
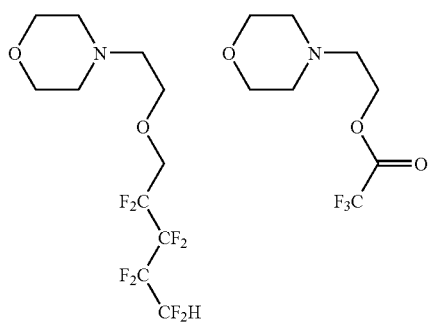
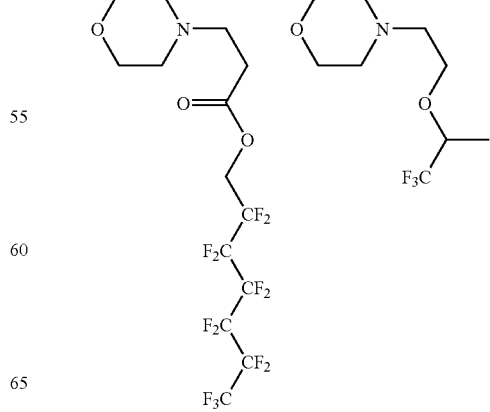
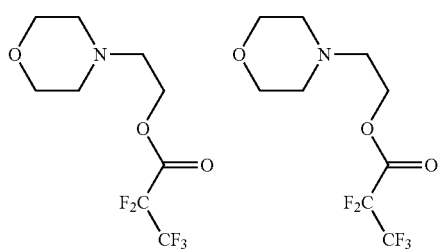

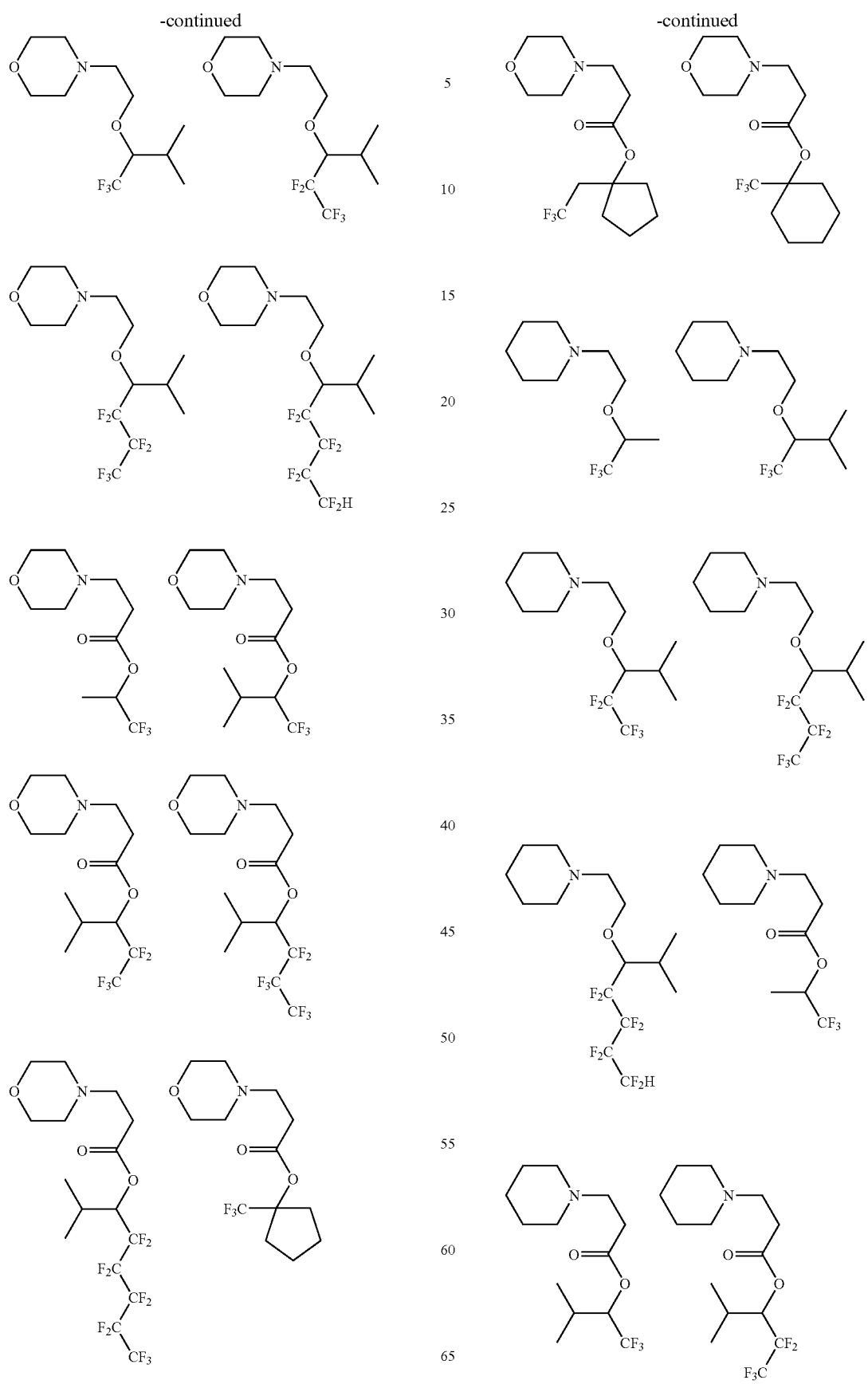

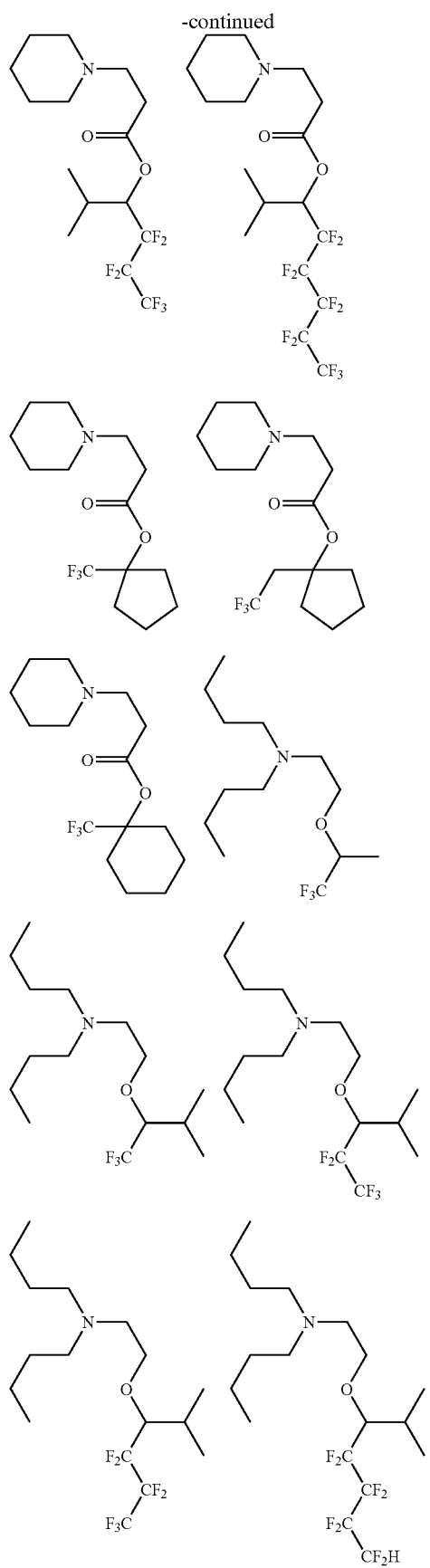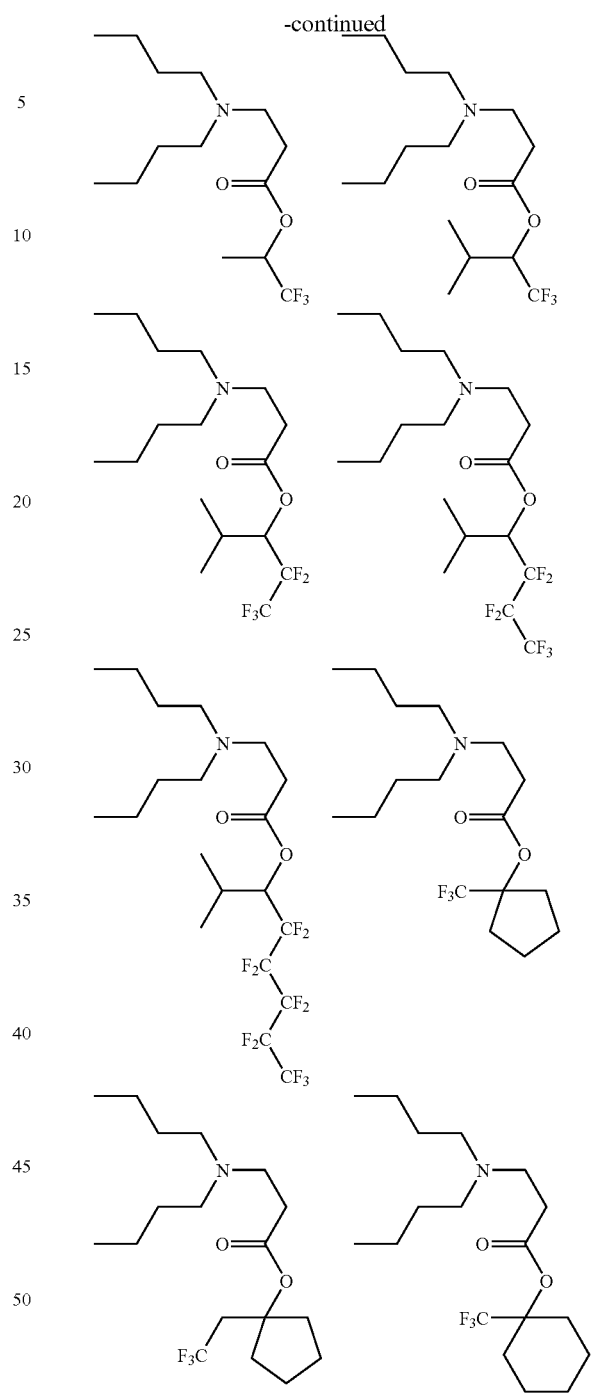

Among the above compounds, examples of a method for synthesizing amine compounds having fluoroalkyl groups are disclosed in Japanese Unexamined Patent Application Publication No. 2005-299558. That is, the examples may include: Michael addition reaction between a fluoroalkyl acrylate and a primary amine or a secondary amine; an etherification of a fluoroalkyl in an amine having an alkanol group; and an acylation of a fluoroalkyl in an amine having an alkanol group.

In particular, preferred sulfonamides are non-aromatic compounds that do not absorb the wavelength of 193 nm. Examples of such sulfonamides include products obtained through reactions between alkylamines and sulfonic acids. Specifically, examples of the sulfonamides may include sulfonamides of alkylamines having 2 to 30 carbon atoms such as methanesulfonyl piperidine, n-butanesulfonyl piperidine, trifluoromethanesulfonyl piperidine, nonafluorobutanesulfonyl piperidine, trifluoromethanesulfonyl butylamine, trifluoromethanesulfonyl dibutylamine, trifluoromethanesulfonyl pentylamine, trifluoromethanesulfonyl octylamine, trifluoromethanesulfonyl nonylamine, trifluoromethanesulfonyl decylamine, trifluoromethanesulfonyl dodecylamine, trifluoromethanesulfonyl tridecylamine, trifluoromethanesulfonyl tetradecylamine, trifluoromethanesulfonyl pentadecylamine, trifluoromethanesulfonyl hexadecylamine, trifluoromethanesulfonyl adamantylamine, trifluoromethanesulfonyl noradamantylamine, trifluoromethanesulfonyl norbornylamine, trifluoromethanesulfonyl cyclopenthylamine, or trifluoromethanesulfonyl cyclohexylamine.

Incidentally, in the resist protective film composition according to the present invention, the amount of the amine compound to be mixed is preferably 0.0001 to 5 parts, and in particular preferably 0.01 to 3 parts to 100 parts of the total of base resins. The mixing amount of 0.0001 parts or more provides sufficient mixing effects. On the other hand, when the mixing amount is 3 parts or less, there is less possibility that developed resist profile becomes T-top profile or a hole pattern does not have an opening.

As mentioned above, the resist protective film composition according to the present invention further contains a polymer including a repeating unit having one or more groups selected from a carboxyl group and α-trifluoromethyl alcohol groups.

Thus, when the resist protective film composition contains a polymer including a repeating unit having one or more groups selected from a carboxyl group and α-trifluoromethyl alcohol groups, a protective film formed with the composition has a high alkali solubility and thus can be stripped with an alkaline developer more easily at the time of development. In addition, such a protective film is suitably used with photoresist films.

In the above cases, the repeating unit (hereinafter, referred to as the repeating unit a) having an α-trifluoromethyl alcohol group in the polymer is preferably represented by the following general formula (3),

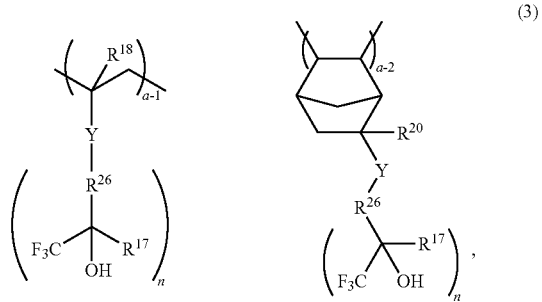

(3)

wherein $R^{18}$ and $R^{20}$ independently represent any one of a hydrogen atom, a fluorine atom, a methyl group, and a trifluoromethyl group;

Y independently represents any one of a single bond, —O—, —C(=O)—O—, —C(=O)—O—$R^{28}$—C(=O)—O—, —C(=O)—O—$R^{28}$—O—, and —C(=O)—O—$R^{28}$—O—C(=O)—;

$R^{28}$ represents a linear, branched or cyclic alkylene group having 1-10 carbon atoms, and hydrogen atoms of the alkylene group may be totally or partially substituted with a fluorine atom;

$R^{26}$ independently represents a single bond, a linear, branched or cyclic alkylene group or alkanetriyl group having 1-25 carbon atoms, and hydrogen atoms of the alkylene group and alkanetriyl group may be totally or partially substituted with a fluorine atom;

$R^{17}$ independently represents any one of a hydrogen atom, a fluorine atom, a methyl group, a trifluoromethyl group, and a difluoromethyl group;

$R^{26}$ and $R^{17}$ may be linked to form a ring, and the ring may contain one or more groups selected from an ether group, alkylene groups whose hydrogen atoms are totally or partially substituted with a fluorine atom, and a trifluoromethyl group;

n is independently 1 or 2; and (a-1) and (a-2) satisfy $0 \leq (a-1) \leq 0.9$, $0 \leq (a-2) \leq 0.9$, and $0 \leq (a-1)+(a-2) \leq 0.9$.

In particular, it is preferable that the repeating unit having an α-trifluoromethyl alcohol group in the polymer is represented by the following general formula (4),

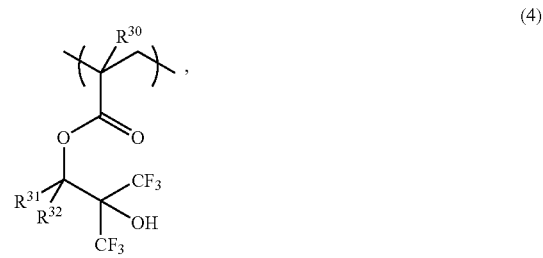

(4)

wherein $R^{30}$ represents a hydrogen atom or a methyl group; and $R^{31}$ and $R^{32}$ may be the same or different and represent a hydrogen atom or a linear, branched or cyclic alkyl group having 1-12 carbon atoms; and $R^{31}$ and $R^{32}$ may be linked to form a ring with the carbon atom to which $R^{31}$ and $R^{32}$ are linked.

When the repeating unit having an α-trifluoromethyl alcohol group in the polymer is represented by the general formula (4), such a repeating unit provides advantages of excellent water repellency and high rate of dissolution in alkaline developers.

Examples of monomers for obtaining the repeating unit a are shown below. Incidentally, in the following formulae, $R^{18}$ and $R^{20}$ are the same as above.

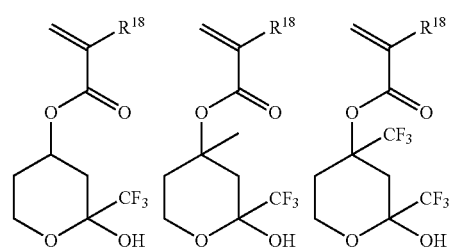

-continued
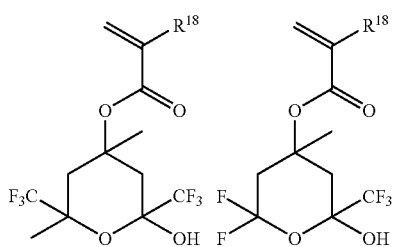
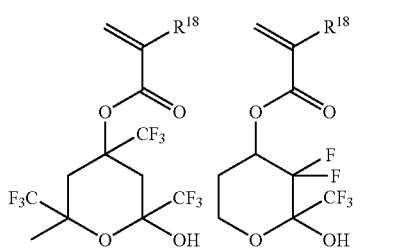
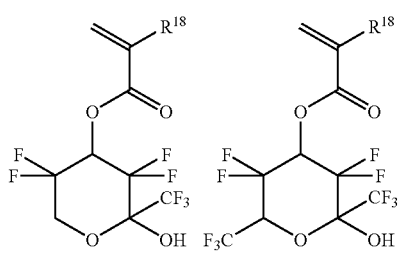
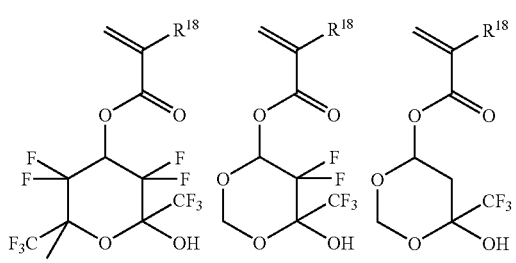
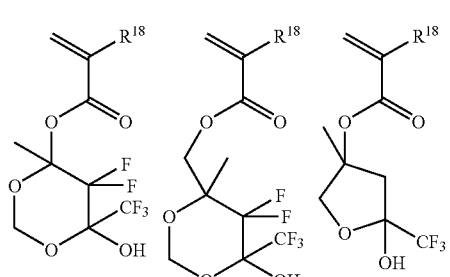
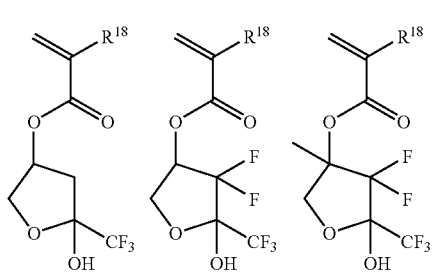
-continued
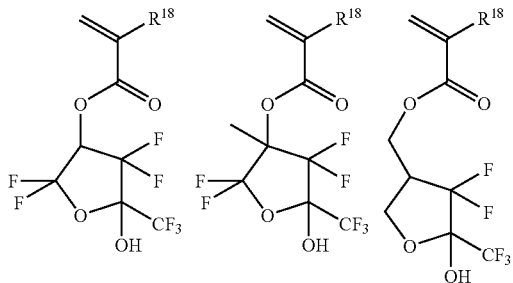
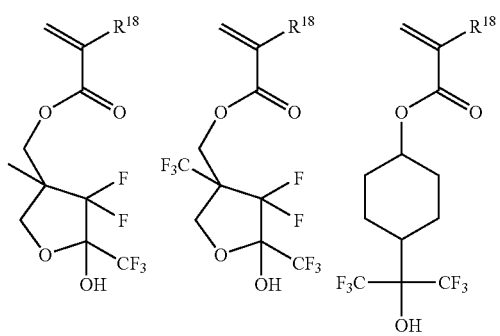
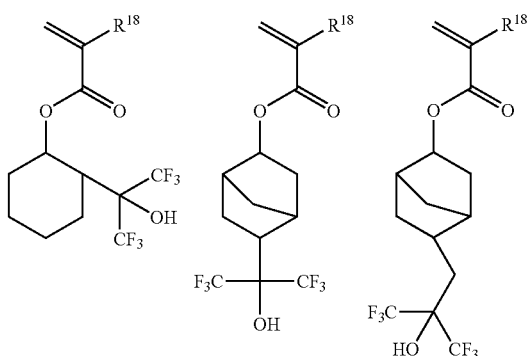
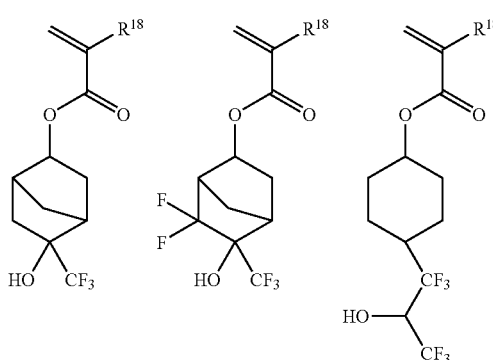
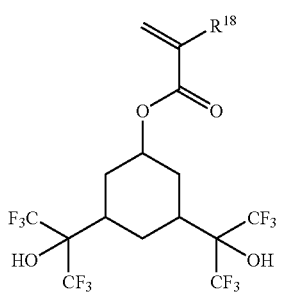

-continued
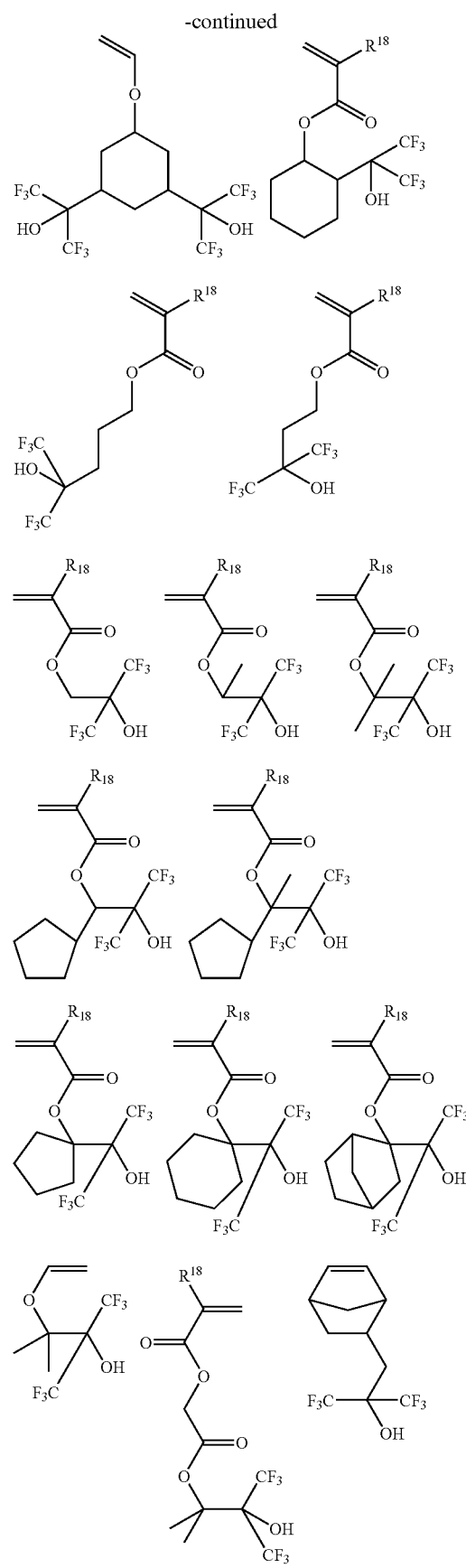
-continued
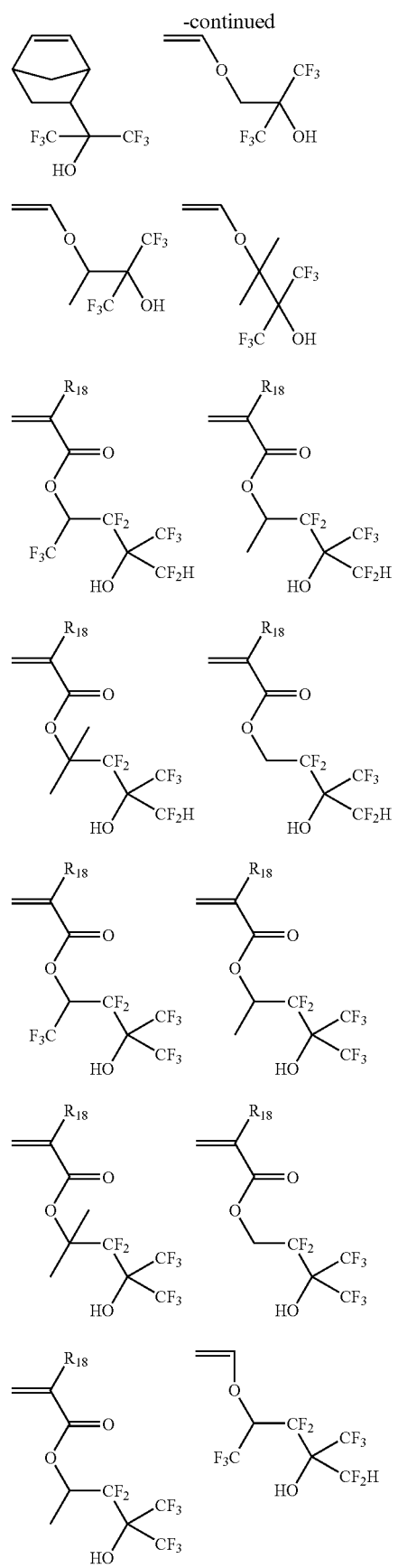

-continued
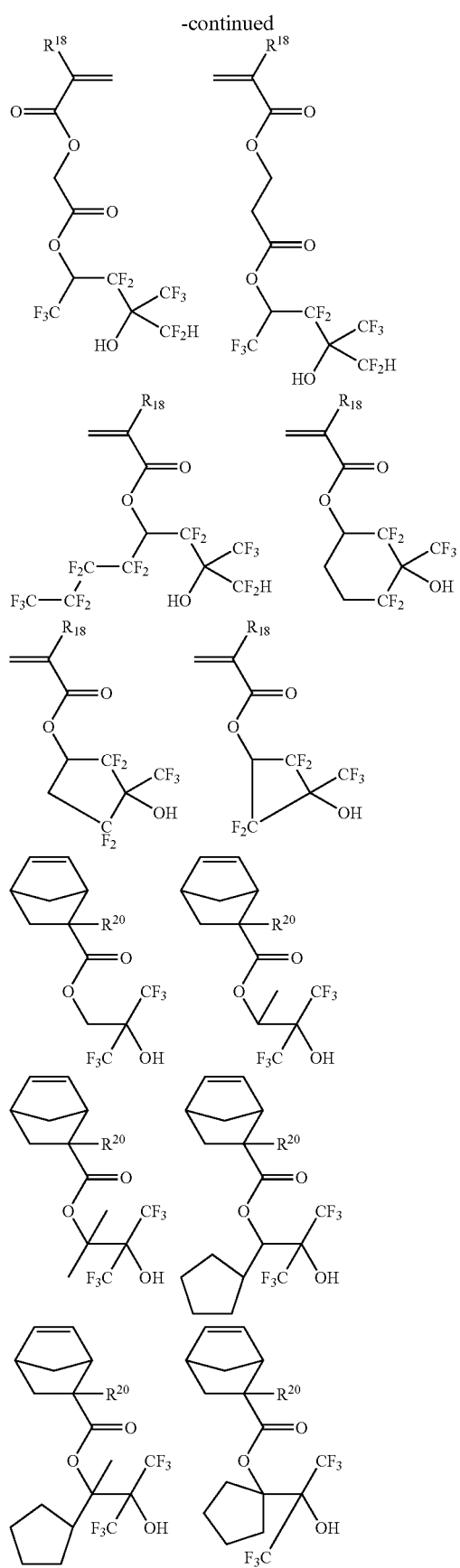
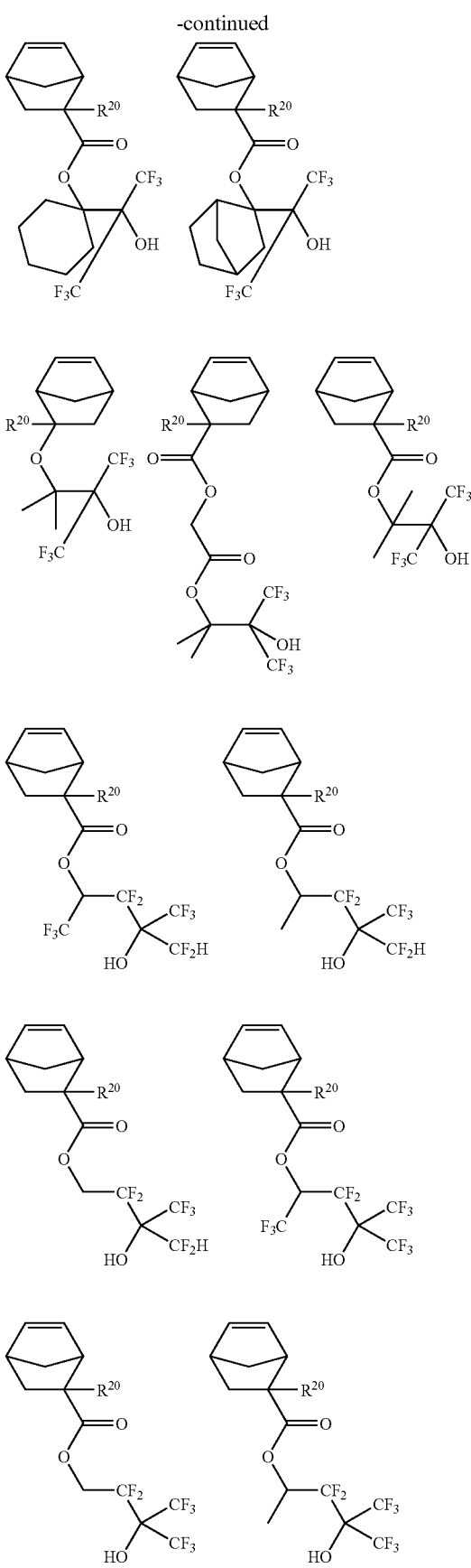

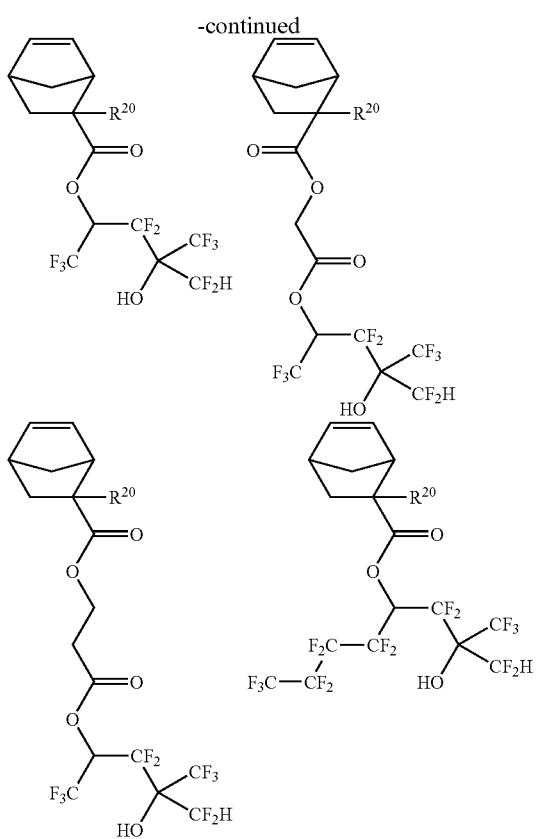

Furthermore, in the above cases, the repeating unit (hereafter referred to as the repeating unit b) having a carboxyl group in the polymer may be represented by the following general formula (5),

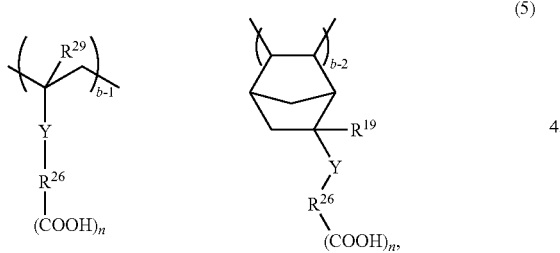

(5)

wherein $R^{29}$ represents any one of a hydrogen atom, a fluorine atom, a methyl group, a trifluoromethyl group, —COOH, and —CH$_2$—COOH;

$R^{19}$ represents any one of a hydrogen atom, a fluorine atom, a methyl group, a trifluoromethyl group, —COOH, and —CH$_2$—COOH;

Y independently represents any one of a single bond, —O—, —C(=O)—O—, —C(=O)—O—R$^{28}$—C(=O)—O—, —C(=O)—O—R$^{28}$—O—, and —C(=O)—O—R$^{28}$—O—C(=O)—;

$R^{28}$ represents a linear, branched or cyclic alkylene group having 1-10 carbon atoms, and hydrogen atoms of the alkylene group may be totally or partially substituted with a fluorine atom;

$R^{26}$ independently represents any one of a single bond, a linear, branched or cyclic alkylene group or alkanetriyl group having 1-25 carbon atoms, and hydrogen atoms of the alkylene group and alkanetriyl group may be totally or partially substituted with a fluorine atom;

n is independently 1 or 2; and (b-1) and (b-2) satisfy $0 \leq (b-1) \leq 0.9$, $0 \leq (b-2) \leq 0.9$, and $0 \leq (b-1)+(b-2) \leq 0.9$.

Examples of monomers for obtaining the repeating unit b are shown below. Incidentally, in the following formulae, $R^{29}$ and $R^{19}$ are the same as above.

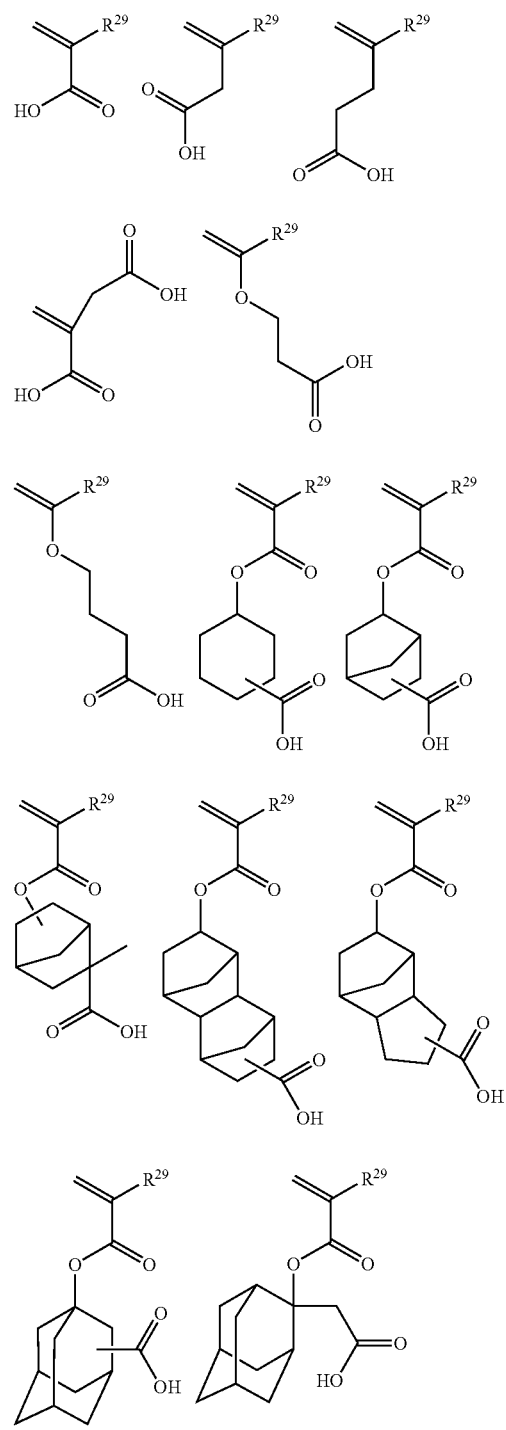

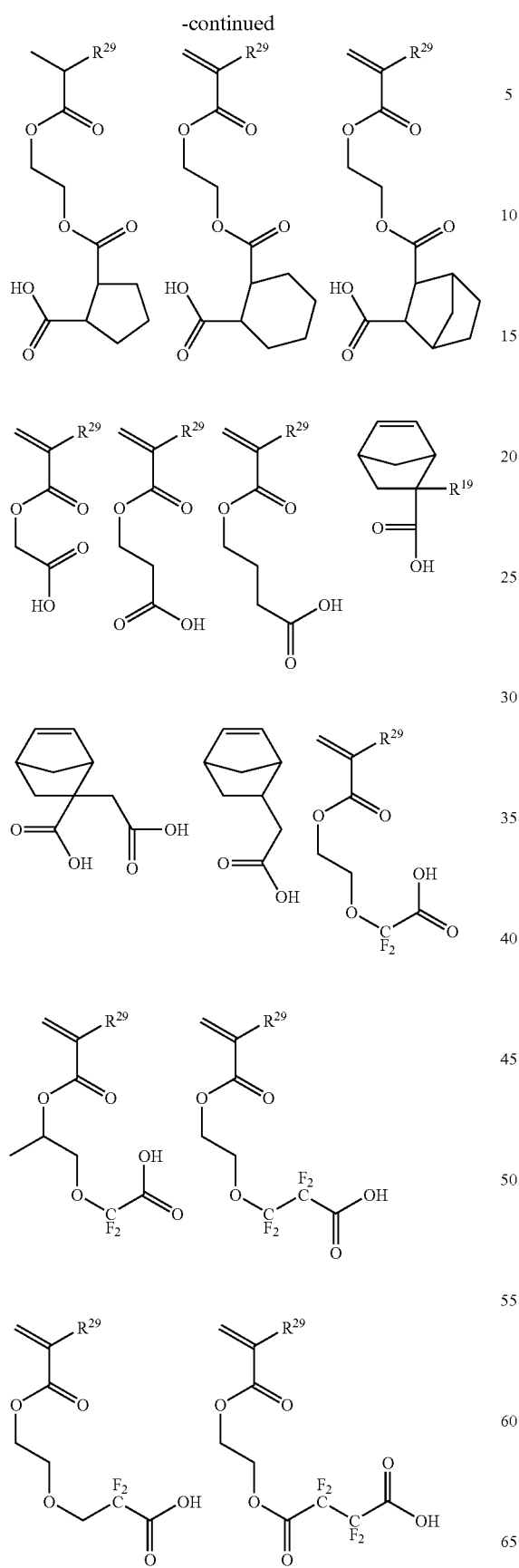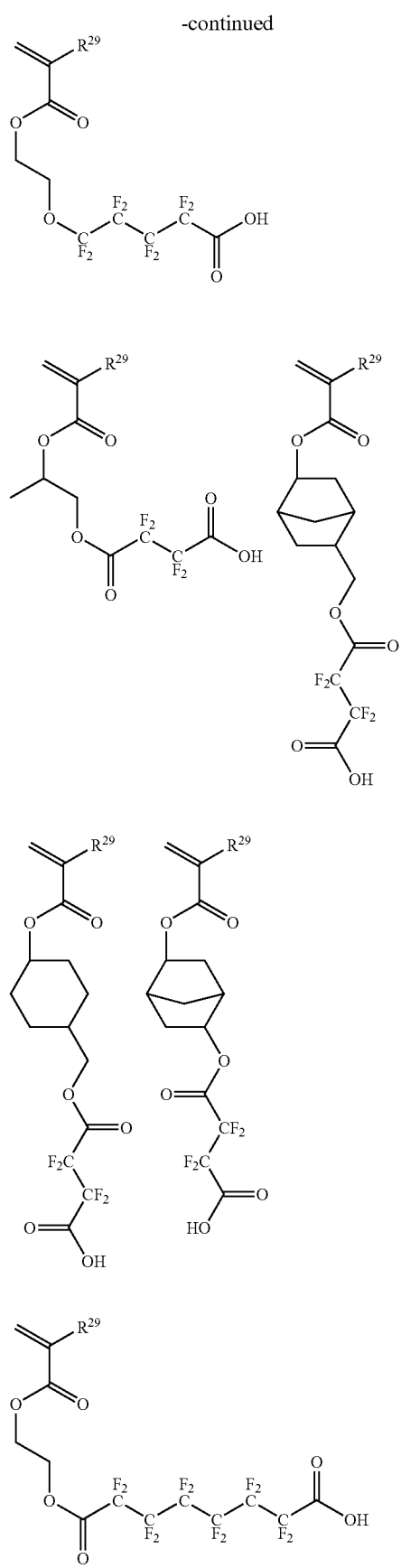

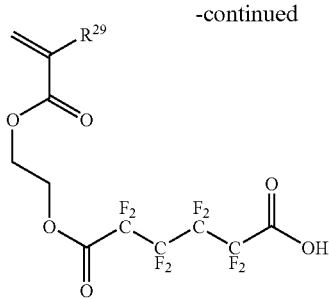

Furthermore, it is preferable that the resist protective film composition according to the present invention comprises a polymer including a repeating unit (hereafter referred to as the repeating unit c) having one or more groups selected from alkyl groups and fluoroalkyl groups.

As mentioned above, when the resist protective film composition comprises a polymer including the repeating unit c, forming a protective film with the composition enhances water repellency of the protective film and effectively prevents the protective film from mixing with a photoresist film.

And in the above case, the repeating unit having one or more groups selected from alkyl groups and fluoroalkyl groups in the polymer is preferably represented by the following general formula (6), (6)

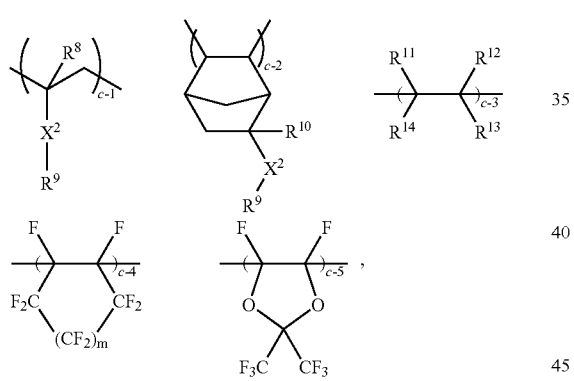

wherein $R^8$ and $R^{10}$ independently represent any one of a hydrogen atom, a fluorine atom, a methyl group, and a trifluoromethyl group;

$X^2$ independently represents any one of a single bond, —O—, —C(=O)—O—, and —C(=O)—O—$R^{16}$—C(=O)—O—;

$R^{16}$ represents a linear, branched or cyclic alkylene group having 1-10 carbon atoms, and hydrogen atoms of the alkylene group may be totally or partially substituted with a fluorine atom;

$R^9$ independently represents a linear, branched or cyclic alkyl group having 1-20 carbon atoms; and hydrogen atoms of the alkyl group may be totally or partially substituted with a fluorine atom; and the alkyl group may contain an ether group or an ester group;

$R^{11}$ to $R^{14}$ independently represent any one of a hydrogen atom, a fluorine atom, a methyl group, and a trifluoromethyl group; and at least any one of $R^{11}$ to $R^{14}$ contain one or more fluorine atoms;

m is 1 or 2; and (c-1), (c-2), (c-3), (c-4) and (c-5) satisfy $0 \leq (c-1) \leq 0.9$, $0 \leq (c-2) \leq 0.9$, $0 \leq (c-3) \leq 0.9$, $0 \leq (c-4) \leq 0.9$, $0 \leq (c-5) \leq 0.9$, and $0 \leq (c-1)+(c-2)+(c-3)+(c-4)+(c-5) \leq 0.9$.

Examples of monomers for obtaining the repeating unit c that has a fluoroalkyl group are shown below. Incidentally, in the following formulae, $R^8$ and $R^{10}$ are the same as above.

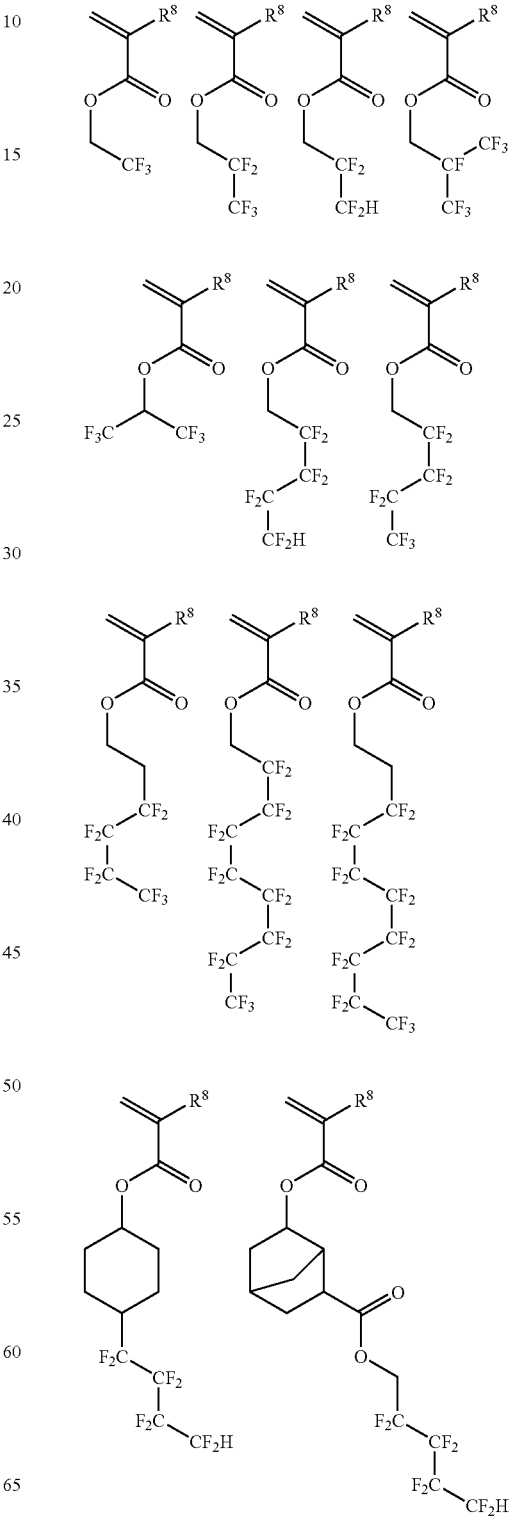

-continued
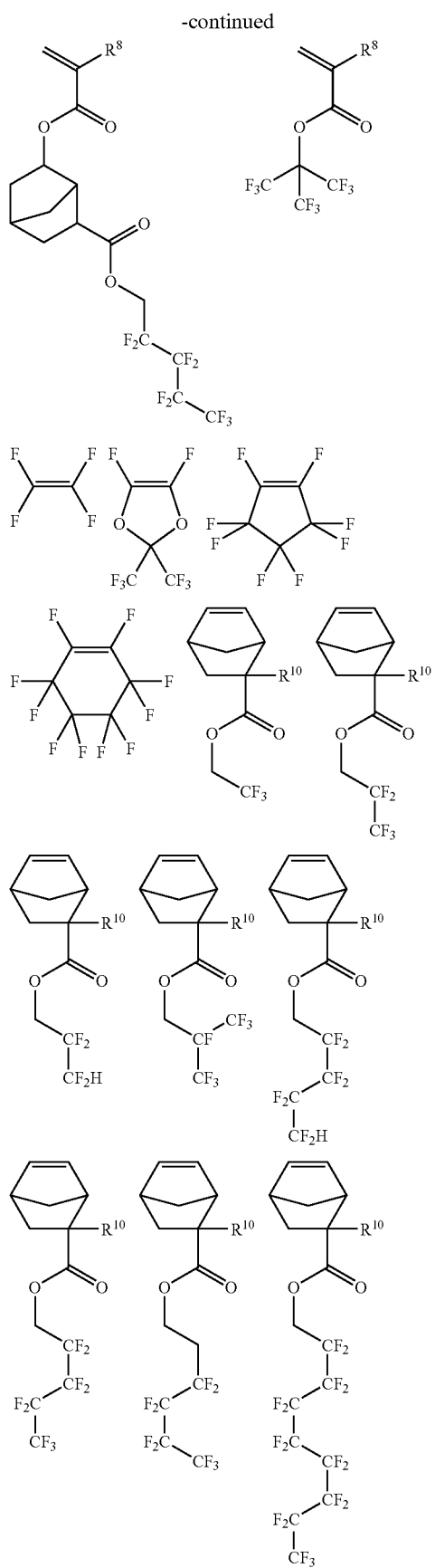
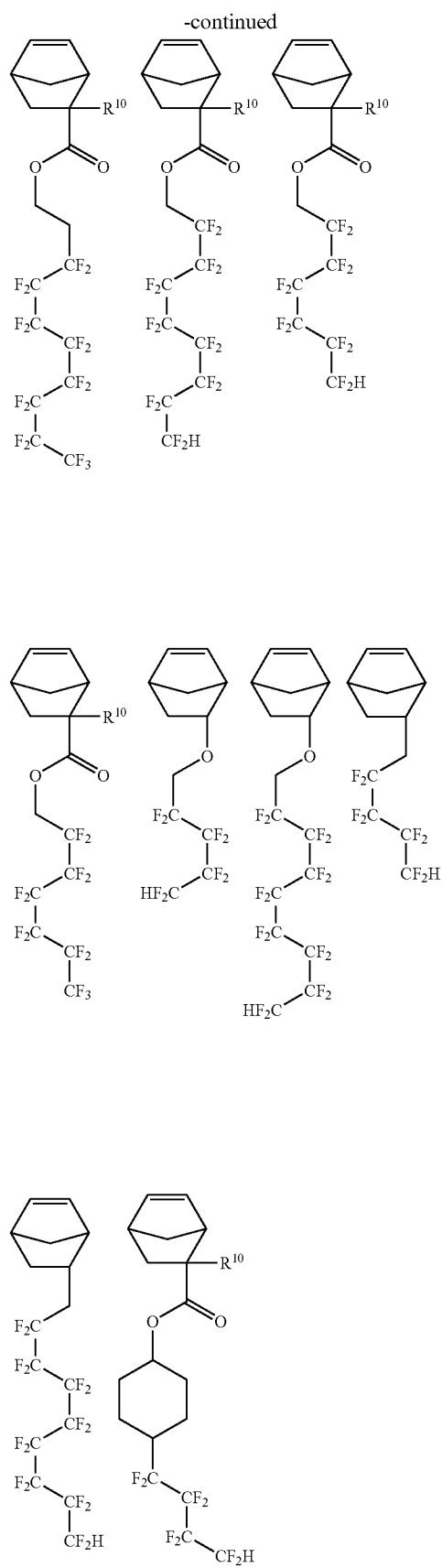

-continued
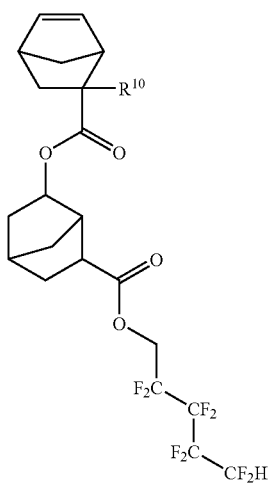
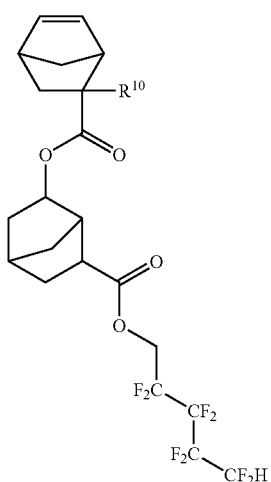
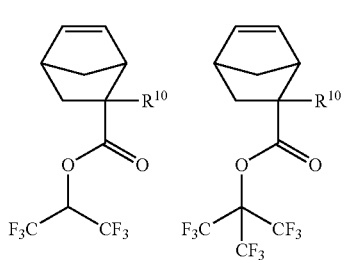
Examples of monomers for obtaining the repeating unit c that has an alkyl group are shown below. Incidentally, in the following formulae, $R^8$ and $R^{10}$ are the same as above.
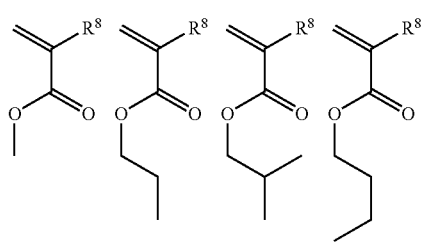
-continued
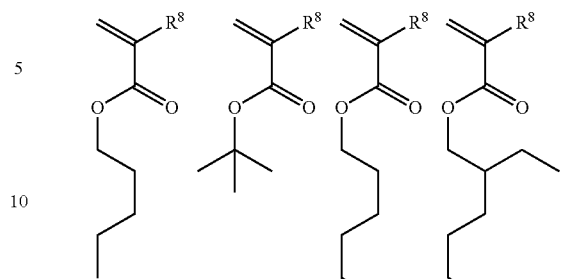
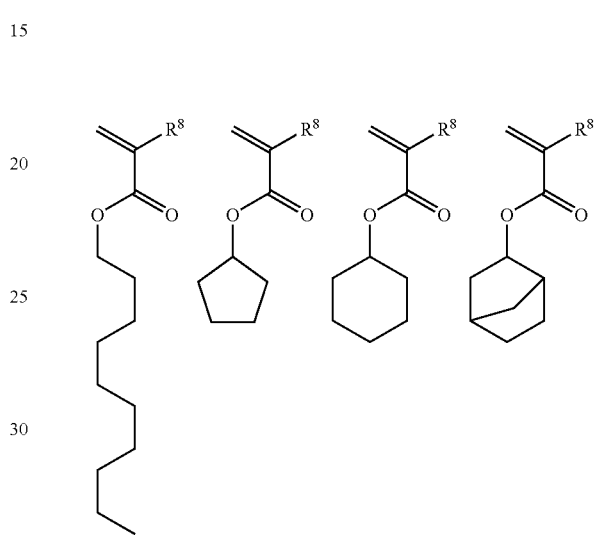
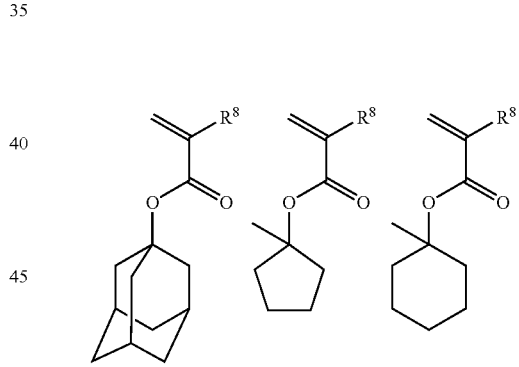
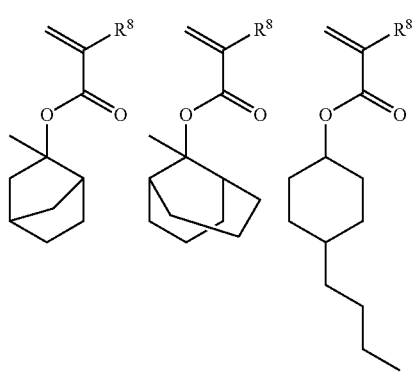

-continued
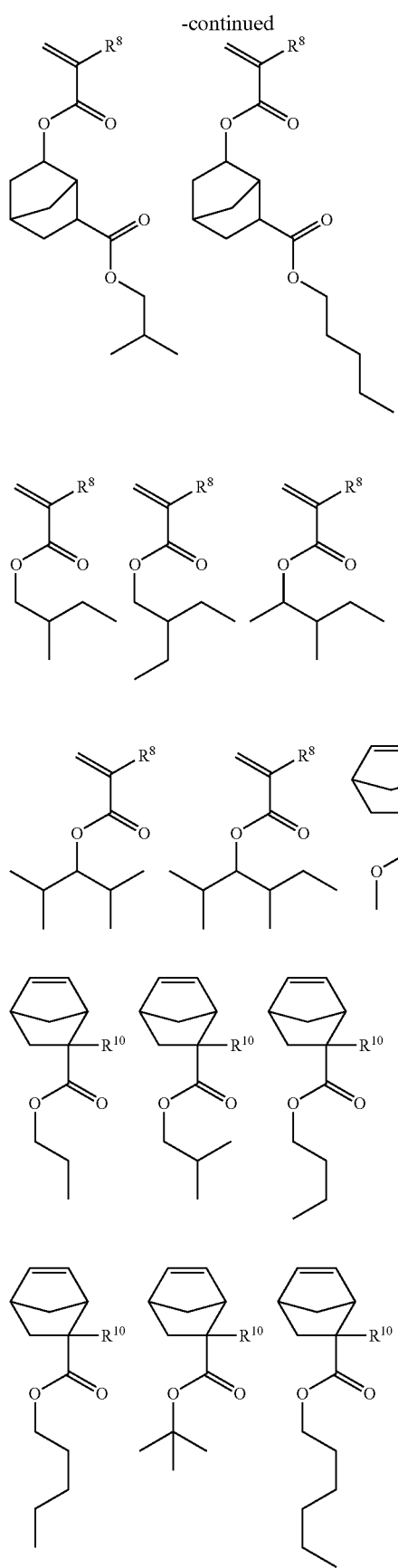
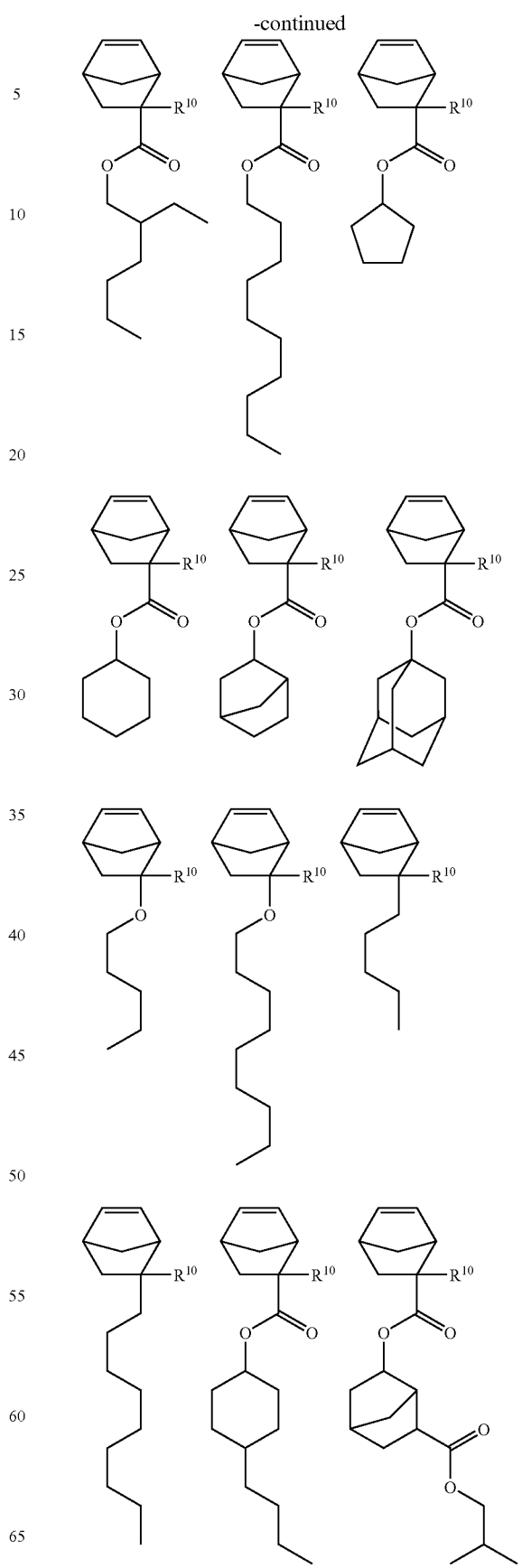

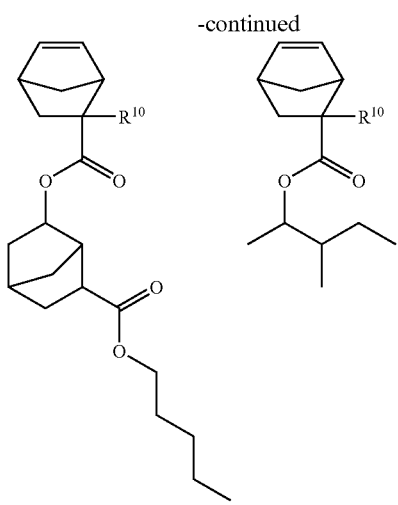
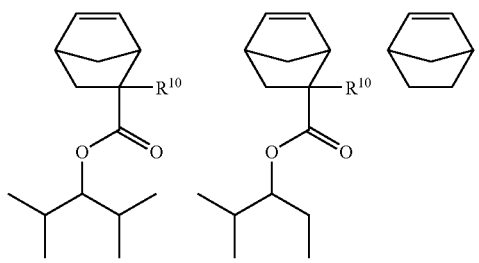
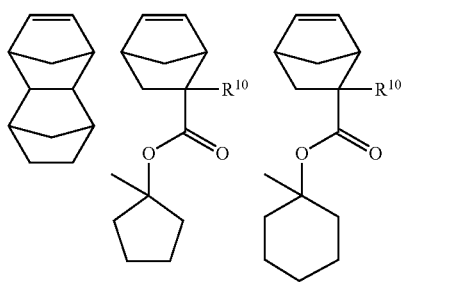
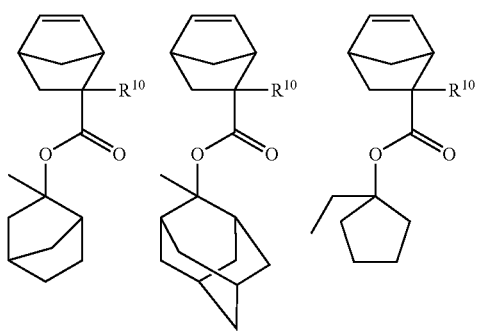
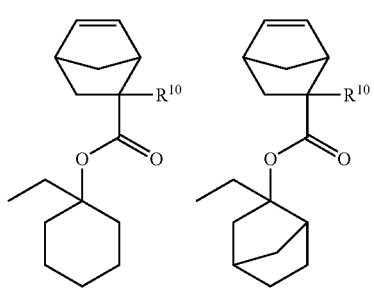
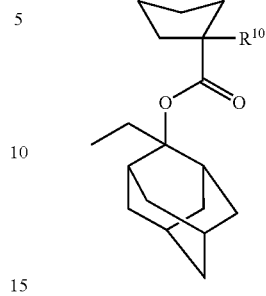
Furthermore, examples of monomers for obtaining the repeating unit c that has both an alkyl group and a fluoroalkyl group are shown below. Incidentally, in the following formulae, $R^8$ and $R^{10}$ are the same as above.
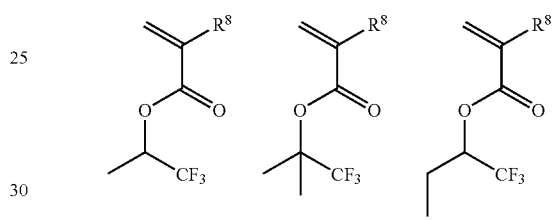
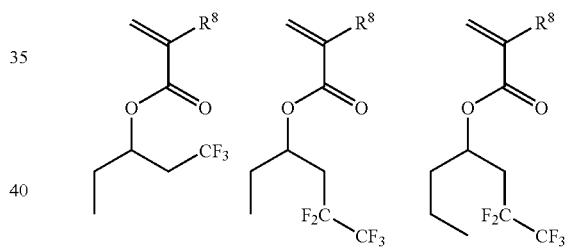
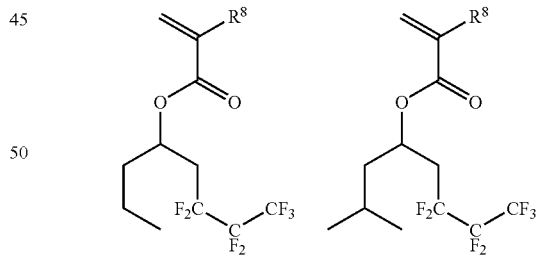
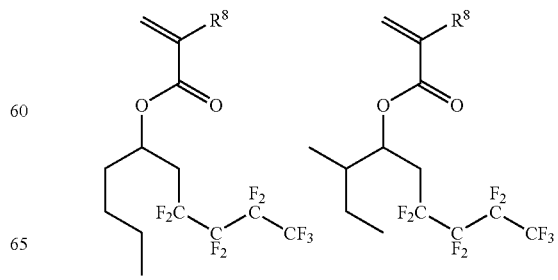

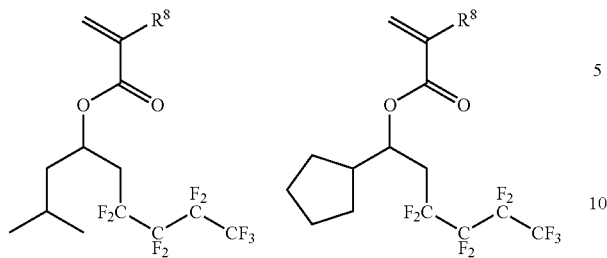
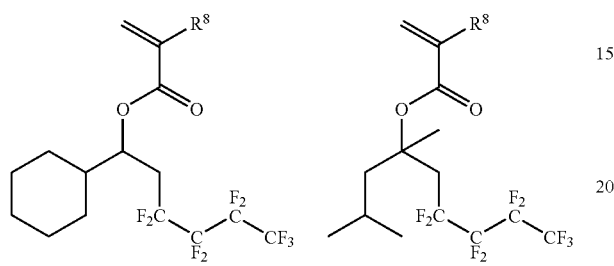
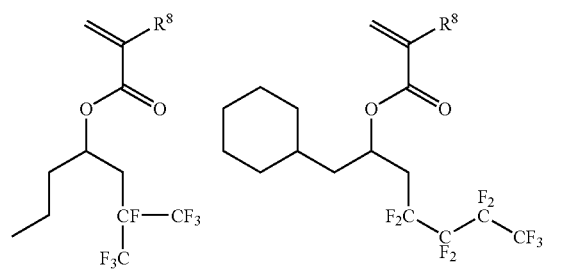
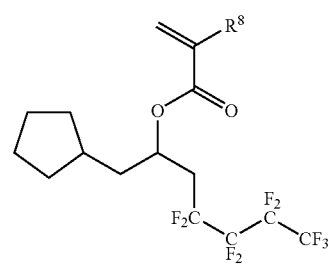
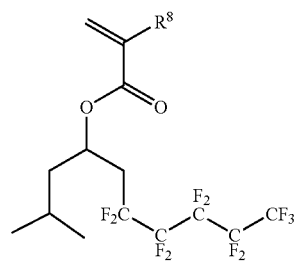
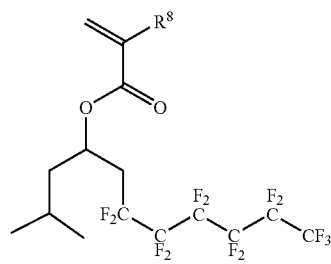
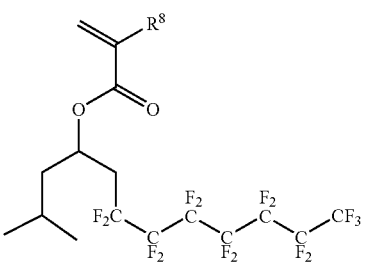
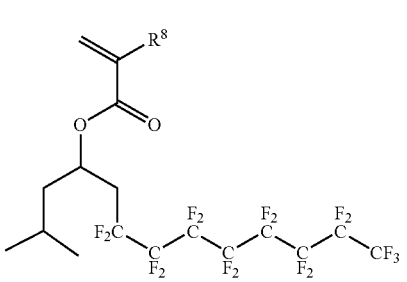
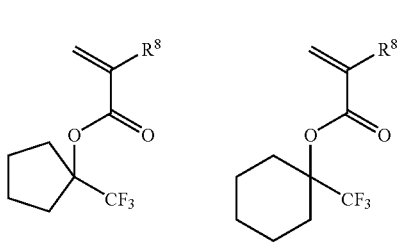
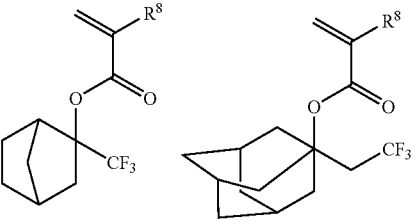
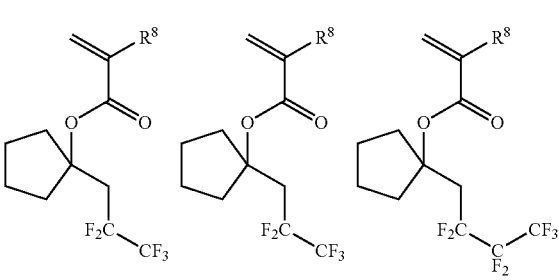
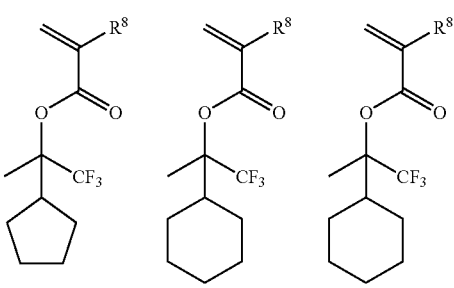

-continued
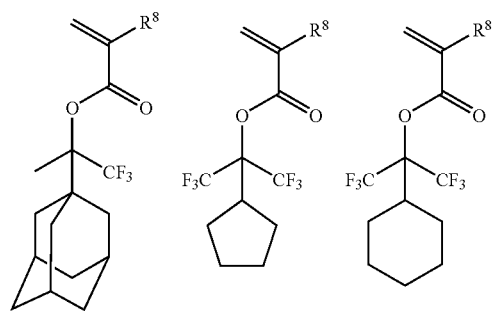
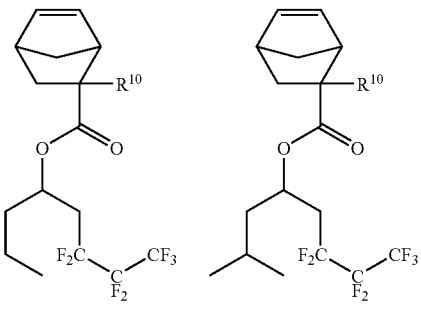
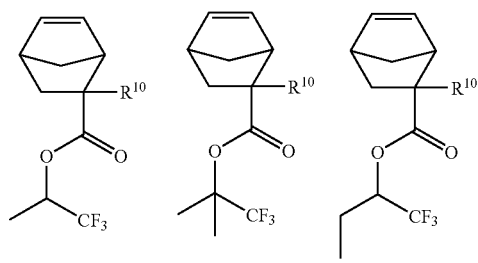
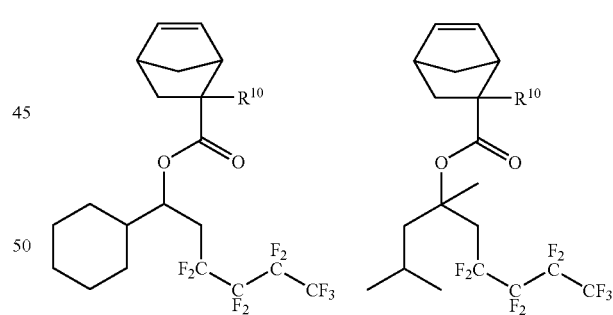
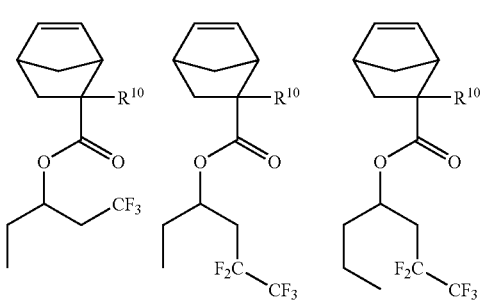
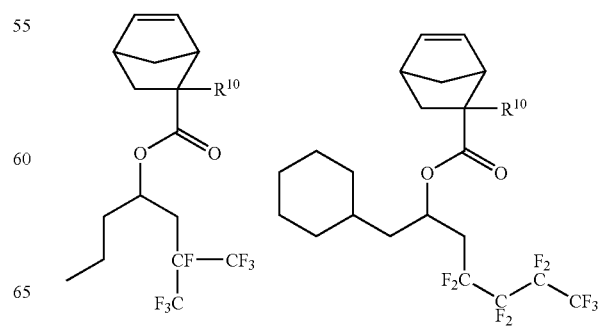

-continued
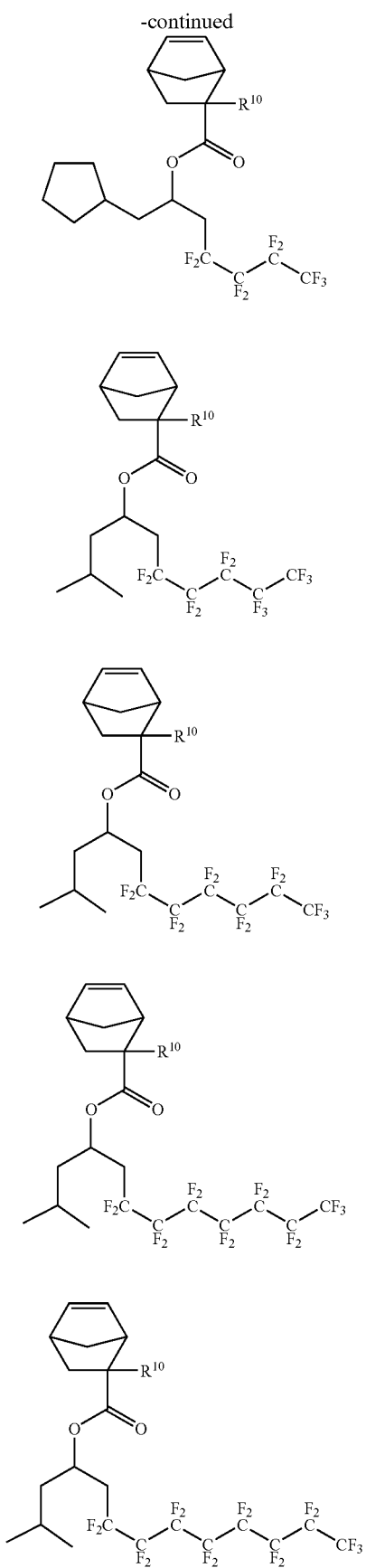
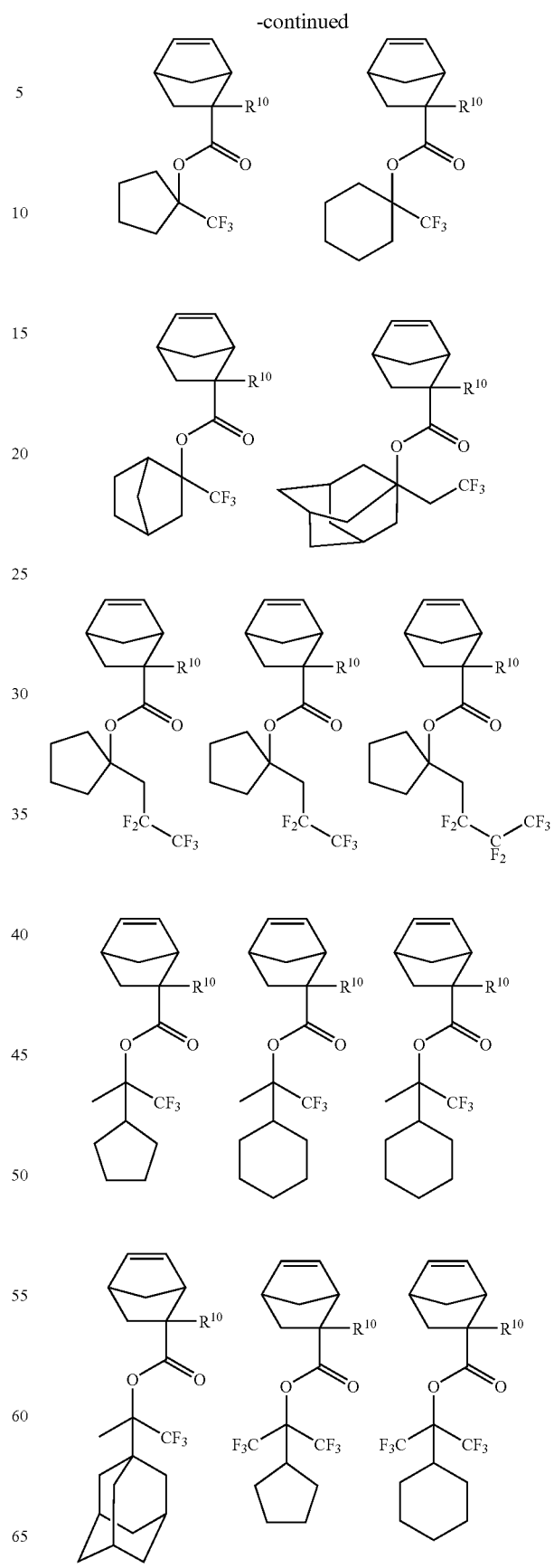

-continued

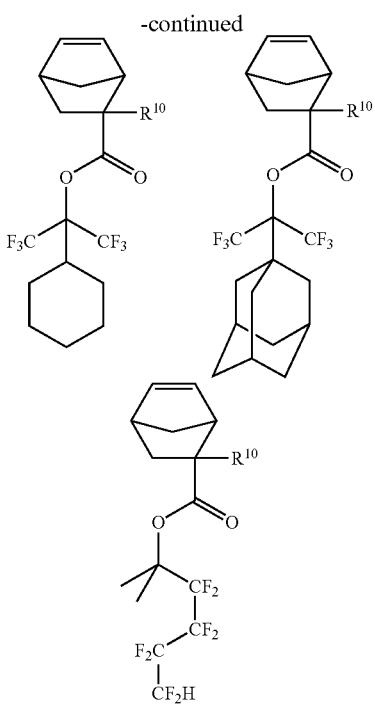

In particular, as a polymer contained in a resist protective film composition, copolymerizing in proper ratios the repeating unit (the repeating unit a) having an α-trifluoromethyl alcohol group which is an alkali soluble group; the repeating unit (the repeating unit b) having a carboxyl group; and a repeating unit (the repeating unit c) having one or more groups selected from alkyl groups and fluoroalkyl groups which are water-repellent groups makes it possible to balance between water repellency and alkali solublility of the protective film. For example, such a resist protective film can be formed having a rate of dissolution of 0.1 angstrom/s or less in water, and a rate of dissolution of 300 angstrom/s or higher in a developer composed of 2.38 mass % aqueous solution of tetramethylammonium hydroxide.

As a matter of course, the polymer having the repeating units may be obtained by copolymerizing the repeating units in proper copolymerization ratio, or polymers having the repeating units may be blended.

The ratios of the repeating units a, b, and c preferably satisfy the relationship $0 \leq a \leq 1.0$, $0 \leq b \leq 1.0$, $0 \leq a+b \leq 1.0$, $0 \leq c \leq 0.9$, and $a+b+c=1$.

Incidentally, $a+b+c=1$ denotes that, in a polymer including the repeating units a, b, and c, the total of the repeating units a, b, and c is 100 mole % to the total of all the repeating units.

The polymer that is included in the resist protective film composition according to the present invention desirably has a mass average molecular weight, which is measured with gel permeation chromatography (GPC) in relative to polystyrene, of 1,000 to 500,000, and preferably 2,000 to 30,000. When the mass average molecular weight is 1,000 or more, there is less possibility that the resist protective film composition mix with a photoresist film, and the resist protective film composition is less prone to dissolve in liquids such as water. On the other hand, when the mass average molecular weight is 500,000 or less, there is less possibility that film forming properties after spin-coated and the like have problems, and there is also less possibility that alkali solublility deteriorates.

An example of a method for synthesizing a polymer that is included in the resist protective film composition according to the present invention is as follows: to monomers having unsaturated bonds for obtaining the repeating units a, b, and c in an organic solvent is added a radical initiator and thermal polymerization is conducted to synthesize a polymer. Examples of the organic solvent used at the time of polymerization may include: toluene, benzene, tetrahydrofuran, diethyl ether, dioxane, methanol, ethanol, isopropanol, and the like. Examples of the polymerization initiator may include: 2,2'-azobisisobutyronitrile (AIBN), 2,2'-azo bis(2,4-dimethyl valeronitrile), dimethyl-2,2-azo bis(2-methyl propionate), benzoyl peroxide, lauroyl peroxide, and the like. Polymerization can be conducted preferably by heating to 50 to 80 degrees C. The reaction time may be 2 to 100 hours, preferably 5 to 20 hours. It is also possible that fluoroalcohol groups at monomer stage are substituted with acetyl groups or acetals, and after the monomers are polymerized, the substituted groups are changed into fluoroalcohol groups through an alkali treatment or an acid treatment.

In addition, it is preferable that the resist protective film composition according to the present invention further comprises a solvent. Using the polymer with dissolving the polymer in a solvent further enhances film forming properties. In this case, in view of film forming properties with spin-coating method or the like, it is preferable that the solvent is used so that the concentration of the polymer becomes 0.1 to 20 mass %, and particularly 0.5 to 10 mass %.

The solvent to be used is not particularly restricted, but solvents that do not dissolve photoresist films are preferable. Examples of solvents that dissolve photoresist films may include solvents used for resists: ketones such as cyclohexanone, methyl-2-n-amyl ketone; alcohols such as 3-methoxy butanol, 3-methyl-3-methoxy butanol, 1-methoxy-2-propanol, 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono tert-butyl ether acetate; and the like.

Examples of the solvents that are preferably used in the present invention because the solvents do not dissolve photoresist films are nonpolar solvents such as higher alcohols having 4 or more carbon atoms, toluene, xylene, anisole, hexane, cyclohexane, decane, and ether. In particular, higher alcohols having 4 or more carbon atoms or ethers having 8 to 12 carbon atoms are preferably used. Specifically, examples thereof may include: 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, diisopropyl ether, diisobutyl ether, diisopentyl ether, di-n-pentyl ether, methylcyclopentyl ether, methylcyclohexyl ether, di-n-butyl ether, di-sec-butyl ether, diisopentyl ether, di-sec-pentyl ether, di-t-amyl ether, and di-n-hexyl ether.

In addition, fluorinated solvents may also be preferably used in the present invention because fluorinated solvents do not dissolve photoresist films.

Examples of such fluorinated solvents may include: 2-fluoroanisole, 3-fluoroanisole, 4-fluoroanisole, 2,3-difluoroanisole, 2,4-difluoroanisole, 2,5-difluoroanisole, 5,8-difluoro-1,4-benzodioxane, 2,3-difluorobenzyl alcohol, 1,3-difluoro-2-propanol, 2',4'-difluoropropiophenon, 2,4-difluorotoluene, trifluoroacetaldehyde ethylhemiacetal, trifluoroacetamide, trifluoroethanol, 2,2,2-trifluoroethyl butyrate, ethylheptafluoro butyrate, ethylheptafluoro butyl acetate, ethylhexafluoro glutarylmethyl, ethyl-3-hydroxy-4,4,4-trifluoro butyrate, ethyl-2-methyl-4,4,4-trifluoro acetoacetate, ethyl pentafluoro benzoate, ethyl pentafluoro propionate, ethyl pentafluoro propionyl acetate, ethyl perfluoro octanoate, ethyl-4,4,4-trifluoro acetoacetate, ethyl-4,4,4-trifluoro butyrate, ethyl-4,4,4-trifluoro crotonate, ethyltrifluoro sulfonate, ethyl-3-(trifluoromethyl)butyrate, ethyltrifluoro pyruvate, S-ethyl trifluoro acetate, fluorocyclohexane, 2,2,3,3,4,4,4-heptafluoro-1-butanol, 1,1,1,2,2,3,3-heptafluoro-7,7-dimethyl-4,6-octanedione, 1,1,1,3,5,5,5-heptafluoropentane-2,4-dione, 3,3,4,4,5,5,5-heptafluoro-2-pentanol, 3,3,4,4,5,5,5-heptafluoro-2-pentanone, isopropyl 4,4,4-trifluoro acetoacetate, methylperfluoro denanoate, methylperfluoro(2-methyl-3-oxahexanoate), methylperfluoro nonanoate, methylperfluoro octanoate, methyl-2,3,3,3-tetrafluoropropionate, methyltrifluoro acetoacetate, 1,1,1,2,2,6,6,6-octafluoro-2,4-hexanedione, 2,2,3,3,4,4,5,5-octafluoro-1-pentanol, 1H,1H,2H,2H-perfluoro-1-decanol, perfluoro(2,5-dimethyl-3,6-dioxaneanionic) acid methyl ester, 2H-perfluoro-5-methyl-3,6-dioxanonane, 1H,1H,2H,3H,3H-perfluorononane-1,2-diol, 1H,1H,9H-perfluoro-1-nonanol, 1H,1H-perfluoro octanol, 1H,1H,2H,2H-perfluoro octanol, 2H-perfluoro-5,8,11,14-tetramethyl-3,6,9,12,15-pentaoxaoctadecane, perfluoro tributylamine, perfluoro trihexylamine, methyl perfluoro-2,5,8-trimethyl-3,6,9-trioxadodecanoate, perfluoro tripentylamine, perfluoro tripropylamine, 1H,1H,2H,3H,3H-perfluoroundecane-1,2-diol, trifluoro butanol 1,1,1-trifluoro-5-methyl-2,4-hexanedione, 1,1,1-trifluoro-2-propanol, 3,3,3-trifluoro-1-propanol, 1,1,1-trifluoro-2-propylacetate, perfluoro butyl tetrahydrofuran, perfluoro(butyl tetrahydrofuran), perfluoro decalin, perfluoro(1,2-dimethylcyclohexane), perfluoro(1,3-dimethylcyclohexane), propylene glycol trifluoromethyl ether acetate, propylene glycol methyl ether trifluoromethyl acetate, butyl trifluoromethyl acetate, methyl 3-trifluoromethoxy propionate, perfluoro cyclohexanone, propylene glycol trifluoromethyl ether, butyl trifluoro acetate, 1,1,1-trifluoro-5,5-dimethyl-2,4-hexanedione, 1,1,1,3,3,3-hexafluoro-2-propanol, 1,1,1,3,3,3-hexafluoro-2-methyl-2-propanol, 2,2,3,4,4,4-hexafluoro-1-butanol, 2-trifluoromethyl-2-propanol, 2,2,3,3-tetrafluoro-1-propanol, 3,3,3-trifluoro-1-propanol, 4,4,4-trifluoro-1-butanol, and the like. These solvents may be used alone or in admixture. However, the fluorinated solvents are not restricted thereto.

Next, a patterning process using the resist protective film composition according to the present invention will be explained.

The patterning process according to the present invention comprises: at least, a step of forming a photoresist film on a substrate; a step of forming a resist protective film on the photoresist film by using the resist protective film composition according to the present invention; a step of exposing the substrate; and a step of developing the substrate with a developer.

First, a photoresist film is formed on a substrate.

Examples of a method for forming the film are spin-coating method and the like. When the photoresist film is formed, for the purpose of reducing the amount of dispensing a photoresist film composition in spin-coating, the photoresist film composition is preferably dispensed and spin-coated on a substrate which is wet in advance with a photoresist film solvent or a solution which is combined with a photoresist film solvent (For example, see Japanese Publication of Unexamined Application No. 09-246173). This improves spreading of a photoresist film composition solution over a substrate, thereby reducing the amount of dispensing the photoresist film composition.

The type of the photoresist film composition is not particularly restricted. A positive type or a negative type is usable, a normal hydrocarbon monolayer resist composition is also usable, and a bilayer resist composition containing silicon atoms or the like is also usable.

Preferably used photoresist film compositions for KrF exposure contain as a base polymer polyhydroxystyrene or polyhydroxystyrene-(meth)acrylate copolymer in which hydrogen atoms of hydroxy groups or carboxyl groups may be totally or partially substituted with an acid labile group.

In addition, photoresist film compositions for ArF exposure are required to have non-aromatic structures as a base resin. Specifically, preferred examples of the photoresist film compositions contain one or more polymers selected from polyacrylic acid and derivatives thereof; a terpolymer or a quaterpolymer of norbornene derivatives—maleic anhydride alternating polymer and polyacrylic acid or derivatives thereof; a terpolymer or a quaterpolymer of tetracyclo dodecene derivatives—maleic anhydride alternating polymer and polyacrylic acid or derivatives thereof; a terpolymer or a quaterpolymer of norbornene derivatives—maleimide alternating polymer and polyacrylic acid or derivatives thereof; a terpolymer or a quaterpolymer of tetracyclo dodecene derivatives—maleimide alternating polymer and polyacrylic acid or derivatives thereof. Or preferred examples of the photoresist film compositions contain one or more polymers selected from polynorbornene and ring opening metathesis polymers.

Second, a resist protective film is formed on the photoresist film by using the resist protective film composition according to the present invention.

Examples of a method for forming the film are spin-coating method and the like. In spin-coating the resist protective film composition, use of a process similar to that is used in forming the photoresist film is possible, and the surface of the photoresist film may be wet with a solvent prior to application of the resist protective film composition to the surface of the photoresist film. The thickness of the resist protective film to be formed is preferably in the range of 10 to 500 nm. As a method to wet the surface of the photoresist film, spin-coating method or vapor prime method may be used, but spin-coating method is more preferably used. A solvent that is used for wetting the photoresist film is more preferably selected from higher alcohols, ethers, and fluorinated solvents, which do not dissolve photoresist films.

Incidentally, in the case of conducting exposure with liquid immersion lithography as described later, for the purpose of preventing water from reaching the back surface of a substrate or preventing leaching from a substrate, what are important are the presence or absence of cleaning of the edge or the back surface of the substrate and the method of the cleaning. Then, for example, the resist protective film is formed with spin-coating, and then the film is preferably baked in the range of 40 to 130 degrees C. for 10 to 300 seconds to evaporate a solvent. By the way, although edge cleaning is conducted at the time of spin-coating in the case of photoresist films or dry exposure, conducting the edge cleaning is not preferable in liquid immersion exposure because bringing water into contact with the surface of a substrate having high hydrophilicity can result in remaining of the water on the edge portion of the surface of the substrate. Therefore, there may be employed a method of not conducting the edge cleaning at the time of spin-coating the resist protective film.

Next, exposure is conducted.

As a method of conducting exposure, for example, there is the dry exposure in which a gap between a projection lens and a substrate is a gas such as air or nitrogen.

However, in the present invention, the step of exposing a substrate is preferably conducted by liquid immersion lithography in which a gap between a projection lens and a substrate is filled with liquid. As the liquid with which the gap between a projection lens and a substrate is filled, water is preferably used. In addition, exposure is preferably conducted by using a light source having an exposure wavelength in the range of 180 to 250 nm, for example, KrF excimer laser (248 nm) or ArF excimer laser (193 nm).

Next, development is conducted.

In the step of developing a substrate, for example, development is conducted with an alkaline developer for 10 to 300 seconds. As the alkaline developer, generally and widely used is 2.38 mass % aqueous solution of tetramethylammonium hydroxide.

In the step of developing a substrate is preferably conducted by developing the substrate with an alkaline developer to form a resist pattern on the photoresist film and simultaneously to strip the resist protective film on the photoresist film. This makes it possible to strip the resist protective film more easily without additional installation of system for stripping the resist protective film to conventional equipment.

In addition, after the exposure and before the development, post exposure baking (PEB) is preferably conducted. In the case of liquid immersion lithography using water, before PEB is conducted, water can remain on the resist protective film. When PEB is conducted in the state that water remains on the resist protective film, water passes through the resist protective film and evacuates acid in the photoresist film, whereby there are possibilities that excellent patterns cannot be formed. Then, in order to completely remove water on the resist protective film prior to conducting PEB, water on the resist protective film is preferably dried or recovered by spin-drying prior to PEB, purging the surface of the resist protective film with dry air or nitrogen, optimizing the shape of a nozzle for recovering water on a stage after exposure and a water recovering process, and so on. In this case, enhancing water repellency of the resist protective film makes it possible to recover water from the surface of the film excellently.

Incidentally, in addition to the above processes, other various processes, such as an etching process, a resist removing process or a cleaning process may be naturally conducted.

EXAMPLE

Hereinafter, the present invention will be explained further in detail with reference to Examples, Comparative Examples and so on. However, the present invention is not limited by these descriptions.

Incidentally, in Examples, GPC denotes gel permeation chromatography, and mass average molecular weight (Mw) and number average molecular weight (Mn) in relative to polystyrene were measured with GPC.

Hereafter, there are shown amine compounds that were added to the resist protective film compositions in Examples and Comparative Examples that will be described later.

The added amine compounds were tri-n-octylamine, tri-n-dodecylamine; the following F-amine compound 1, F-amine compound 2, F-amine compound 3, F-amine compound 4, and F-amine compound 5; trifluoromethane sulfonyldecylamine, trifluoromethane sulfonyl-1-adamantylamine; and the following amine compound 1, amine compound 2, amine compound 3, amine compound 4, amine compound 5, and amine compound 6.

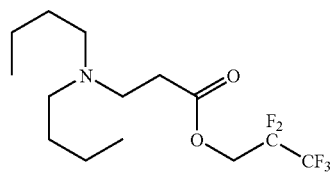

F-amine compound 1

F-amine compound 2

F-amine compound 3

F-amine compound 4

F-amine compound 5 amine compound 1 amine compound 2

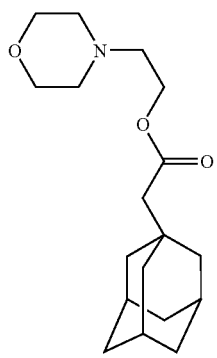

amine compound 3

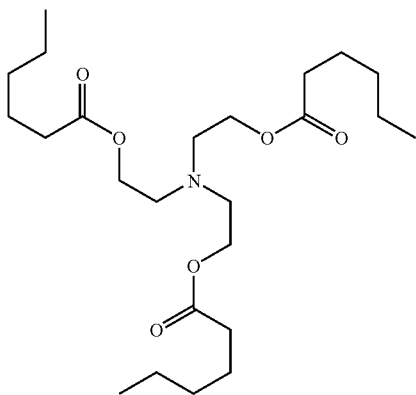

amine compound 4

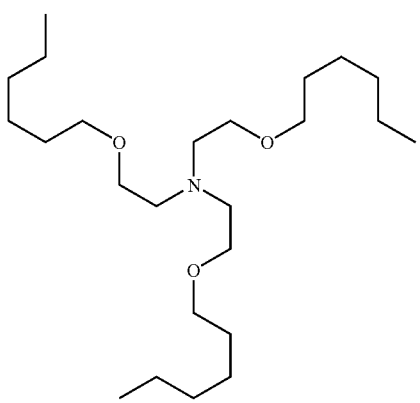

amine compound 5

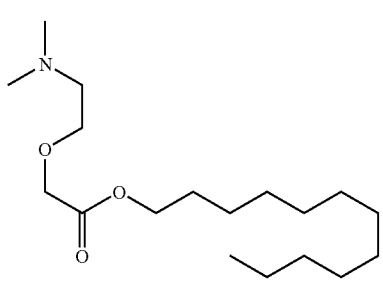

amine compound 6

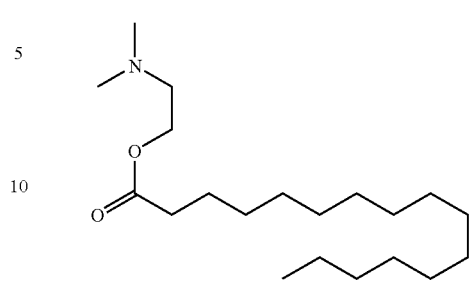

Among the amine compounds, F-amine compounds 1 to 5 were synthesized according to the following synthetic methods.

Synthetic Example 1

Synthesis of F-amine Compound 1

To 20.4 g of 2,2,3,3,3-pentafluoropropyl acrylate with being cooled in ice and stirred was added dropwise 12.3 g of di-n-butylamine. After stirred for 1 hour at room temperature, the reaction mixture was purified by direct distillation to obtain F-amine compound 1.

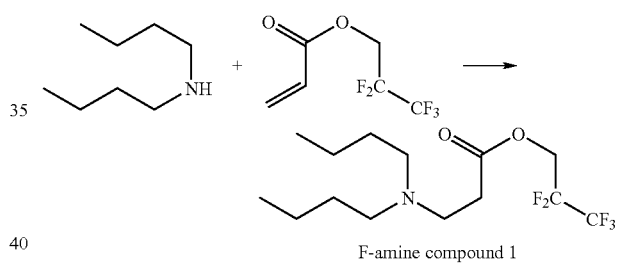

F-amine compound 1

Synthetic Example 2

Synthesis of F-amine Compound 2

To 28.6 g of 2,2,3,3,4,4,5,5-octafluoropentyl acrylate with being cooled in ice and stirred was added dropwise 8.3 g of piperidine. After stirred for 1 hour at room temperature, the reaction mixture was purified by direct distillation to obtain F-amine compound 2.

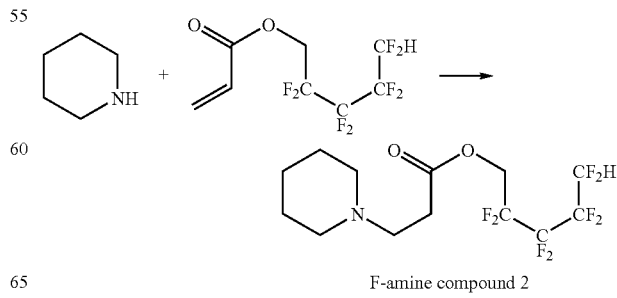

F-amine compound 2

Synthetic Example 3

Synthesis of F-amine Compound 3

To 46.2 g of 2,2,2-trifluoroethyl acrylate with being cooled in ice and stirred was added dropwise 2.2 g of ammonia. After stirred for 1 hour at room temperature, the reaction mixture was purified by direct distillation to obtain F-amine compound 3.

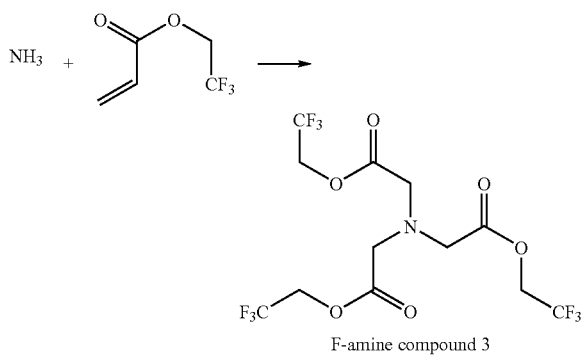

F-amine compound 3

Synthetic Example 4

Synthesis of F-amine Compound 4

To a mixture of 110 g of 1-(2-chloroethyl)piperidine and 500 g of tetrahydrofuran was added 120 g of 2,2,3,3,4,4,5,5-octafluoro-1-pentanol at 0 degrees C. The temperature of this mixture was increased up to 20 degrees C. with spending 10 hours, and then water was added thereto to quench the reaction. To this mixture was added ethyl acetate, and the mixture was separated. Thus obtained organic layer washed with water, and then concentrated under a reduced pressure. This solution was purified by reduced-pressure distillation to obtain F-amine compound 4.

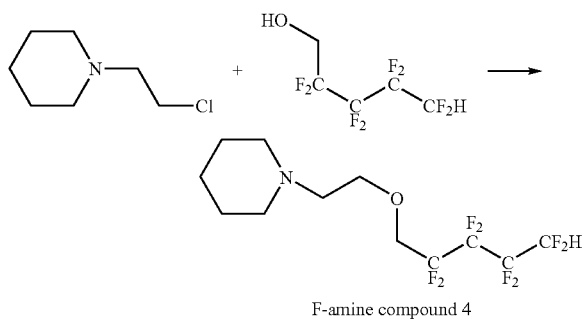

F-amine compound 4

Synthetic Example 5

Synthesis of F-amine Compound 5

To 38.6 g of 1-isopropyl-2,2,3,3,4,4,4-heptafluorobutyl acrylate with being cooled in ice and stirred was added dropwise 8.3 g of piperidine. After stirred for 1 hour at room temperature, the reaction mixture was purified by direct distillation to obtain F-amine compound 5.

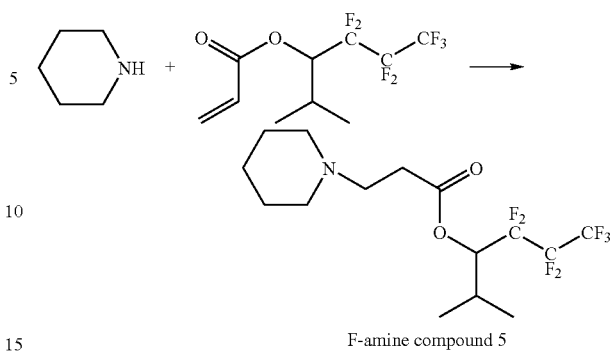

F-amine compound 5

Among the amine compounds, amine compounds 1 to 6 were synthesized according to the following synthetic methods.

Synthetic Example 6

Synthesis of Amine Compound 1

To a mixture of 131 g of 1-(2-hydroxyethyl)piperidine, 106 g of triethylamine and 500 g of tetrahydrofuran was added 320 g of nonadecanoylchloride at 0 degrees C. The temperature of this mixture was increased up to 20 degrees C. with spending 10 hours, and then water was added thereto to quench the reaction. To the mixture was added ethyl acetate, and the mixture was separated. Thus-obtained organic layer washed with water, and then concentrated under a reduced pressure. This solution was purified by reduced-pressure distillation to obtain amine compound 1.

Synthetic Example 7

Synthesis of Amine Compound 2

To a mixture of 131 g of 1-(2-hydroxyethyl)piperidine, 106 g of triethylamine and 500 g of tetrahydrofuran was added 320 g of 1-adamantaneacetylchloride at 0 degrees C. The temperature of this mixture was increased up to 20 degrees C. with spending 10 hours, and then water was added thereto to quench the reaction. To this mixture was added ethyl acetate, and the mixture was separated. Thus-obtained organic layer washed with water, and then concentrated under reduced pressure. The solution was purified by reduced-pressure distillation to obtain amine compound 2.

Synthetic Example 8

Synthesis of Amine Compound 3

To a mixture of 149 g of triethanolamine, 106 g of triethylamine and 500 g of tetrahydrofuran was added 410 g of hexanoylchloride at 0 degrees C. The temperature of this mixture was increased up to 20 degrees C. with spending 10 hours, and then water was added thereto to quench the reaction. To the mixture was added ethyl acetate, and the mixture was separated. Thus-obtained organic layer was washed with water, and then concentrated under reduced pressure. This solution was purified by reduced-pressure distillation to obtain amine compound 3.

Synthetic Example 9

Synthesis of Amine Compound 4

To a mixture of 149 g of triethanolamine, 106 g of triethylamine and 500 g of tetrahydrofuran was added 640 g of hexaneiodide at 0 degrees C. The temperature of this mixture was increased up to 20 degrees C. with spending 10 hours, and then water was added thereto to quench the reaction. To this mixture was added ethyl acetate, and the mixture was separated. Thus-obtained organic layer was washed with water, and then concentrated under reduced pressure. This solution was purified by reduced-pressure distillation to obtain amine compound 4.

Synthetic Example 10

Synthesis of Amine Compound 5

To a mixture of 89 g of N,N-dimethylethanolamine, 106 g of triethylamine and 500 g of tetrahydrofuran was added 270 g of chloroacetic acid dodecyl ether at 0 degrees C. The temperature of this mixture was increased up to 20 degrees C. with spending 10 hours, and then water was added thereto to quench the reaction. To this mixture was added ethyl acetate, and the mixture was separated. Thus-obtained organic layer washed with water, and then concentrated under reduced pressure. This mixture was purified by reduced-pressure distillation to obtain amine compound 5.

Synthetic Example 11

Synthesis of Amine Compound 6

To a mixture of 89 g of N,N-dimethylethanolamine, 106 g of triethylamine and 500 g of tetrahydrofuran was added 280 g of palmitoylchloride at 0 degrees C. The temperature of this mixture was increased up to 20 degrees C. with spending 10 hours, and then water was added thereto to quench the reaction. To the mixture was added ethyl acetate, and the mixture was separated. Thus-obtained organic layer washed with water, and then concentrated under reduced pressure. This mixture was purified by reduced-pressure distillation to obtain amine compound 6.

Furthermore, the following polymers 1 to 7 were synthesized by radical polymerization according to standard procedures.

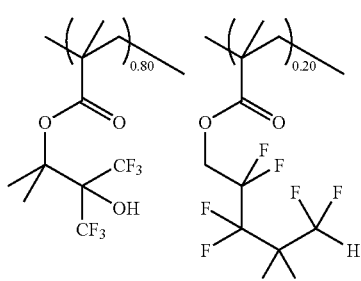

polymer 1
Mw8,800
Mw/Mn1.81

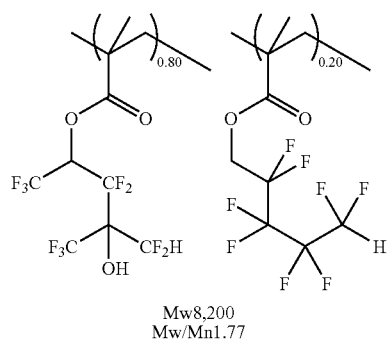

polymer 2
Mw8,200
Mw/Mn1.77

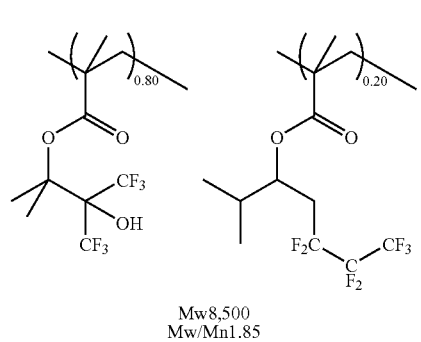

polymer 3
Mw8,500
Mw/Mn1.85

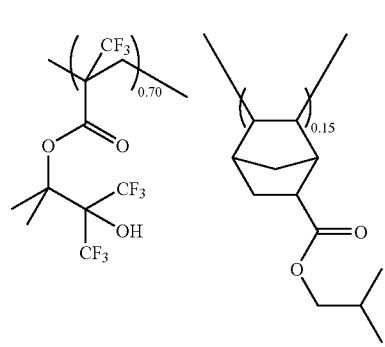

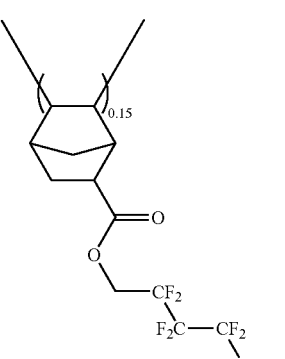

polymer 4
Mw9,200
Mw/Mn1.49

-continued

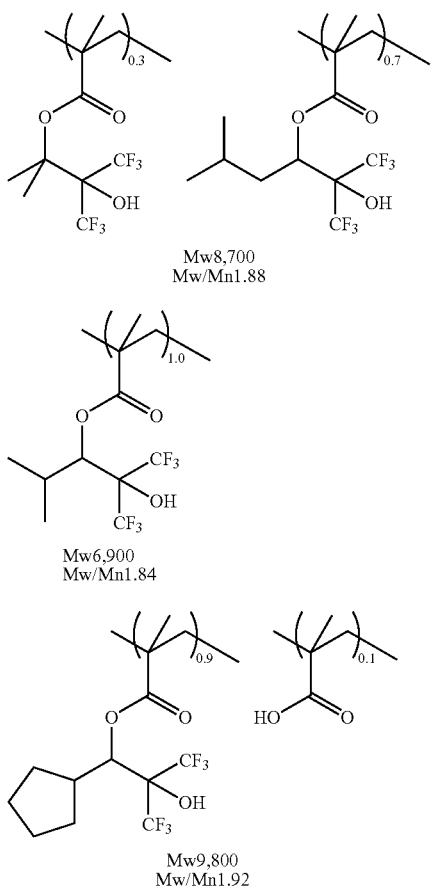

polymer 5
Mw8,700
Mw/Mn1.88 polymer 6
Mw6,900
Mw/Mn1.84 polymer 7
Mw9,800
Mw/Mn1.92

EXAMPLES, COMPARATIVE EXAMPLES

Polymers, amine compounds, solvents for resist protective film compositions were mixed according to the composition shown in Table 1 and 2, and filtered through a 0.2 micron high density polyethylene filter to prepare solutions of resist protective film compositions (TC-1 to 28, Comparative TC-1 to 3).

TABLE 1

| Resist Protective Film | Polymers for Protective Film | Amine Compound | Solvent |
|---|---|---|---|
| TC-1 | Polymer 1 (100) | tri-n-octylamine (0.2) | isoamylether (2600) |
| TC-2 | Polymer 1 (100) | tri-n-dodecylamine (0.2) | isoamylether (2600) |
| TC-3 | Polymer 1 (100) | F-amine compound 1 (0.2) | isoamylether (2600) |
| TC-4 | Polymer 1 (100) | F-amine compound 2 (0.2) | isoamylether (2600) |
| TC-5 | Polymer 1 (100) | F-amine compound 3 (0.2) | isoamylether (2600) |
| TC-6 | Polymer 1 (100) | F-amine compound 4 (0.2) | isoamylether (2600) |
| TC-7 | Polymer 1 (100) | F-amine compound 5 (0.2) | isoamylether (2600) |
| TC-8 | Polymer 2 (100) | F-amine compound 2 (0.2) | isoamylether (2600) |

TABLE 1-continued

| Resist Protective Film | Polymers for Protective Film | Amine Compound | Solvent |
|---|---|---|---|
| TC-9 | Polymer 3 (100) | F-amine compound 2 (0.2) | isoamylether (2600) |
| TC-10 | Polymer 4 (100) | F-amine compound 2 (0.2) | isoamylether (2600) |
| TC-11 | Polymer 1 (100) | F-amine compound 2 (0.2) | isoamylether (1800) isobutyl alcohol (1800) |
| TC-12 | Polymer 1 (100) | F-amine compound 2 (0.2) | isoamylether (2000) 2,2,2-trifluoroethyl butanate (600) |
| TC-13 | Polymer 1 (100) | F-amine compound 2 (0.1) | isoamylether (2600) |
| TC-14 | Polymer 1 (100) | F-amine compound 2 (0.3) | isoamylether (2600) |
| TC-15 | Polymer 1 (100) | trifluoromethane sulfonyl decylamine (0.5) | isoamylether (2600) |
| TC-16 | Polymer 1 (100) | trifluoromethane sulfonyl-1-adamantylamine (0.5) | isoamylether (2600) |

TABLE 2

| Resist Protective Film | Polymers for Protective Film | Amine Compound | Solvent |
|---|---|---|---|
| TC-17 | Polymer 1 (100) | amine compound 1 (0.15) | isoamylether (2400) 2-methyl-1-butanol (240) |
| TC-18 | Polymer 1 (100) | amine compound 2 (0.15) | isoamylether (2400) 2-methyl-1-butanol (240) |
| TC-19 | Polymer 1 (100) | amine compound 3 (0.15) | isoamylether (2400) 2-methyl-1-butanol (240) |
| TC-20 | Polymer 1 (100) | amine compound 4 (0.15) | isoamylether (2400) 2-methyl-1-butanol (240) |
| TC-21 | Polymer 1 (100) | amine compound 5 (0.15) | isoamylether (2400) 2-methyl-1-butanol (240) |
| TC-22 | Polymer 1 (100) | amine compound 6 (0.15) | isoamylether (2400) 2-methyl-1-butanol (240) |
| TC-23 | Polymer 5 (100) | amine compound 1 (0.15) | isoamylether (2400) 2-methyl-1-butanol (240) |
| TC-24 | Polymer 6 (100) | amine compound 1 (0.15) | isoamylether (2400) 2-methyl-1-butanol (240) |
| TC-25 | Polymer 5 (100) | amine compound 1 (0.15) | isoamylether (1500) 3-methyl-1-butanol (1500) |
| TC-26 | Polymer 5 (100) | amine compound 1 (0.15) | isoamylether (1500) 4-methyl-2-pentanol (1500) |

TABLE 2-continued

| Resist Protective Film | Polymers for Protective Film | Amine Compound | Solvent |
|---|---|---|---|
| TC-27 | Polymer 5 (100) | amine compound 1 (0.15) | isoamylether (1500) isobutyl alcohol (1500) |
| TC-28 | Polymer 7 (100) | amine compound 1 (0.15) | isoamylether (2400) 2-methyl-1-butanol (240) |
| Comparative TC-1 | Polymer 1 (100) | — | isoamylether (2600) |
| Comparative TC-2 | Polymer 1 (100) | — | isoamylether (2600) |
| Comparative TC-3 | Polymer 1 (100) | — | isoamylether (2600) |

The solutions of resist protective film compositions were spin-coated on silicon substrates, and baked at 100 degrees C. for 60 seconds to form resist protective films each having a thickness of 50 nm (TC-1 to 28, Comparative TC-1 to 3). The refractive index of each protective film at a wavelength of 193 nm was measured with a spectroscopic ellipsometer manufactured by J.A. Woollam Co., Inc. The results are shown in Table 3.

TABLE 3

| Resist Protective Film | Refractive Index at 193 nm |
|---|---|
| TC-1 | 1.55 |
| TC-2 | 1.55 |
| TC-3 | 1.55 |
| TC-4 | 1.55 |
| TC-5 | 1.55 |
| TC-6 | 1.54 |
| TC-7 | 1.54 |
| TC-8 | 1.54 |
| TC-9 | 1.56 |
| TC-10 | 1.57 |
| TC-11 | 1.55 |
| TC-12 | 1.55 |
| TC-13 | 1.55 |
| TC-14 | 1.55 |
| TC-15 | 1.55 |
| TC-16 | 1.55 |
| TC-17 | 1.55 |
| TC-18 | 1.55 |
| TC-19 | 1.55 |
| TC-20 | 1.55 |
| TC-21 | 1.55 |
| TC-22 | 1.55 |
| TC-23 | 1.57 |
| TC-24 | 1.58 |
| TC-25 | 1.57 |
| TC-26 | 1.58 |
| TC-27 | 1.59 |
| TC-28 | 1.59 |
| Comparative TC-1 | 1.55 |
| Comparative TC-2 | 1.55 |
| Comparative TC-3 | 1.55 |

Next, silicon substrates on which the resist protective films were formed according to the above method were rinsed with pure water for 5 minutes, and change of the thickness of each film before and after the rinse was observed. The results are shown in Table 4.

TABLE 4

| Resist Protective Film | Change of Film Thickness before and after Rinse (nm) |
|---|---|
| TC-1 | 0 |
| TC-2 | 0 |
| TC-3 | 0 |
| TC-4 | 0 |
| TC-5 | 0 |
| TC-6 | 0 |
| TC-7 | 0 |
| TC-8 | 0 |
| TC-9 | 0 |
| TC-10 | 0 |
| TC-11 | 0 |
| TC-12 | 0 |
| TC-13 | 0 |
| TC-14 | 0 |
| TC-15 | 0 |
| TC-16 | 0 |
| TC-17 | 0 |
| TC-18 | 0 |
| TC-19 | 0 |
| TC-20 | 0 |
| TC-21 | 0 |
| TC-22 | 0 |
| TC-23 | 0 |
| TC-24 | 0 |
| TC-25 | 0 |
| TC-26 | 0 |
| TC-27 | 0 |
| TC-28 | 0 |
| Comparative TC-1 | 0 |
| Comparative TC-2 | 0 |
| Comparative TC-3 | 0 |

From Table 4, it has been established that the resist protective films TC-1 to 28 have high water repellency, and less prone to dissolve in water.

Next, silicon substrates on which the resist protective films were formed according to the above method were developed with 2.38 mass % aqueous solution of tetramethylammonium hydroxide (TMAH). And the thickness of each resist protective films after development was observed. The results are shown in Table 5.

TABLE 5

| Resist Protective Film | Film Thickness after Development (nm) |
|---|---|
| TC-1 | 0 |
| TC-2 | 0 |
| TC-3 | 0 |
| TC-4 | 0 |
| TC-5 | 0 |
| TC-6 | 0 |
| TC-7 | 0 |
| TC-8 | 0 |
| TC-9 | 0 |
| TC-10 | 0 |
| TC-11 | 0 |
| TC-12 | 0 |
| TC-13 | 0 |
| TC-14 | 0 |
| TC-15 | 0 |
| TC-16 | 0 |
| TC-17 | 0 |
| TC-18 | 0 |
| TC-19 | 0 |
| TC-20 | 0 |
| TC-21 | 0 |
| TC-22 | 0 |
| TC-23 | 0 |
| TC-24 | 0 |
| TC-25 | 0 |

TABLE 5-continued

| Resist Protective Film | Film Thickness after Development (nm) |
|---|---|
| TC-26 | 0 |
| TC-27 | 0 |
| TC-28 | 0 |
| Comparative TC-1 | 0 |
| Comparative TC-2 | 0 |
| Comparative TC-3 | 0 |

From Table 5, it has been established that the resist protective films TC-1 to 28 have high alkali solubility and can be stripped with an alkaline developer easily at the time of development.

Next, silicon substrates on which the resist protective films were formed according to the above method were held horizontally by using Tilting base contact angle meter DropMaster 500 (manufactured by Kyowa Interface Science Co., Ltd.), and 50 μL of pure water was dropped and a water droplet was formed on each protective film. Then each substrate was tilted gradually and the angle (the sliding angle) of each substrate where the water droplet starts to slide, and the receding contact angle were measured. The results are shown in the Table 6.

TABLE 6

| Resist Protective Film | Sliding Angle (Degree) | Receding Contact Angle (Degree) |
|---|---|---|
| TC-1 | 15 | 71 |
| TC-2 | 15 | 71 |
| TC-3 | 14 | 72 |
| TC-4 | 13 | 72 |
| TC-5 | 14 | 72 |
| TC-6 | 14 | 72 |
| TC-7 | 15 | 73 |
| TC-8 | 13 | 68 |
| TC-9 | 13 | 76 |
| TC-10 | 8 | 82 |
| TC-11 | 15 | 71 |
| TC-12 | 15 | 74 |
| TC-13 | 15 | 72 |
| TC-14 | 15 | 72 |
| TC-15 | 15 | 72 |
| TC-16 | 15 | 72 |
| TC-17 | 15 | 72 |
| TC-18 | 15 | 72 |
| TC-19 | 15 | 72 |
| TC-20 | 15 | 72 |
| TC-21 | 15 | 73 |
| TC-22 | 15 | 72 |
| TC-23 | 13 | 78 |
| TC-24 | 13 | 77 |
| TC-25 | 13 | 78 |
| TC-26 | 13 | 78 |
| TC-27 | 13 | 79 |
| TC-28 | 17 | 72 |
| Comparative TC-1 | 15 | 71 |
| Comparative TC-2 | 15 | 71 |
| Comparative TC-3 | 15 | 71 |

Having a small sliding angle means that water is apt to flow on a protective film. Having a large receding contact angle means that droplets are less prone to remain on a protective film even when a high-speed scanning is conducted for exposure. From Table 6, it has been established that on the resist protective films TC-1 to 28, water is apt to flow and droplets are less prone to remain even when a high-speed scanning is conducted for exposure, and thus TC-1 to 28 are suitable resist protective films for liquid immersion lithography. That is, it has been established that addition of amine compounds as conducted in the resist protective films according to the present invention hardly affects the sliding angle or the receding contact angle of the films.

Furthermore, 5 g of the following resist polymer, 0.25 g of PAG, and 0.05 g of an amine quencher were dissolved in 75 g of a solution of propylene glycol monomethyl ether acetate (PGMEA), filtered through a 0.2 micron polypropylene filter to prepare a solution of photoresist film composition.

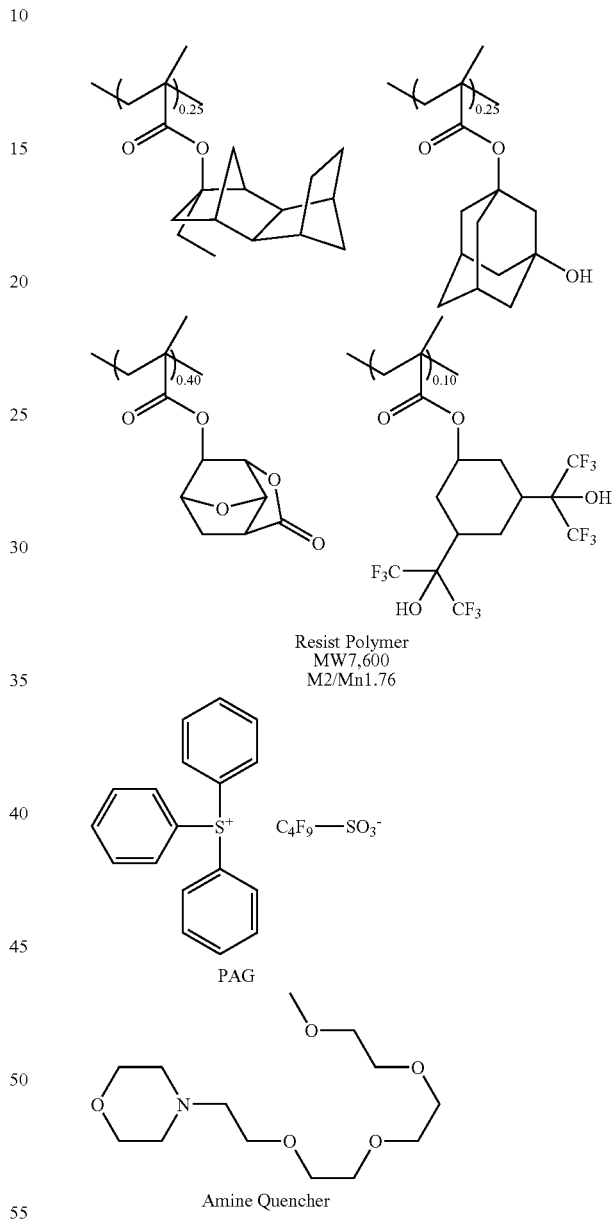

Then on each silicon substrate was formed a 87 nm thick antireflection coating (ARC-29A manufactured by Nissan Chemical Industries, Ltd.).

Subsequently, to each of the silicon substrate on which the antireflection coating was formed was applied the above-prepared photoresist film composition, and baked at 120 degrees C. for 60 seconds to form a photoresist film having a thickness of 150 nm.

Next, to each of the photoresist film was applied resist protective film compositions which were prepared as with above, and baked 100 degrees C. for 60 seconds to form resist protective films (TC-1 to 28, Comparative TC-1 to 3).

Then in order to conduct pseudo liquid immersion exposure, exposed protective films were rinsed with pure water for 5 minutes. That is, the substrates were exposed using the ArF scanner S307E (NA=0.85, σ0.93, 4/5 annular illumination, 6% halftone phase shift mask, manufactured by Nikon), rinsed with pure water for 5 minutes, subjected to post exposure bake (PEB) at 110 degrees C. for 60 seconds, and developed for 60 seconds in 2.38 mass % TMAH developer.

On the other hand, also conducted were another process in which the exposure, the pure water rinse, the PEB, and the development were conducted without forming a resist protective film; and a standard process without conducting the pure water rinse after exposure.

Then, each of the silicon substrates was cut and divided, and the pattern profiles of 75 nm line and space and sensitivity of the substrates were compared. Incidentally, an exposure dose that resolves 75 nm line and space in 1:1 was defined as the sensitivity.

The results are shown in the Table 7.

TABLE 7

| Resist Protective Film | Sensitivity | 75 nm Pattern Profile |
|---|---|---|
| Standard Process without Protective Film and Pure Water Rinse after Exposure | 31 mJ/cm$^2$ | rectangle |
| TC-1 | 30 mJ/cm$^2$ | rectangle |
| TC-2 | 30 mJ/cm$^2$ | rectangle |
| TC-3 | 30 mJ/cm$^2$ | rectangle |
| TC-4 | 30 mJ/cm$^2$ | rectangle |
| TC-5 | 30 mJ/cm$^2$ | rectangle |
| TC-6 | 30 mJ/cm$^2$ | rectangle |
| TC-7 | 30 mJ/cm$^2$ | rectangle |
| TC-8 | 30 mJ/cm$^2$ | rectangle |
| TC-9 | 30 mJ/cm$^2$ | rectangle |
| TC-10 | 30 mJ/cm$^2$ | rectangle |
| TC-11 | 30 mJ/cm$^2$ | rectangle |
| TC-12 | 30 mJ/cm$^2$ | rectangle |
| TC-13 | 30 mJ/cm$^2$ | rectangle |
| TC-14 | 30 mJ/cm$^2$ | rectangle |
| TC-15 | 30 mJ/cm$^2$ | rectangle |
| TC-16 | 30 mJ/cm$^2$ | rectangle |
| TC-17 | 30 mJ/cm$^2$ | rectangle |
| TC-18 | 30 mJ/cm$^2$ | rectangle |
| TC-19 | 30 mJ/cm$^2$ | rectangle |
| TC-20 | 30 mJ/cm$^2$ | rectangle |
| TC-21 | 30 mJ/cm$^2$ | rectangle |
| TC-22 | 30 mJ/cm$^2$ | rectangle |
| TC-23 | 30 mJ/cm$^2$ | rectangle |
| TC-24 | 30 mJ/cm$^2$ | rectangle |
| TC-25 | 30 mJ/cm$^2$ | rectangle |
| TC-26 | 30 mJ/cm$^2$ | rectangle |
| TC-27 | 30 mJ/cm$^2$ | rectangle |
| TC-28 | 30 mJ/cm$^2$ | rectangle |
| without Protective Film | 32 mJ/cm$^2$ | T-top |
| Comparative TC-1 | 30 mJ/cm$^2$ | film loss |
| Comparative TC-2 | 30 mJ/cm$^2$ | film loss |
| Comparative TC-3 | 30 mJ/cm$^2$ | film loss |

As shown in Table 7, the case of conducting the pure water rinse after exposure without a resist protective film provided T-top profile. This is considered to be caused by generated acid dissolved in water. On the other hand, in the case of using of protective films according to the present invention (TC-1 to 28), there hardly occurred profile deformation.

And, in the case of the conventional protective films (Comparative TC-1 to 3) without containing amine compounds, resist profiles after development were film loss profiles.

The present invention is not limited to the above-described embodiments. The above-described embodiments are mere examples, and those having the substantially same structure as that described in the appended claims and providing the similar action and advantages are included in the scope of the present invention.

The invention claimed is:

1. A resist protective film composition for forming a protective film on a photoresist film, comprising:

a polymer including a repeating unit having one or more groups selected from a carboxyl group and α-trifluoromethyl alcohol groups;

one or more amine compounds selected from the group consisting of tertiary amine compounds having fluoroalkyl groups represented by the following general formula (2):

$$N(X^{10})_{n1}(Y^{10})_{3-n1} \quad (2)$$

wherein:

n1 is 1, 2, or 3;

$X^{10}$ may be the same or different, $X^{10}$ contains at least one or more fluorine atoms, and $X^{10}$ is represented by any one of the following general formulae $(X^{10})$–1 to $(X^{10})$–3:

wherein:

$R^{300}$, $R^{302}$, and $R^{305}$ independently represent a linear or branched alkylene group having 1-4 carbon atoms, which may contain —O—;

$R^{301}$ and $R^{304}$ independently represent a linear, branched or cyclic alkyl group having 1-30 carbon atoms, which may contain a hydroxy group or an ester group, and hydrogen atoms of the alkyl group may be totally or partially substituted with a fluorine atom;

$R^{303}$ represents a single bond or a linear or branched alkylene group having 1-4 carbon atoms; and $R^{306}$ represents a linear, branched or cyclic alkyl group having 1-30 carbon atoms, and hydrogen atoms of the alkyl group may be totally or partially substituted with a fluorine atom; and $Y^{10}$ may be the same or different, $Y^{10}$ represents a linear, branched, or cyclic alkyl group having 1-30 carbon atoms, and $Y^{10}$ may be linked to each other to form a ring, and the ring may contain —O—; and a solvent that does not dissolve the photoresist film, which is an underlying layer of a resist protective film;

wherein the resist protective film composition forms the resist protective film on a photoresist film.

2. The resist protective film composition according to claim 1, wherein the repeating unit having an α-trifluoromethyl alcohol group in the polymer is represented by the following general formula (3),

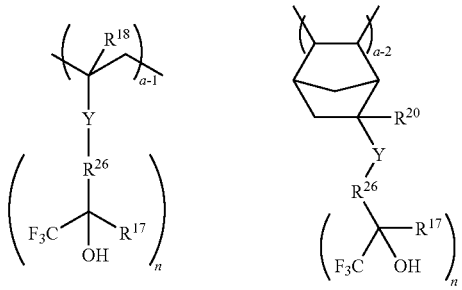 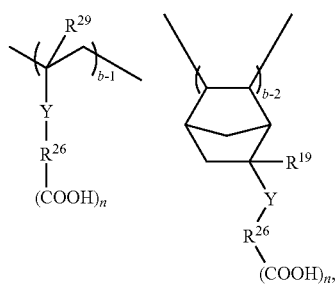

(3)

(5)

wherein $R^{18}$ and $R^{20}$ independently represent any one of a hydrogen atom, a fluorine atom, a methyl group, and a trifluoromethyl group;

Y independently represents any one of a single bond, —O—, —C(=O) —O—, —C (=O)—O—$R^{28}$—C (=O)—O—, —C(=O)—O—$R^{28}$—O—, and —C(=O)—O—$R^{28}$—O—C(=O)—;

$R^{28}$ represents a linear, branched or cyclic alkylene group having 1-10 carbon atoms, and hydrogen atoms of the alkylene group may be totally or partially substituted with a fluorine atom;

$R^{26}$ independently represents a single bond, a linear, branched or cyclic alkylene group or alkanetriyl group having 1-25 carbon atoms, and hydrogen atoms of the alkylene group and alkanetriyl group may be totally or partially substituted with a fluorine atom;

$R^{17}$ independently represents any one of a hydrogen atom, a fluorine atom, a methyl group, a trifluoromethyl group, and a difluoromethyl group;

$R^{26}$ and $R^{17}$ may be linked to form a ring, and the ring may contain one or more groups selected from the group consisting of an ether group, alkylene groups whose hydrogen atoms are totally or partially substituted with a fluorine atom, and a trifluoromethyl group;

n is independently 1 or 2; and (a-1) and (a-2) satisfy $0 \leq (a\text{-}1) \leq 0.9$, $0 \leq (a\text{-}2) \leq 0.9$, and $0 < (a\text{-}1)+(a\text{-}2) \leq 0.9$.

3. The resist protective film composition according to claim 2, wherein the repeating unit having an α-trifluoromethyl alcohol group in the polymer is represented by the following general formula (4),

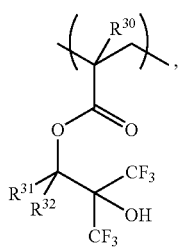

(4)

wherein $R^{30}$ represents a hydrogen atom or a methyl group; and $R^{31}$ and $R^{32}$ may be the same or different and represent a hydrogen atom or a linear, branched or cyclic alkyl group having 1-12 carbon atoms; and $R^{31}$ and $R^{32}$ may be linked to form a ring with the carbon atom to which $R^{31}$ and $R^{32}$ are linked.

4. The resist protective film composition according to claim 1, wherein the repeating unit having a carboxyl group in the polymer is represented by the following general formula (5), (5)

wherein $R^{29}$ represents any one of a hydrogen atom, a fluorine atom, a methyl group, a trifluoromethyl group, —COOH, and —$CH_2$—COOH;

$R^{19}$ represents any one of a hydrogen atom, a fluorine atom, a methyl group, a trifluoromethyl group, —COOH, and —$CH_2$—COOH;

Y independently represents any one of a single bond, —O—, —C(=O) —O—, —C (=O)—O—$R^{28}$—C (=O)—O—, —C(=O)—O—$R^{28}$—O—, and —C(=O)—O—$R^{28}$—O—C(=O)—;

$R^{28}$ represents a linear, branched or cyclic alkylene group having 1-10 carbon atoms, and hydrogen atoms of the alkylene group may be totally or partially substituted with a fluorine atom;

$R^{26}$ independently represents any one of a single bond, a linear, branched or cyclic alkylene group or alkanetriyl group having 1-25 carbon atoms, and hydrogen atoms of the alkylene group and alkanetriyl group may be totally or partially substituted with a fluorine atom;

n is independently 1 or 2; and (b-1) and (b-2) satisfy $0 \leq (b\text{-}1) \leq 0.9$, $0 \leq (b\text{-}2) \leq 0.9$, and $0 < (b\text{-}1)+(b\text{-}2) \leq 0.9$.

5. The resist protective film composition according to claim 2, wherein the repeating unit having a carboxyl group in the polymer is represented by the following general formula (5),

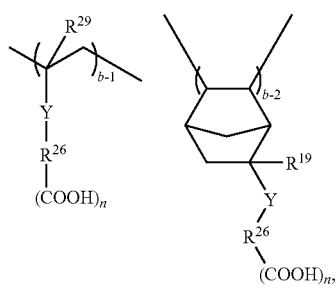

(5)

wherein $R^{29}$ represents any one of a hydrogen atom, a fluorine atom, a methyl group, a trifluoromethyl group, —COOH, and —$CH_2$—COOH;

$R^{19}$ represents any one of a hydrogen atom, a fluorine atom, a methyl group, a trifluoromethyl group, —COOH, and —$CH_2$—COOH;

Y independently represents any one of a single bond, —O—, —C(=O) —O—, —C (=O)—O—$R^{28}$—C (=O)—O—, —C(=O)—O—R²⁸—O—, and —C(=O)—O—R²⁸—O—C(=O)—;

R²⁸ represents a linear, branched or cyclic alkylene group having 1-10 carbon atoms, and hydrogen atoms of the alkylene group may be totally or partially substituted with a fluorine atom;

R²⁶ independently represents any one of a single bond, a linear, branched or cyclic alkylene group or alkanetriyl group having 1-25 carbon atoms, and hydrogen atoms of the alkylene group and alkanetriyl group may be totally or partially substituted with a fluorine atom;

n is independently 1 or 2; and (b-1) and (b-2) satisfy 0≦(b-1)≦0.9, 0≦(b-2)≦0.9, and 0<(b-1)+(b-2)≦0.9.

6. The resist protective film composition according to claim 3, wherein the repeating unit having a carboxyl group in the polymer is represented by the following general formula (5),

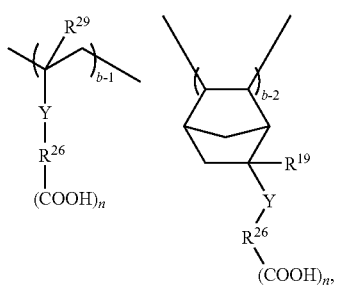

(5)

wherein R²⁹ represents any one of a hydrogen atom, a fluorine atom, a methyl group, a trifluoromethyl group, —COOH, and —CH₂—COOH;

—R¹⁹ represents any one of a hydrogen atom, a fluorine atom, a methyl group, a trifluoromethyl group, —COOH, and —CH₂—COOH;

Y independently represents any one of a single bond, —O—, —C(=O) —O—, —C (=O)—O—R²⁸—C (=O)—O—, —C(=O)—O—R²⁸—O—, and —C(=O)—O—R²⁸—O—C(=O)—;

R²⁸ represents a linear, branched or cyclic alkylene group having 1-10 carbon atoms, and hydrogen atoms of the alkylene group may be totally or partially substituted with a fluorine atom;

R²⁶ independently represents any one of a single bond, a linear, branched or cyclic alkylene group or alkanetriyl group having 1-25 carbon atoms, and hydrogen atoms of the alkylene group and alkanetriyl group may be totally or partially substituted with a fluorine atom;

n is independently 1 or 2; and (b-1) and (b-2) satisfy 0≦(b-1)≦0.9, 0≦(b-2)≦0.9, and 0<(b-1)+(b-2)≦0.9.

7. The resist protective film composition according to claim 1, wherein the polymer further comprises a repeating unit having one or more groups selected from the group consisting of alkyl groups and fluoroalkyl groups.

8. The resist protective film composition according to claim 6, wherein the polymer further comprises a repeating unit having one or more groups selected from the group consisting of alkyl groups and fluoroalkyl groups.

9. The resist protective film composition according to claim 7, wherein the repeating unit having one or more groups selected from the group consisting of alkyl groups and fluoroalkyl groups in the polymer is represented by the following general formula (6),

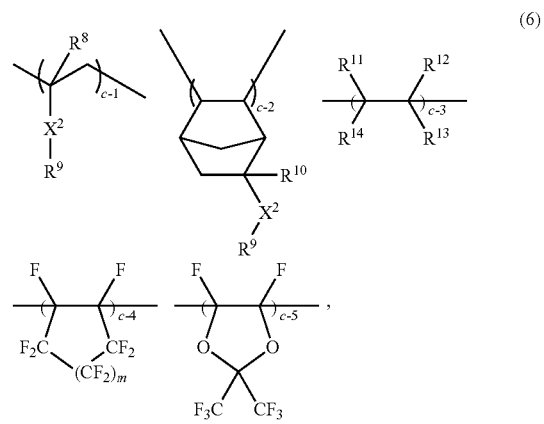

(6)

wherein R⁸ and R¹⁰ independently represent any one of a hydrogen atom, a fluorine atom, a methyl group, and a trifluoromethyl group;

X² independently represents any one of a single bond, —O—, —C(=O)—O—, and —C(=O)—O—R¹⁶—C (=O)—O—;

R¹⁶ represents a linear, branched or cyclic alkylene group having 1-10 carbon atoms, and hydrogen atoms of the alkylene group may be totally or partially substituted with a fluorine atom;

R⁹ independently represents a linear, branched or cyclic alkyl group having 1-20 carbon atoms; and hydrogen atoms of the alkyl group may be totally or partially substituted with a fluorine atom; and the alkyl group may contain an ether group or an ester group;

R¹¹ to R¹⁴ independently represent any one of a hydrogen atom, a fluorine atom, a methyl group, and a trifluoromethyl group; and at least any one of R¹¹ to R¹⁴ contain one or more fluorine atoms;

m is 1 or 2; and (c-1), (c-2), (c-3), (c-4) and (c-5) satisfy 0≦(c-1)≦0.9, 0≦(c-2)≦0.9, 0≦(c-3) ≦0.9, 0≦(c-4)≦0.9, 0≦(c-5)≦0.9, and 0<(c-1)+(c-2)+(c-3)+(c-4)+(c-5)≦0.9.

10. The resist protective film composition according to claim 8, wherein the repeating unit having one or more groups selected from the group consisting of alkyl groups and fluoroalkyl groups in the polymer is represented by the following general formula (6),

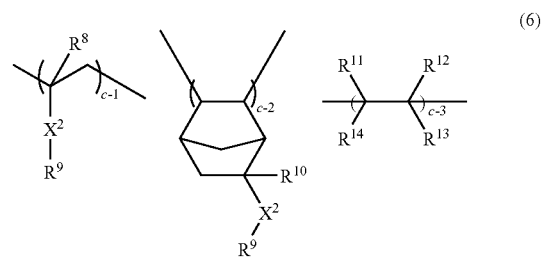

(6)

-continued

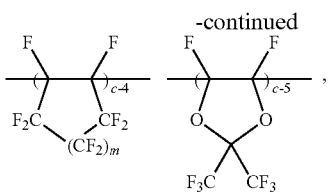

wherein $R^8$ and $R^{10}$ independently represent any one of a hydrogen atom, a fluorine atom, a methyl group, and a trifluoromethyl group;

$X^2$ independently represents any one of a single bond, —O—, —C(=O)—O—, and —C(=O)—O—$R^{16}$—C(=O)—O—;

$R^{16}$ represents a linear, branched or cyclic alkylene group having 1-10 carbon atoms, and hydrogen atoms of the alkylene group may be totally or partially substituted with a fluorine atom;

$R^9$ independently represents a linear, branched or cyclic alkyl group having 1-20 carbon atoms; and hydrogen atoms of the alkyl group may be totally or partially substituted with a fluorine atom; and the alkyl group may contain an ether group or an ester group;

$R^{11}$ to $R^{14}$ independently represent any one of a hydrogen atom, a fluorine atom, a methyl group, and a trifluoromethyl group; and at least any one of $R^{11}$ to $R^{14}$ contain one or more fluorine atoms;

m is 1 or 2; and (c-1), (c-2), (c-3), (c-4) and (c-5) satisfy $0 \leq (c-1) \leq 0.9$, $0 \leq (c-2) \leq 0.9$, $0 \leq (c-3) \leq 0.9$, $0 \leq (c-4) \leq 0.9$, $0 \leq (c-5) \leq 0.9$, and $0 < (c-1)+(c-2)+(c-3)+(c-4)+(c-5) \leq 0.9$.

11. A patterning process comprising: forming a photoresist film on a substrate; forming a resist protective film on the photoresist film by using the resist protective film composition according to claim 1; exposing the substrate; and developing the substrate with a developer.

12. The patterning process according to claim 11, wherein the step of exposing the substrate is conducted by liquid immersion lithography in which a gap between a projection lens and the substrate is filled with liquid.

13. The patterning process according to claim 12, wherein the step of exposing the substrate is conducted by using a light source having an exposure wavelength in the range of 180 to 250 nm; and using water as the liquid with which the gap between a projection lens and the substrate is filled.

14. The patterning process according to claim 12, wherein the step of developing the substrate is conducted by developing the substrate with an alkaline developer to form a resist pattern on the photoresist film and simultaneously to strip the resist protective film on the photoresist film.

15. The resist protective film composition according to claim 1, wherein the solvent that does not dissolve the photoresist film is isoamylether.

* * * * *